(12) United States Patent
Waters et al.

(10) Patent No.: US 8,952,838 B2
(45) Date of Patent: Feb. 10, 2015

(54) TIME DOMAIN SWITCHED ANALOG-TO-DIGITAL CONVERTER APPARATUS AND METHODS

(75) Inventors: Richard Waters, San Diego, CA (US);
Brad Chisum, San Diego, CA (US);
Mark Fralick, San Diego, CA (US);
John D. Jacobs, San Diego, CA (US);
Ricardo Dao, San Diego, CA (US);
David Carbonari, Murrieta, CA (US);
Jacques Leveille, Houston, TX (US)

(73) Assignee: Lumedyne Technologies, Inc., San Diego, CA (US)

( * ) Notice: Subject to any disclaimer, the term of this patent is extended or adjusted under 35 U.S.C. 154(b) by 13 days.

(21) Appl. No.: 13/588,643

(22) Filed: Aug. 17, 2012

(65) Prior Publication Data
US 2013/0207824 A1    Aug. 15, 2013

Related U.S. Application Data

(60) Provisional application No. 61/525,596, filed on Aug. 19, 2011.

(51) Int. Cl.
*H03M 1/12* (2006.01)
*H03M 1/50* (2006.01)
*H03M 1/06* (2006.01)

(52) U.S. Cl.
CPC ............... *H03M 1/12* (2013.01); *H03M 1/504* (2013.01); *H03M 1/0682* (2013.01)
USPC ........... 341/155; 375/322; 375/330; 375/340; 375/229; 375/232; 370/201; 455/226.1; 455/323; 455/325; 455/333; 455/572; 341/140; 341/160

(58) Field of Classification Search
USPC .......... 341/140–160; 375/322, 330, 340, 229, 375/232; 370/201; 455/226.1, 67.11, 234.1, 455/323, 325, 333, 572, 573
See application file for complete search history.

(56) References Cited

U.S. PATENT DOCUMENTS 3,611,134 A   10/1971  McDowell
4,164,648 A    8/1979  Chu
(Continued)

OTHER PUBLICATIONS

K. Lange and M. Kasnia, "Application of Vernier Interpolation for Digital Time Error Measurement," Poznan Workshop on Telecommunications, 2008 Dec. 11, 2008.
(Continued)

*Primary Examiner* — Lam T Mai
(74) *Attorney, Agent, or Firm* — Ropes & Gray LLP

(57) ABSTRACT

A time domain switching analog-to-digital converter apparatus and methods of utilizing the same. In one implementation, the converter apparatus comprises a carrier signal source, and at least one reference source. The carrier signal is summed with the input signal and the summed modulated signal is fed to a comparator circuit. The comparator is configured detects crossings of the reference level by the modulated waveform thereby generating trigger events. The time period between consecutive trigger events is used to obtain modulated signal deviation due to the input signal thus enabling input signal measurement. Control of the carrier oscillation amplitude and frequency enables real time adjustment of the converter dynamic range and resolution. The use of additional reference signal levels increases sensor frequency response and accuracy. A dual channel converter apparatus enables estimation and removal of common mode noise, thereby improving signal conversion accuracy.

28 Claims, 62 Drawing Sheets

(56) References Cited

U.S. PATENT DOCUMENTS

| | | | |
|---|---|---|---|
| 6,307,492 B1 | 10/2001 | Berranger et al. | |
| 6,642,767 B2 * | 11/2003 | Wang | 327/307 |
| 6,842,591 B2 * | 1/2005 | Shim et al. | 399/50 |
| 6,937,954 B2 * | 8/2005 | Jeong et al. | 702/92 |
| 7,265,702 B1 | 9/2007 | Wu et al. | |
| 7,298,800 B2 * | 11/2007 | Asano | 375/344 |
| 7,307,563 B2 * | 12/2007 | Kim | 341/131 |
| 7,372,391 B1 * | 5/2008 | Courcy et al. | 341/161 |
| 7,378,999 B1 * | 5/2008 | McGrath et al. | 341/120 |
| 7,474,712 B1 * | 1/2009 | Keating | 375/324 |
| 7,498,862 B2 * | 3/2009 | Ayyagari | 327/387 |
| 7,548,281 B2 * | 6/2009 | Kim et al. | 348/726 |
| 7,646,324 B2 * | 1/2010 | Matsubayashi | 341/161 |
| 7,702,024 B2 * | 4/2010 | Kim et al. | 375/260 |
| 8,270,462 B2 * | 9/2012 | Yamaguchi et al. | 375/232 |
| 2002/0093908 A1 | 7/2002 | Yeap | |
| 2006/0079191 A1 | 4/2006 | Parssinen et al. | |
| 2006/0165198 A1 | 7/2006 | Tietjen | |
| 2006/0222107 A1 | 10/2006 | Neubauer et al. | |
| 2007/0210951 A1 | 9/2007 | Yamaji | |
| 2008/0180289 A1 | 7/2008 | Su et al. | |
| 2012/0326700 A1 | 12/2012 | Swanson | |

OTHER PUBLICATIONS

J. Wu, "On-Chip processing for the wave union TDC implemented in FPGA," in Real Time Conference, 2009. RT '09. 16th IEEE-NPSS, May 2009, pp. 279-282.

J. Wu, Z. Shi, "The 10-ps Wave Union TDC: Improving FPGA TDC Resolution beyond Its Cell Delay," in Nuclear Science Symposium Conference Record, 2008 IEEE, Oct. 19-25, 2008 pp. 3440-3446.

\* cited by examiner

TIME DOMAIN SWITCHED ANALOG-TO-DIGITAL CONVERTER APPARATUS AND METHODS

PRIORITY AND RELATED APPLICATIONS

This application claims priority to U.S. Provisional Patent Application Ser. No. 61/525,596 filed Aug. 19, 2011 of the same title, which is incorporated herein by reference in its entirety.

The application also is related to U.S. patent application Ser. No. 13/168,603, filed Jun. 24, 2011 and entitled "APPARATUS AND METHODS FOR TIME DOMAIN MEASUREMENT OF OSCILLATION PERTURBATIONS", which is incorporated herein by reference in its entirety.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The present invention relates generally to oscillatory methods and apparatus for use in signal conversion applications, and more particularly in one exemplary aspect to a time domain switched analog-to-digital converter apparatus, and methods of implementing and utilizing the same.

DESCRIPTION OF RELATED TECHNOLOGY

An analog-to-digital converters (ADC), an apparatus that convert a continuous quantity to a discrete time digital representation, are often used for signal measurements and other applications. Typically, an ADC is an electronic device that converts an input analog signal (such as, for example, a voltage or an electric current) to a digital value that is proportional to the magnitude of the input signal.

Performance of analog-to-digital converters is typically characterized using sampling rate (typically selected at twice the maximum frequency one wishes to detect according to the Nyquist's theorem); resolution (bits): the number of bits in the digitized bit stream that is used to represent a value of the analog input signal; and least significant bit (LSB): the least weighted bit in the digitized bit stream. An analog signal value (e.g., voltage or current) that corresponds to the ADC LSB, is also referred to as the signal resolution, or ADC electrical resolution. The LSB represents the minimum change in input voltage required to change the output code level of the ADC. Resolution of modern ADCs typically ranges from about 8-bits up to 24-bits, for the state-of-the-art ADC technology.

Existing ADC technologies are summarized in Table 1 and include: delta-sigma convertors; delta modulation convertors; successive approximation (SAR) converters, direct conversion or flash ADC, Wilkinson ADC, integrating ADC (such as dual slope, quad slope); and pipelined ADCs. Table 1 presents a selected performance summary and cost metrics for some typical ADC technologies.

TABLE 1

| Factors | Successive Approximation (SAR) | Delta-Sigma | Integrating | Pipeline | Flash |
|---|---|---|---|---|---|
| Accuracy (Signal-to-noise ratio) | 70-118 dB | 60-130 dB | 36-84 dB | 59-81 dB | 40-50 dB |
| Non-Linearity | ±0.5-6 LSB | ±0.0002-2 LSB | ±0.5-1 LSB | ±0.2-1.5 LSB | ±0.5-1 LSB |
| Power Consumption | 6-145 mW | .27-530 mW | 0.1-15 mW | 70 mW-4 W | 85 mW-150 mW |
| Sample Rate | 100 KSPS-1 MSPS | 111 SPS-640 MSPS | 3 SPS-3 KSPS | 1.5 MSPS-200 MSPS | 20 MSPS-40 MSPS |
| Bandwidth | 50 KHz-500 MHz | 55 Hz-320 MHz | 1 Hz-1.5 KHz | 25 MHz-800 MHz | 10 MHz-20 MHz |
| Price Per Unit (>1,000 unit volume) | $6-$35 | $1-$40 | $2.5-$45 | $2.5-$40 | $2-$3 |

Various error sources affect performance of existing commercially available ADCs, with the dominant error source depending on the technology employed by the converter. Typically, ADCs of all types suffer from quantization error, non-linearity, and clock jitter, all of which impact the choice of ADC technology for a given application. These noise sources typically reduce effective number of bits (ENOB) defined (for a full-scale, sinusoidal input waveform) as:

$$\text{ENOB} = (\text{SINAD} - 1.76)/6.02, \quad \text{(Eqn. 1)}$$

where signal-to-noise and distortion (SINAD), typically expressed in dB, is the ratio of the root-mean-squared (RMS) value of the sine wave ADC input to the RMS value of the converter noise plus distortion (without the sine wave). The RMS noise plus distortion includes all spectral components up to the Nyquist frequency, excluding the fundamental and the DC offset.

Therefore, a 24-bit ADC may, for example, only have meaningful data included in the first 21 or 22 bits of each sample (i.e., ENOB=21).

Most existing ADC implementations have several shortcomings, such as fixed dynamic range and resolution. Particularly, existing technologies are not well suited for measuring signals that have a wide dynamic range and a non-uniform signal amplitude distributions (i.e., when the high-amplitude or low amplitude signals are not as frequent as the mid-range signals). When measuring such signals, the user is often required to compromise either the high amplitude signal portion (clipping) or the low-amplitude signal portion (resolution), or to implement specialized multi-channel solutions with multiple ADCs sampling separate portions of the signal amplitude range. Such implementations increase cost and complexity thereby limiting their wider usage. In addition, accuracy of existing commercially available low cost ADCs is typically not very high, while higher accuracy ADCs tend to be quite costly, thus limiting their broad applicability.

Accordingly, there is a salient need for an improved high-accuracy and high-resolution analog to digital converter apparatus having an increased dynamic range, that at the same time is both lower in cost and complexity as compared to existing solutions and could be used in a wide variety of sensing and measurement applications.

SUMMARY OF THE INVENTION

The present invention discloses, inter alia, apparatus and methods for analog-to-digital conversion based on time-domain gating by a cyclic carrier waveform.

In a first aspect of the invention, an analog to digital converter apparatus is disclosed. In one embodiment the analog to digital converter includes: (i) a first interface configured to receive an input signal and a carrier signal, and (ii) processing logic. The processing logic is configured to: (i) identify one or more reference levels, (ii) generate a modulated signal based on the input signal and the carrier signal, (iii) detect crossings of the one or more reference levels by the modulated signal, (iv) based on the detected crossings, determine a plurality of timing periods, and (v) based at least in part on the timing periods, generate one or more estimates of the input signal.

In a second aspect of the invention, a method of converting an analog waveform into a digital signal is disclosed. In one embodiment, the method includes: (i) receiving the analog waveform, (ii) mixing the analog waveform with a cyclic signal to produce a mixed waveform, (iii) defining a period based on the cyclic signal, (iv) determining one or more timing values based on the mixed waveform crossing at least one predetermined amplitude level, and (v) estimating an amplitude of the analog waveform based at least in part on a comparison of the one or more timing values with the defined period.

In a third aspect of the invention, a non-transitory computer readable apparatus configured to store one or more processes thereon is disclosed. In one embodiment, the one or more processes include a plurality of instructions configured to, when executed: (i) receive a modulated waveform derived from a input signal and a carrier, the carrier having a known frequency, (i) determine relative timings of a plurality of events, the plurality of events including crossings of a reference level by the modulated waveform, (iii) compare the relative timings to a period derived from the known frequency, and (iv) based at least on the comparison, compute an estimate of the input signal.

In a fourth aspect of the invention, a time-domain switched analog to digital converter apparatus is disclosed. In one embodiment, the analog to digital converter includes: (i) a first port configured to receive a periodic carrier signal, characterized by a carrier period, (ii) an input port configured to receive an input analog signal, and (iii) a logic block. The logic block is configured to: (i) generate a modulated signal based on the carrier signal and the input signal, (ii) compare the modulated signal to a first reference signal, (iii) based at least in part on the compare, generate a first plurality of trigger events, the first plurality of trigger events associated with the first reference signal, (iv) determine a first time interval based at least in part on the first plurality of trigger events and a reference clock, and (v) produce a digital representation of the input signal based at least in part on the first time interval, and the carrier period.

In a fifth aspect of the invention a method of compensating for distortions arising in an analog to digital conversion process is disclosed. In one embodiment, a time-varying input waveform is sampled and held at a constant value for a persistence period. Harmonic contributions arising from the time variance are compensated.

In another embodiment, an input signal is mixed with a carrier wave to generate a modulated input signal. The modulated input signal triggers a plurality of sampling events. The sampling events are used to generate a fitted curve, representing the modulated input signal. Distortion terms are quantified using the representation, and are then removed.

In yet another embodiment, differential techniques are utilized to remove contributions from noise.

In a sixth aspect of the invention analog to digital converter based on wave rectification is disclosed. In one embodiment, the converter includes processing logic configured to reflect negative portions of a signal onto the positive axis. This reflection increases the number of reference level crossings for certain waveforms.

Further features of the present invention, its nature, and various advantages will be apparent from the accompanying drawings and the following detailed description.

BRIEF DESCRIPTION OF THE DRAWINGS

The features, objectives, and advantages of the invention will become more apparent from the detailed description set forth below when taken in conjunction with the drawings, wherein:

FIG. 1I is a timing diagram illustrating an exemplary operational sequence for the time-domain switched ADC apparatus of the embodiment shown in FIG. 1E.

Figure 1:
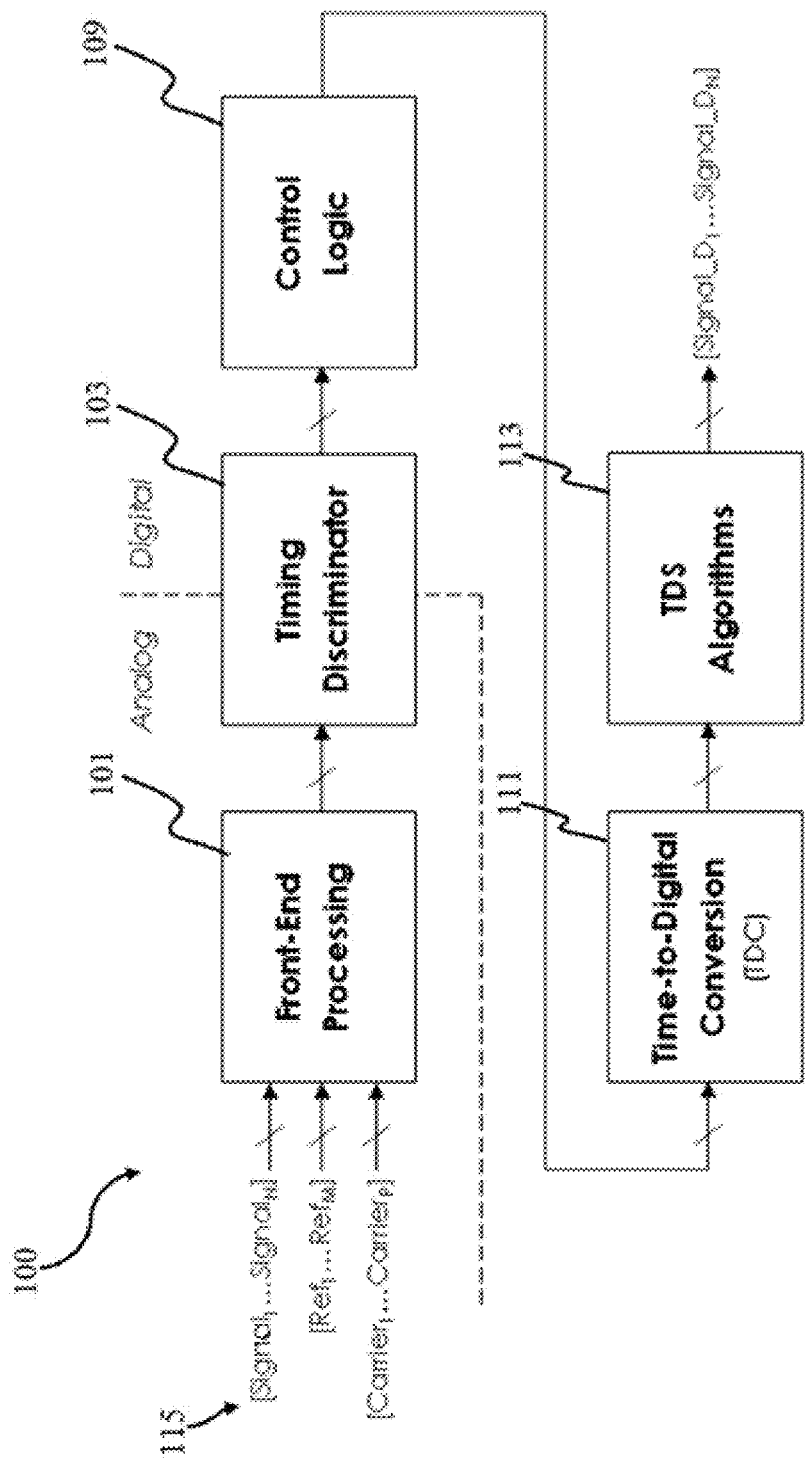
FIG. 1 is a functional block diagram illustrating an exemplary embodiment of the TDS ADC consistent with the invention.

All figures disclosed herein are © Copyright 2011-2012 Lumedyne Technologies, Inc. All rights reserved.

DETAILED DESCRIPTION

Reference is now made to the drawings wherein like numerals refer to like parts throughout.

As used herein, the terms "carrier" and "carrier frequency" refer to, without limitation, an internally or externally generated periodic signal useful for, e.g., combining with the input signal during input signal measurement.

As used herein, the terms "computer", "computing device", and "computerized device", include, but are not limited to, mainframe computers, workstations, servers, personal computers (PCs) and minicomputers, whether desktop, laptop, or otherwise, personal digital assistants (PDAs), handheld computers, embedded computers, programmable logic devices, digital signal processor systems, personal communicators, tablet computers, portable navigation aids, J2ME equipped devices, cellular telephones, smartphones, personal integrated communication or entertainment devices, or literally any other device capable of executing a set of instructions and processing an incoming data signal.

As used herein, the term "computer program" or "software" is meant to include any sequence or human or machine cognizable steps which perform a function. Such program may be rendered in virtually any programming language or environment including, for example, C/C++, C#, Fortran, COBOL, MATLAB™, PASCAL, Python, Verilog, VHDL, assembly language, markup languages (e.g., HTML, SGML, XML, VoXML), and the like, as well as object-oriented environments such as the Common Object Request Broker Architecture (CORBA), Java™ (including J2ME, Java Beans, etc.), Binary Runtime Environment (e.g., BREW), and the like.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, "flash" memory (e.g., NAND/NOR), memristor memory, and PSRAM.

As used herein, the teems "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

As used herein, the terms "top", "bottom", "side", "up", "down", "left", "right", and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

As used herein, the term "reference signal" refer, without limitation, an internally or externally generated signal used to, e.g., generate trigger events during input signal measurement.

Overview

The present invention provides, in one salient aspect, a robust, low-cost and high resolution analog to digital converter apparatus with an adjustable measurement dynamic range (such as might be used in sensing or measurement applications), and methods of implementing and using the same.

In one implementation, the apparatus modulates an analog input using a periodic carrier signal of a known period, and compares the modulated signal to at known reference signal level. In one variant, a single reference level is used with a known carrier frequency and amplitude. In other variants, multiple reference levels are used thereby enabling input signal measurements that are invariant with respect to the carrier amplitude and frequency. When modulated waveform crosses each of the reference signal level(s), the ADC apparatus generates the corresponding trigger events. By combining the time intervals corresponding to the modulation waveform crossing successive trigger event positions, the period and the amplitude of modulation signal is estimated, hence obtaining a digital representation of the analog input signal.

In another implementation, additional reference signal levels are used to improve converter apparatus frequency response and accuracy.

Accuracy of the exemplary two reference level time-domain switched analog to digital converter apparatus advantageously does not depend on the carrier signal amplitude or frequency thereby enabling sensing dynamic range adjustment in real time. Such configuration further ensures that the accuracy of the device is only dependent on the consistency of the triggering events, the accuracy of the reference signal level difference, and the accuracy of the time measurement of adjacent triggered events. Further, various implementations of the invention utilize noise and/or distortion compensation techniques to mitigate contributions from various effects which result in reductions in accuracy.

The exemplary device also advantageously can measure parameters varying over a wide dynamic range. In one variant, such wide dynamic range capability is achieved through variation of the carrier signal amplitude. Furthermore, by adjusting the carrier period, the input signal conversion rate is controlled thereby facilitating real time adjustment of the ADC bandwidth and accuracy/resolution.

In this fashion, a single ADC according to the invention can be used to measure a broad range of signal values (both in amplitude and frequency), thereby obviating use of multiple ADCs tuned to particular (more narrow) ranges as in the prior art.

Detailed Description Of Exemplary Embodiments

Detailed descriptions of the various embodiments and variants of the apparatus and methods of the invention are now provided.

Signal Conversion

The Time Domain Switched (TDS) ADC concept is based on measuring time intervals, corresponding to the modulated signal waveform crossing predetermined signal levels in order to reconstruct the input signal. In one embodiment, the modulated signal comprises: (i) a time varying voltage or current input signal (that is unknown and is the target of the measurement); and (ii) carrier signal (voltage or current) signal. For a DC input signal, the modulated signal V can be represented as:

$$V(t)=V_c(t)+V_{input}=A_c \cos(\omega_c t)+V_{input} \qquad \text{(Eqn. 2)}$$

where:

$V(t)$ is the modulated signal;

$V_c(t)$ is the carrier signal $V_{input}$ is the unknown input signal that is to be measured;

$A_c$ is the carrier signal amplitude; and $\omega_c$ is the carrier signal radial frequency $\omega c = 2\pi f_c$.

In order to implement the TDS ADC, the input signal $V_{input}$ is added to the carrier signal $V_c$, thereby modulating the offset of the carrier signal. The carrier signal can be supplied from an external source or generated internally by a logic circuit of the ADC apparatus (such as, for example, FPGA/MCU, resonant tank circuits, voltage controlled oscillators, etc.).

Referring now to FIG. 1, the block diagram illustrates a generalized architecture of the Time-Domain-Switched (TDS) Analog-to-Digital Conversion (ADC) including front-end processing 101, timing discrimination 103, control logic 109, time-to-digital conversion 111, and the algorithmic components 113 that define the techniques associated therewith. The system may accept a plurality of analog inputs including: signals to be digitized (115 $Signal_1$ ... $Signal_N$, also referred to as modulation signals), reference signals which may be constant or time varying ($Ref_1$ ... $Ref_M$), and carrier signals that are generally oscillatory in nature ($Carrier_1$ ... $Carrier_P$). For example, a typical set of input signals includes: one input modulation signal, two or more constant reference levels, and one sinusoidal carrier signal. The above-mentioned elements may be implemented as hardware circuitry and/or software elements running on integrated circuitry.

Front-end analog signal processing 101 is provided to accept and condition the input signals 115 to tailor their parameters/characteristics (e.g. bandwidth, filtering levels, attenuation, etc.) to ensure proper operation the subsequent functions of the TDS ADC. Front-end operations may include: amplification, filtering, differential signal conversion, signal ensemble averaging, linear/nonlinear combination, and signal transformation. An exemplary front-end processing embodiment includes input modulation signal low-pass filtering (anti-aliasing), a sample-hold function, a signal summation port, and band-pass filtering for the carrier signal.

The timing discriminator element 103 receives an arbitrary number of analog and digital signals derived from the front-end processing outputs. From these outputs, the timing discriminator element produces a set of digital pulses with transitions that reflect the intersection of input modulation signals with the reference signals. By way of example, functional implementations include, but are not limited to, signal comparators, and/or output-limiting high-gain amplification.

The timing discrimination may be performed for example by a robust and stable apparatus for time domain oscillatory measurements such as those described in co-pending U.S. patent application Ser. No. 13/168,603, filed Jun. 24, 2011 and entitled "APPARATUS AND METHODS FOR TIME DOMAIN MEASUREMENT OF OSCILLATION PERTURBATIONS", being previously incorporated by reference in its entirety. As discussed therein, in one exemplary embodiment, the oscillatory apparatus includes a controlled oscillator coupled to a switch apparatus (having at least one first element and at least one second element, which form one (or more) closed switch states), a driving circuit, and a sensing circuit. The driving circuit provides a driving signal configured to induce the oscillatory motion, which, in turn, displaces the one (or more) first switch element with respect to the one (or more) second element. In one approach, the driving signal includes a time-gated (or "pinged") signal that is turned on and off (e.g., periodically). In another approach, the oscillator is driven in a continuous fashion, such as via a time varying wave function. When the first element is aligned with the second element of the switch, a trigger signal is generated by the sensing circuit, indicating a closed switch state. In one exemplary implementation, two electron tunneling electrodes (one fixed and one movable) are used as the switch and the signal includes a tunneling discharge pulse caused by the close proximity of electrode tips when the electrodes are aligned in the closed switch position. By measuring the time interval between successive trigger events (indicative of the oscillator passing through a reference position) the period of oscillations is determined, and thereby the external force acting upon the apparatus may be derived.

The control logic 109 provides signal arbitration and digital processing of the digital pulse signals. For example, this functional block may translate input signals to one or more required digital logic types (LVDS, PECL, etc.), or apply combinational logic (AND, OR, XOR, NOT, etc.) to any set of signals.

The time-to-digital conversion (TDC) element 111 converts a plurality of input digital pulses into related timing events represented as a digital value (integer, floating point, etc.). By way of example, this element may include application-specific-integrated-circuits and/or field-programmable-gate-array (ASIC/FPGA) based devices and commercial solutions based on Vernier interpolation techniques (e.g., ACAM Messeleetronic gmbh, Friedrich-List-Strasse 4, 76297 Stutensee-Blankenloch, Germany; device part number: GP21).

The TDS ADC includes algorithm processing logic 113 to process the TDC digital timing values, and other information ascertained from other system components, to produce digital values representing the input modulation data at given points in time. The specific algorithms used may be dictated by the user's application. For example, TDS algorithms could include the application of specific equations (e.g. those of Table 2) which combine various ratios of timing intervals to produce a representation of the input modulation source at regular sampling intervals. As an additional example, the TDS algorithm could also take the form of a curve fitting routine where timing and reference crossing information could be used to reconstruct a model or representation of the input modulation source.

Figure 1A:
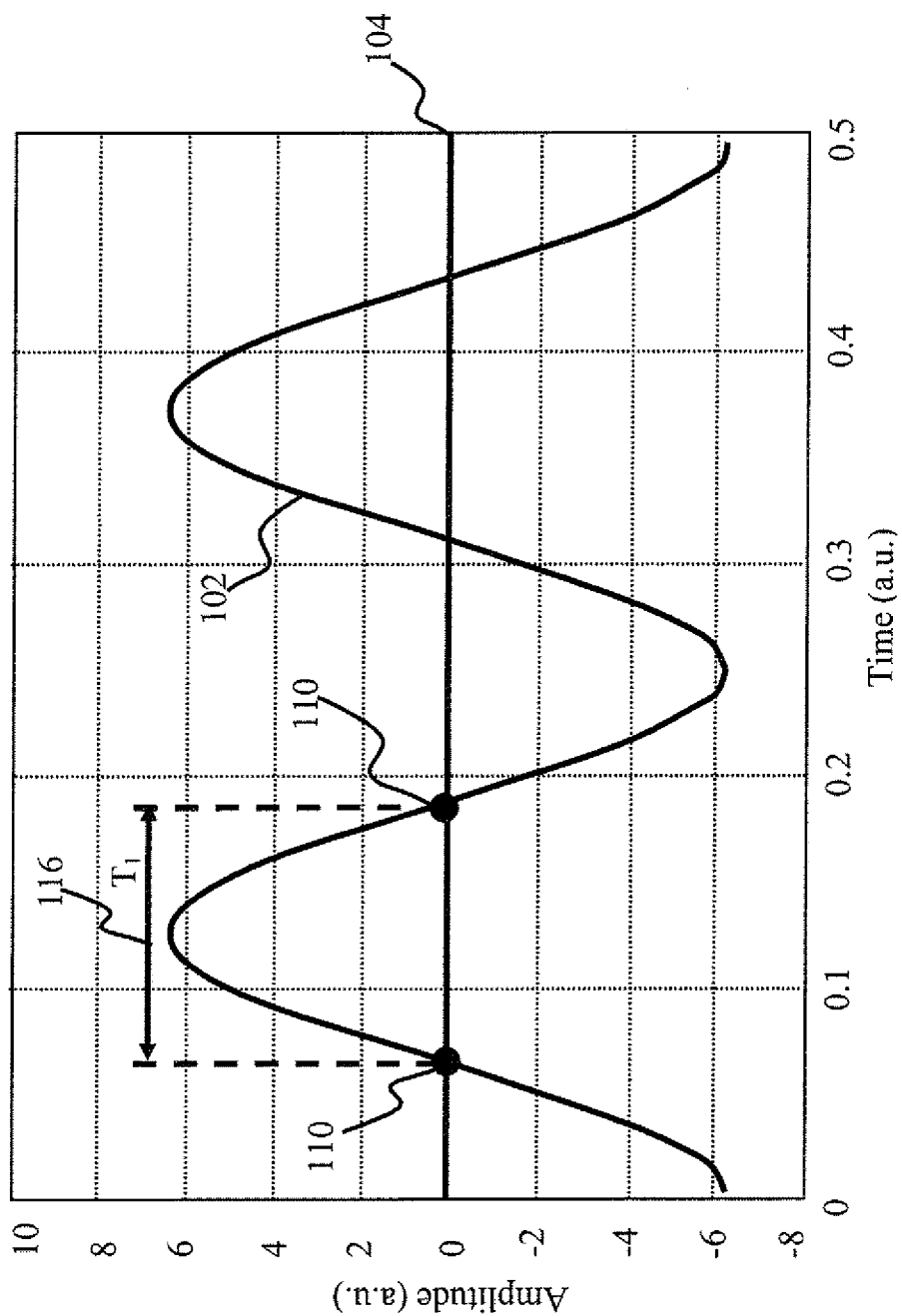
FIG. 1A is a plot illustrating one embodiment of a method of measuring input modulation signal using a single reference level time domain switching (TDS) analog to digital converter (ADC) according to the invention.

Referring now to FIG. 1A, time domain switched analog-to-digital conversion method is described in detail. In order to reconstruct the effects of input signal on the carrier, and hence to measure the input signal, the modulated signal (i.e., the carrier plus the input) is compared to a known reference level. In one embodiment, the reference level comprises a pre-selected voltages $V_1$ (denoted with the solid line 104) that is within the total voltage range of the modulated signal. Whenever the modulated signal waveform crosses any one of the reference voltage levels, a trigger event occurs. In one variant, each trigger event causes a pulse to be generated and a counter to be turned on or of This is accomplished by any mechanism capable of either producing a digital pulse or is switched from binary 0 to 1 or vice versa. The counter can then be triggered on/off by either the generated pulse or by the leading edge of the transition from a digital 0 to 1 or vice versa. The TDS measurement method illustrated in FIG. 1A requires knowledge of the carrier amplitude and frequency (period) in order to resolve the input signal as seen from Eqn. 2.

Figure 1B:
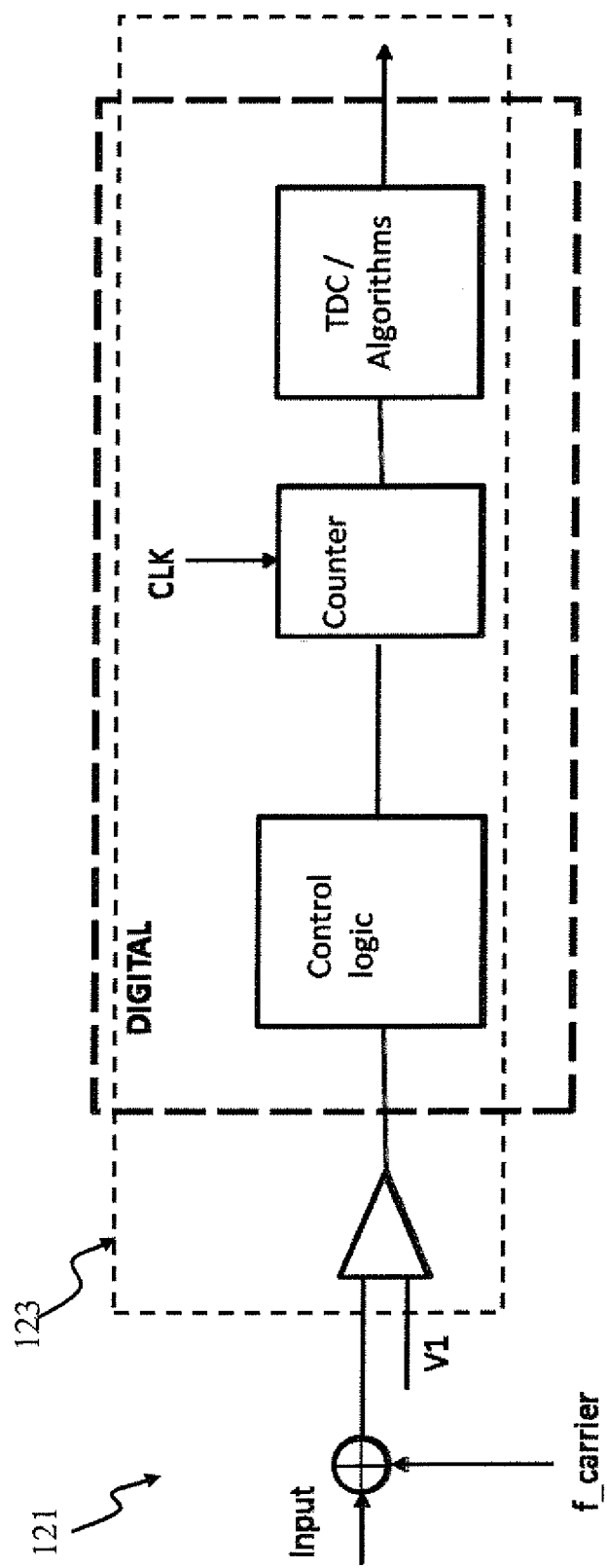
FIG. 1B is a block diagram depicting configuration of a single reference level time domain switching ADC according to one embodiment of the invention.

The exemplary embodiment of FIG. 1B comprises a combining circuit that combines the input signal with the carrier signal and uses a single reference level. The summed modulated signal is fed to, for example, a comparator or a window detector (as shown and described with respect to FIG. 1E infra). Each comparator compares the received modulated signal V(t) to the respective reference signal (e.g., $V_1$ in FIG. 1B). The reference signal $V_1$, is configured at a stable level selected at an appropriate convenient value, provided the level value it is within the voltage range of the summed modulated signal. The control logic block receives comparator output and generates respective trigger events (such as the trigger events, 110 described with respect to FIG. 1A, supra). In response to the trigger events, the control logic starts/stops counter block, configured to estimate duration of the time intervals $T_1$ using the input clock. The output of the counter block is fed to the time to digital converter that provides digital representation of the time interval between successive trigger pulses. According to Eqn. 2, the carrier amplitude and frequency are required in order to reconstruct the input signal from the time interval $T_1$ measurement for the single reference level TDS ADC implementation shown in FIG. 1B. The carrier amplitude and frequency may be determined by a variety of ways, such as, for example, using calibration data and or dedicated measurement channel.

Figure 1C:
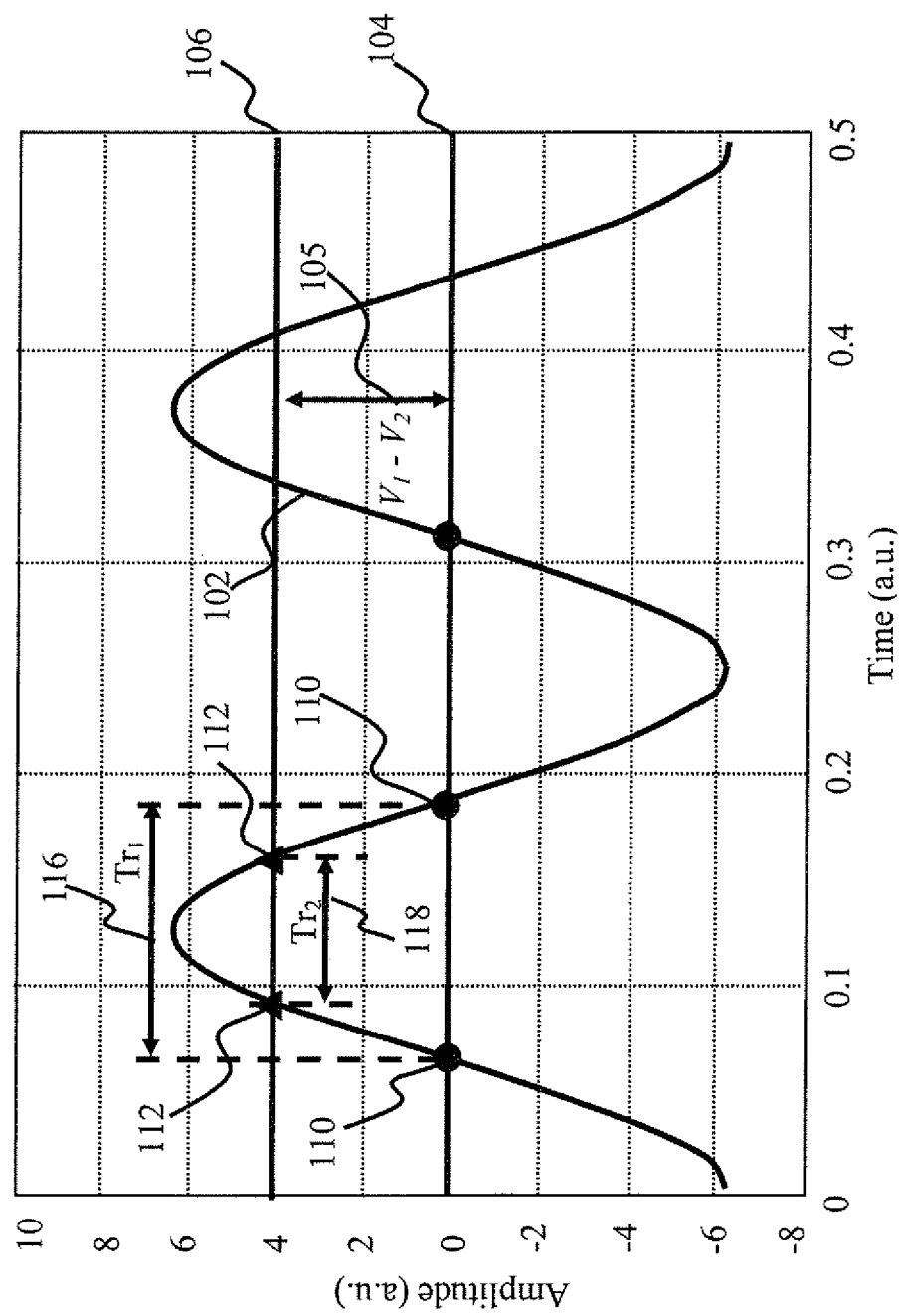
FIG. 1C is a plot illustrating one embodiment of a method of measuring input modulation signal using a two reference level TDS ADC according to the invention.
Figure 1D:
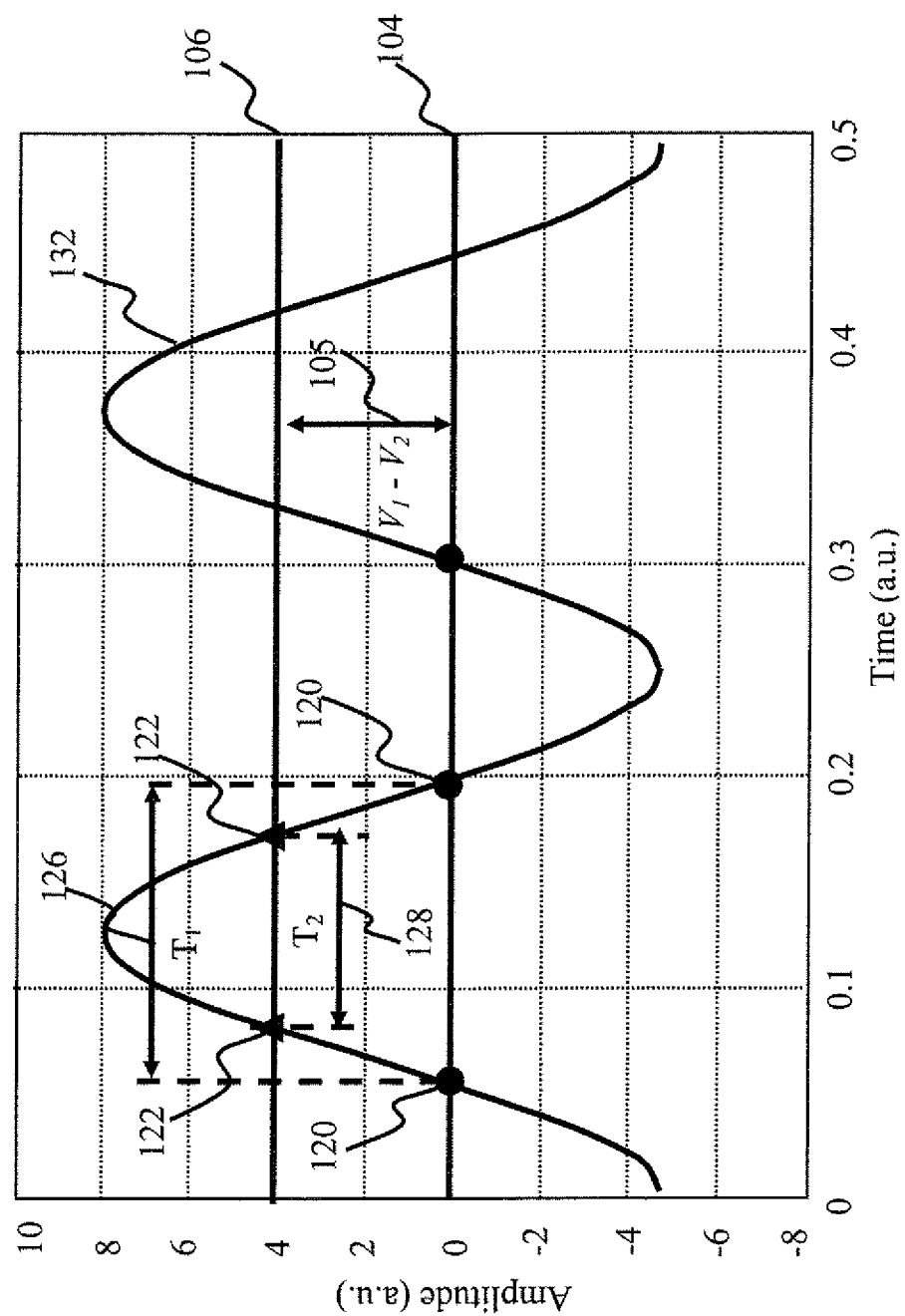
FIG. 1D is a plot illustrating of changes in the time intervals between successive reference level crossing as a function for a larger input signal, compared to the data shown in FIG. 1, according to one embodiment the two reference level TDS ADC of the invention.

FIGS. 1C-1D, illustrate the time domain switched analog-to-digital conversion that uses two known reference signal levels. In one embodiment, the reference levels comprise pre-selected voltages $V_1$ and $V_2$ (denoted with the solid lines 104, 106, in FIG. 1C, respectively) that are within the total voltage range of the modulated signal. Whenever the modulated signal waveform crosses any one of the reference voltage levels a trigger event occurs. In one variant, each trigger event causes a pulse to be generated and a counter to be turned on or off. This is accomplished by any mechanism capable of either producing a digital pulse or is switched from binary 0 to 1 or vice versa. The counter can then be triggered on/off by either the generated pulse of by the leading edge of the transition from a digital 0 to 1 or vice versa.

FIGS. 1C and 1D display changes in the measurement periods, corresponding to the modulated waveform crossing the reference levels, for two different values of the input signal $V_{input1}$ and $V_{input2}$, respectively. The first input (as shown in FIG. 1C) produces the time intervals, $T_{r1}$ and $T_{r2}$, corresponding the modulated waveform crossing the levels $V_1$ and $V_2$ and generating trigger events 210, 212, respectively. The second input (as shown in FIG. 1D) shifts the modulation waveform in the positive amplitude direction, thereby generating the time intervals $T_1 > T_{r1}$ and $T_2 > T_{r2}$, corresponding to the trigger events 220, 222, respectively. Conversely, an input signal that shifts the modulated waveform downwards (in the negative amplitude direction, not shown) produces smaller time intervals (not shown). The time periods corresponding to the modulated waveform crossing the reference levels are combined to obtain the modulated waveform amplitude (and hence the input signal) as described in detail below.

Figure 1E:
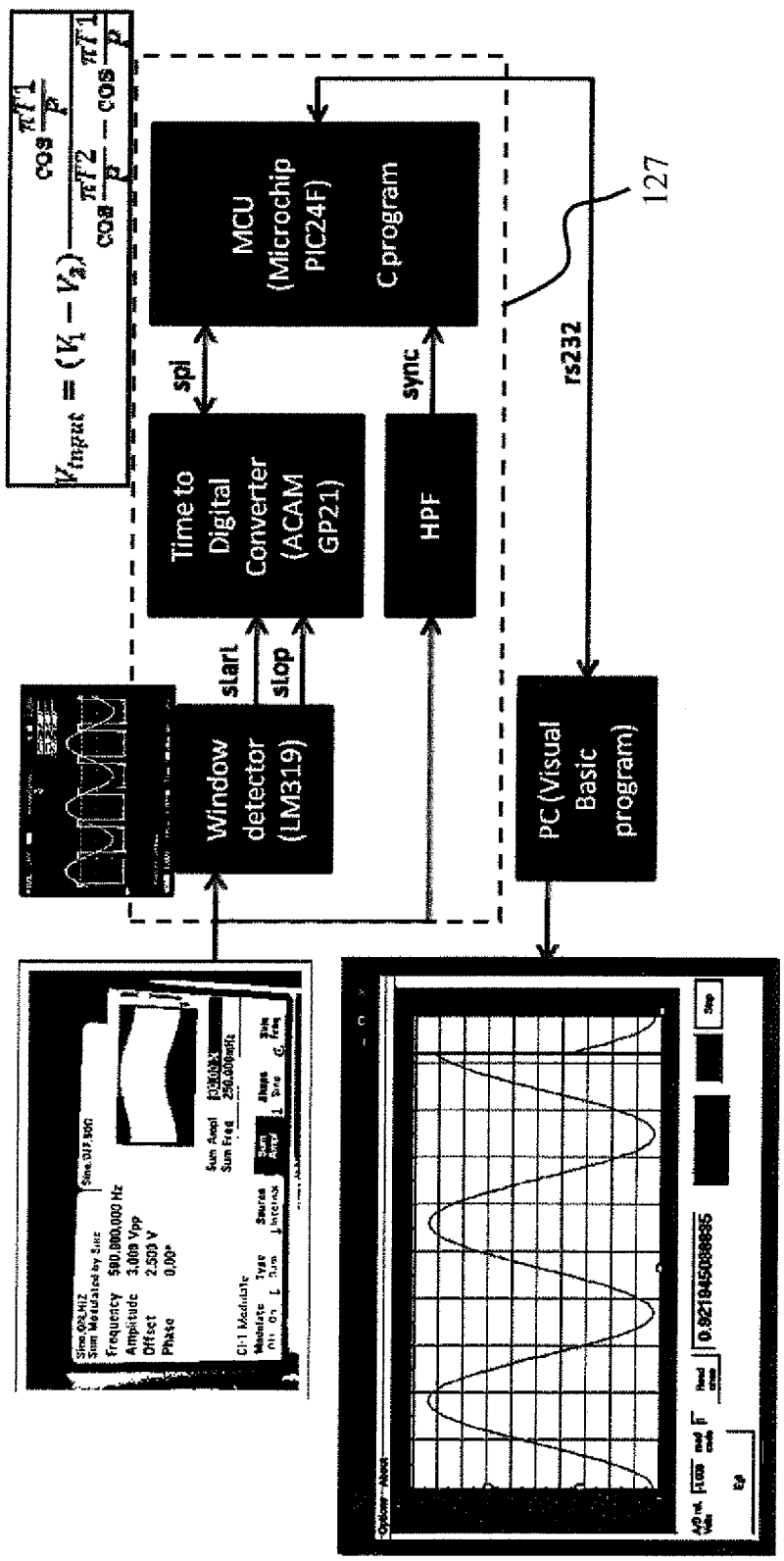
FIG. 1E is a block diagram illustrating a second embodiment of a two reference level TDS ADC of the invention.

FIG. 1E presents a functional block diagram of one embodiment of an exemplary TDS ADC circuit implemented by the Assignee and used for experimental demonstration of the time domain switched analog-to-digital conversion methods described supra. The apparatus 127 comprises an arbitrary waveform generator (e.g., Agilent 33522A) configured to simulate the modulated signal V(t). The modulated signal is fed from the waveform generator to a window detector, implemented using an exemplary dual comparator LM319, and configured to detect reference level crossings and to generate trigger events (e.g., pulses). The output of the window detector is fed to a time to digital converter (TDC) ACAM GP21 which performs time intervals $T_1$, $T_2$, $T_3$, $T_4$ measurements.

The output of the TDC is forwarded over a serial data link to a computational block (Microchip microcontroller (MCU) PIC24F) which also receives the high pass filtered modulation signal as synchronization indicator. The MCU implements input signal estimations using, for example, any of Eqns. 5-18, infra.

Figure 1F:
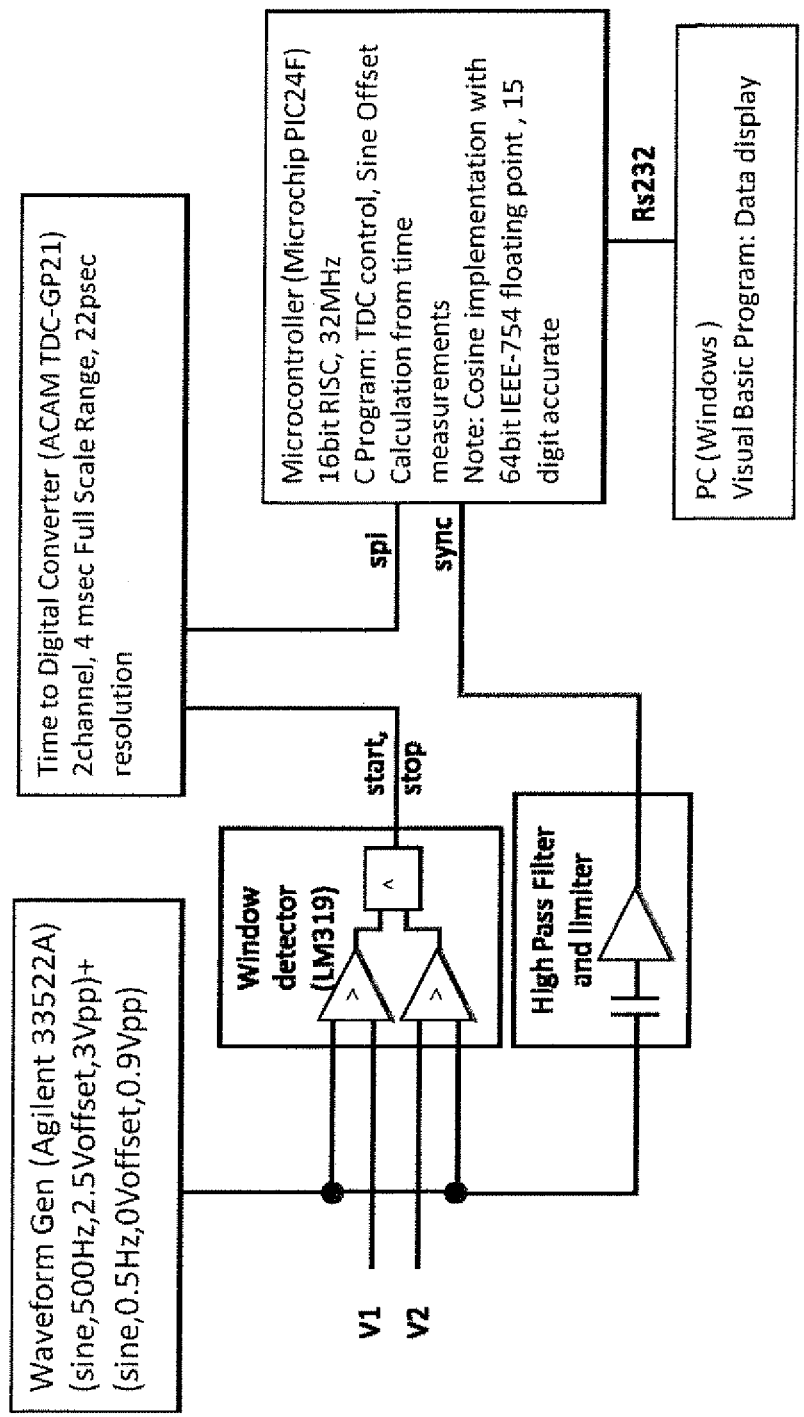
FIG. 1F is an electrical diagram detailing the TDS ADC of FIG. 1E.

FIG. 1F shows an electrical diagram corresponding to the TDS ADC of the embodiment shown in FIG. 1E.

Figure 1G:
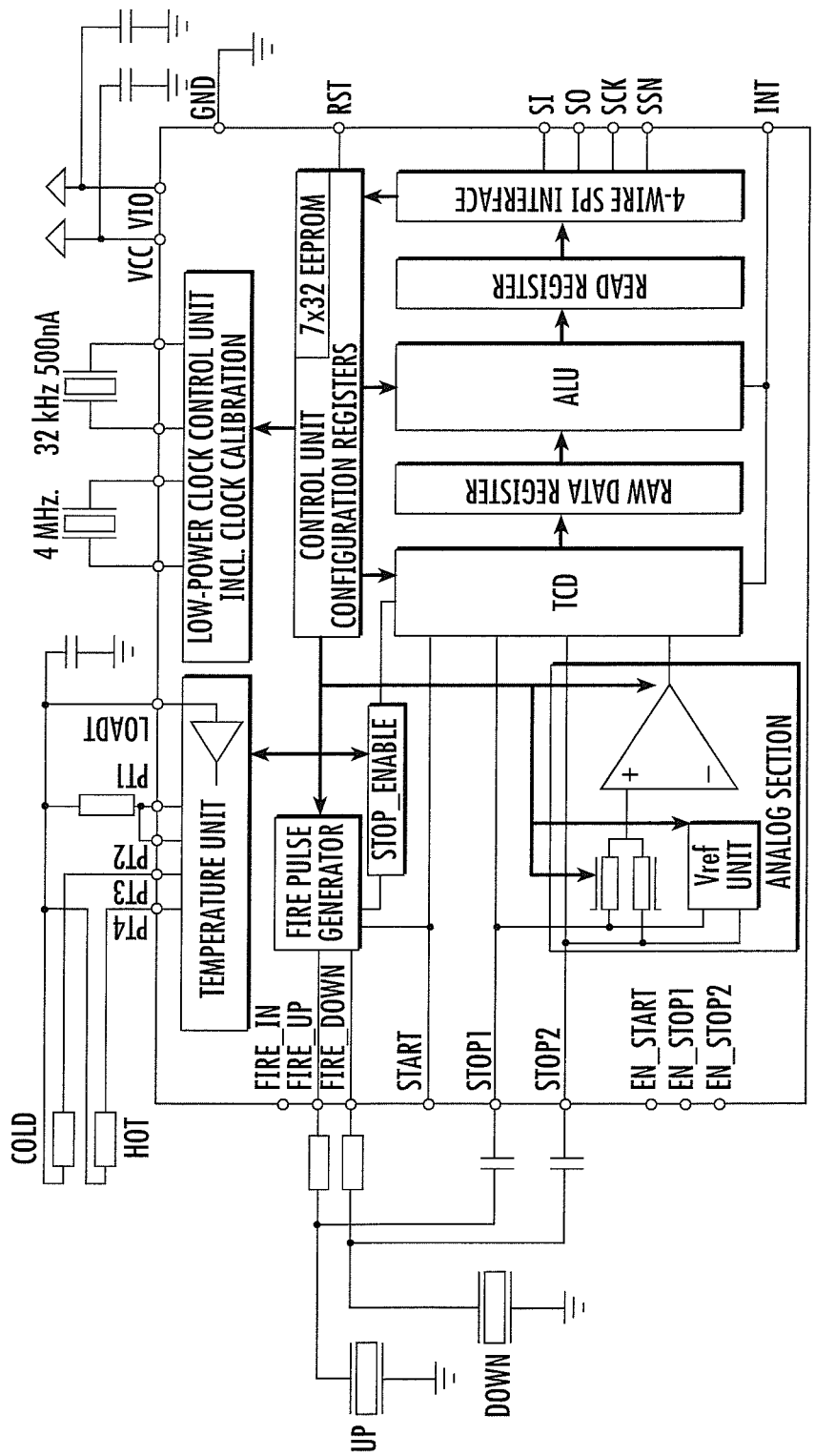
FIG. 1G is a block diagram depicting time to digital converter according to prior art for use with the exemplary ADC implementation of FIGS. 1E and 1F.

FIG. 1G shows a block diagram of one commercially available time to digital convertor TDC GP-21 used as part of the exemplary ADC embodiment of FIG. 1E.

Figure 1H:
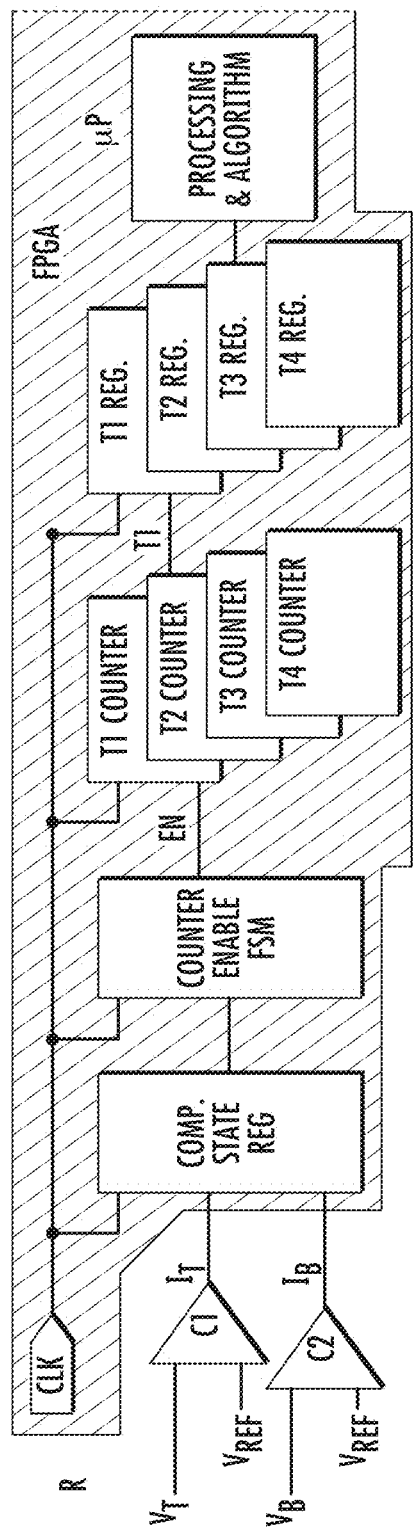
FIG. 1H is a block diagram detailing implementation of a single channel two reference level TDS ADC embodiment of FIG. 1E.

FIG. 1H illustrates one exemplary implementation of the sampling apparatus for use with the ADC apparatus of the embodiment shown in FIG. 1E. The time-domain switched ADC sampling apparatus comprises a programmable logic block (depicted by a polygon filled with a dotted pattern in FIG. 1E) such as field programmable gate array FPGA, programmable logic device (PLD), microcontroller, or any other computerized apparatus configured to execute machine readable code. In one variant, the control logic is implemented within an FPGA that supports an embedded microprocessor or digital processor.

Referring now to FIG. 1I, a timing diagram illustrating an exemplary operational sequence for the time-domain switching analog to digital converter configuration of FIG. 1H.

Figure 1J:
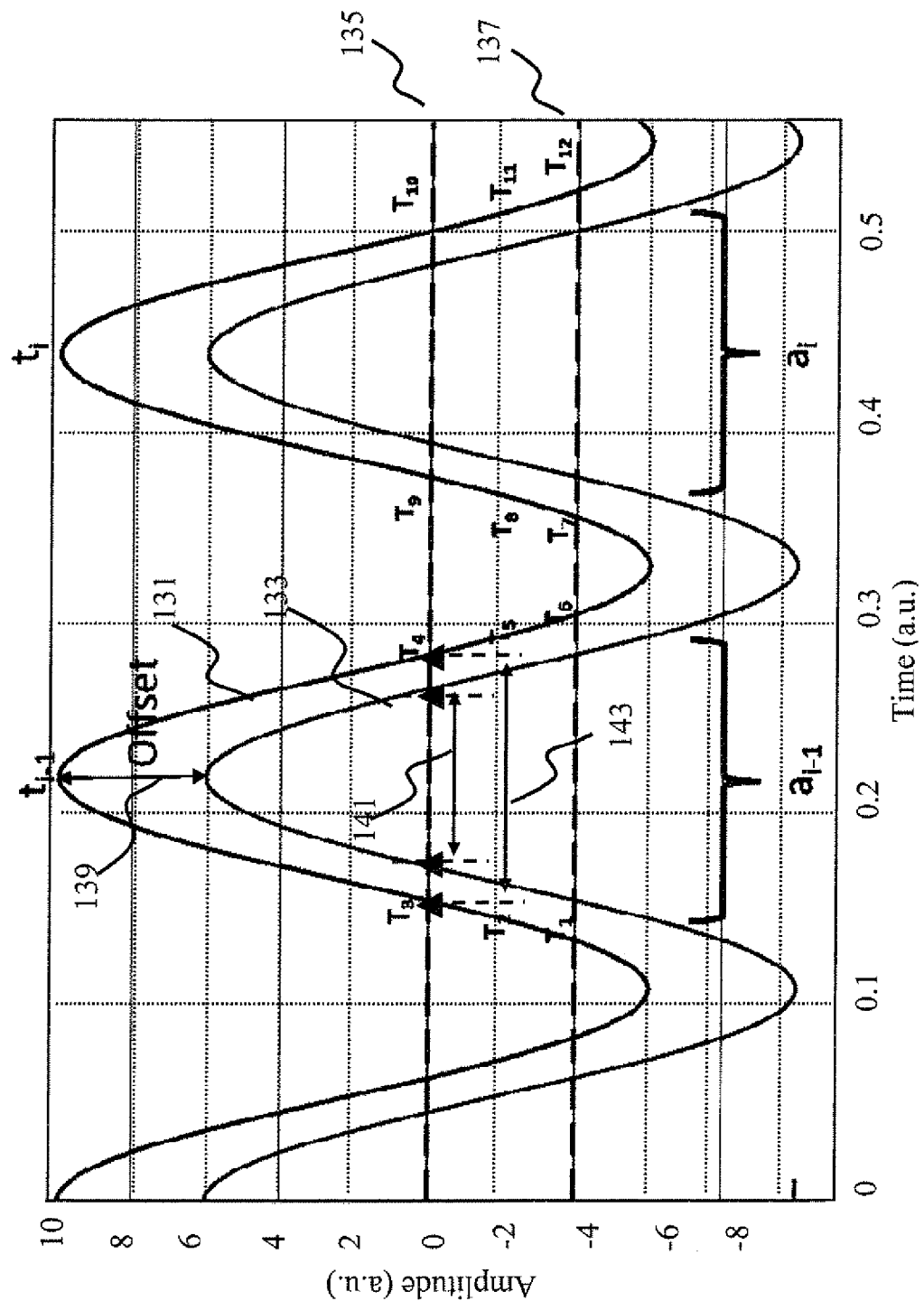
FIG. 1J is a plot illustrating one example of modulation effects on the carrier signal waveforms trajectory according to one embodiment of the invention.

FIG. 1J show carrier waveforms modulated by different input signals, where the curve 131 corresponds to a larger positive value of the input signal $V_{in1}$, compared to the input signal Vin0 corresponding to the curve 133. In the configuration where $V_{in0}=0$, the offset (139) corresponds to the $V_{in1}$. The data in FIG. 1J illustrate changes in the time intervals between successive trigger events (for each reference level) due to changes in the input signal (DC shift), as indicated by horizontal arrows 141, 143 in FIG. 1J).

Figure 1K:
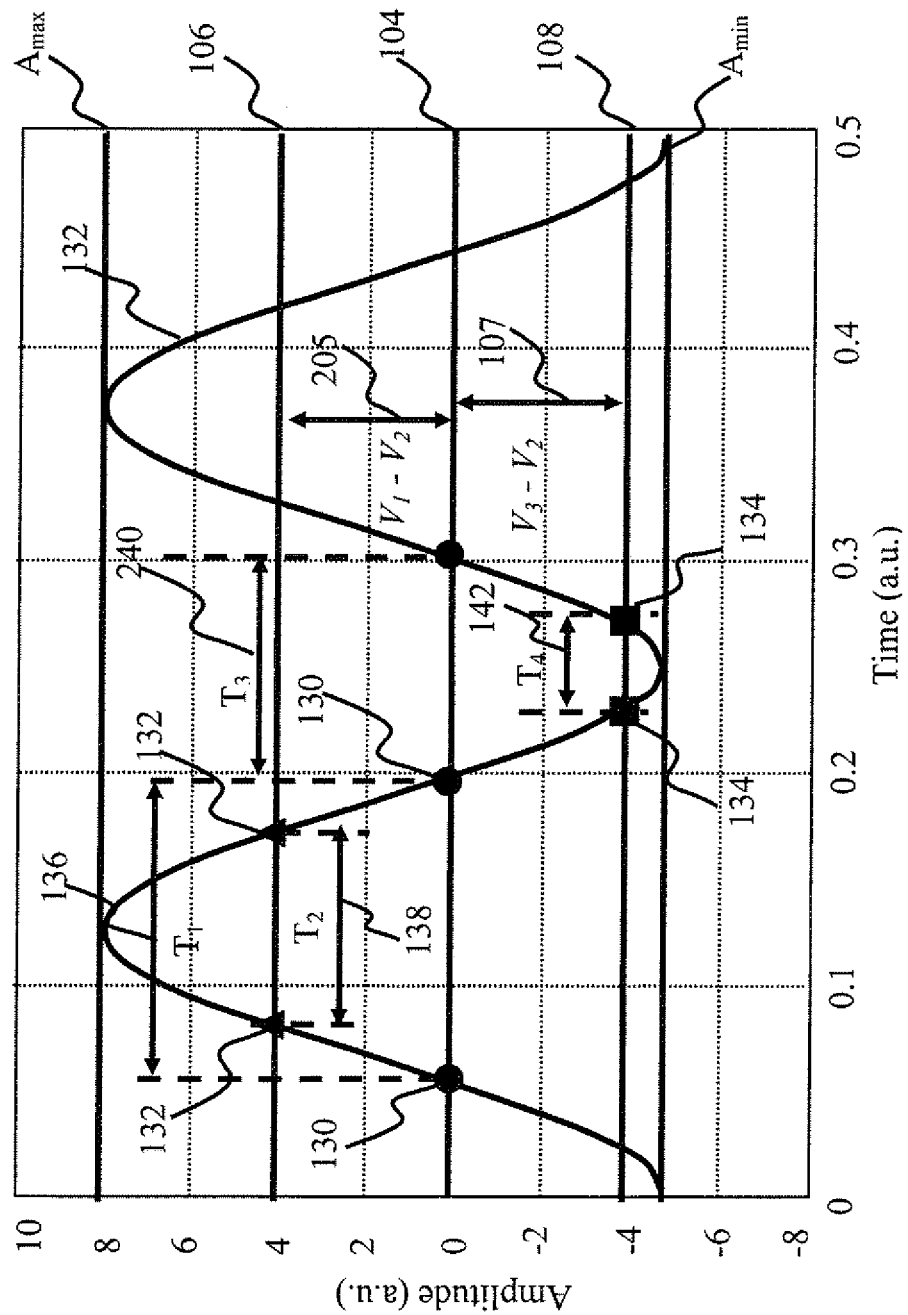
FIG. 1K is a plot illustrating one embodiment of a method of measuring an input modulation signal using a three reference level TDS ADC according to the invention.

In another embodiment, three reference signal levels ($V_1$, $V_2$, and $V_3$) are used to measure modulated signal amplitude, as shown in FIG. 1K. in one variant, the modulated waveform crossing of the three reference levels generates four time intervals $T_1$, $T_2$, $T_3$, and $T_4$, corresponding to the trigger events 230, 232, and 234. That is, the time intervals $T_1$, $T_2$, $T_3$, and $T_4$ are constructed based on the crossing of each reference level independent from other reference levels. In another variant (not shown), the time intervals are constructed based on any combination of the sequence of trigger events, such as, for example, generated by the modulated waveform 132 crossing the reference levels $V_1$, $V_2$, $V_3$ in FIG. 1K). That is, the trigger event 122 may be combined with the trigger event 120 in order to measure the modulated waveform, and so on. Although reference levels $V_1$ and $V_3$ are shown as being symmetric with respect to the level $V_2$, other reference signal level configurations are usable provided that the reference levels $V_1$, $V_2$, $V_3$ are within the expected maximum amplitude range of the modulation signal. That is, for the embodiment of FIG. 1K, $V_1$ is smaller (below) than $A_{max}$, and $V_3$ is greater (above) the $A_{min}$.

In another implementation applicable to unipolar signal measurements, all reference levels must be either positive (or negative) and be of the same polarity as the carrier signal. In one variant, a positive carrier voltage with sufficient amplitude may be used in conjunction with a negative input signal provided that modulated signal is not offset enough to prevent switching at any of the voltage references.

In the embodiments of the conversion method shown in FIGS. 1C, 1D, and 1K, the amplitude of the carrier signal $A_c$ does not need to be known. The time intervals, $T_1$, $T_2$, $T_3$ and $T_4$ provide two independent estimates of the modulated signal amplitude: one near the waveform maximum $A_+$ and another near the waveform minimum $A_-$.

The carrier amplitude around the oscillation maximum is obtained by combining the upswing reference level $V_1$ crossing period $T_1$ and the reference level $V_2$ crossing period $T_2$ as follows:

$$A_+ = \frac{V_1 - V_2}{\cos\frac{\pi T_2}{P} - \cos\frac{\pi T_1}{P}}, \quad \text{(Eqn. 3)}$$

where: $d_0$ is the distance between the reference trigger point and the positive trigger point (the trigger gap);

P is the period of oscillations defined as $P=T_1+T_3$;

$A_+$ is the carrier amplitude around the oscillation maxima;

$T_1$ is the upswing reference level $V_1$ crossing period; and $T_2$ is the reference level $V_2$ crossing period.

Similarly, the carrier amplitude around the oscillation minimum is obtained by combining the downswing reference level $V_1$ period $T_3$ and the reference level $V_3$ crossing period $T_4$ as follows:

$$A_- = \frac{V_3 - V_2}{\cos\frac{\pi T_3}{P} - \cos\frac{\pi T_4}{P}} \quad \text{(Eqn. 4)}$$

where: P is the period of oscillations defined as $P=T_1+T_3$;

$A_-$ is the carrier amplitude estimate around the oscillation minima;

$T_3$ is the downswing reference level $V_1$ crossing period; and $T_4$ is the reference level $V_3$ crossing period.

Combining Eqns. 2 through 4 two independent input signal estimates are obtained as follows:

$$V_{input} = (V_1 - V_2)\frac{\cos\frac{\pi T_1}{P}}{\cos\frac{\pi T_2}{P} - \cos\frac{\pi T_1}{P}}, \quad \text{(Eqn. 5)}$$

$$V_{input} = (V_2 - V_3)\frac{\frac{\pi T_3}{P}}{\cos\frac{\pi T_3}{P} - \cos\frac{\pi T_4}{P}} \quad \text{(Eqn. 6)}$$

Eqns. 5 and 6 provide the basis for the time domain switching analog to digital conversion according to one embodiment of the invention. Input signal measurements require accurate estimation of the time intervals $T_1$, $T_2$, $T_3$, and $T_4$, as shown in FIG. 1C and Eqns. 5 and 6, supra. It follows from Eqns. 5 and 6 that the accuracy of the TDS ADC measurement depends on the accuracy of the difference between the reference signal levels, and not on the absolute accuracy of each individual reference level. This feature of the TDS ADC, advantageously improves converter long term accuracy and stability, as potential individual reference signal drift due to aging, temperature, or other effects cancels out.

In one variant, the period of the carrier frequency is obtained by measuring 2 successive trigger points and the voltage difference between the two voltage levels, $V_1$ and $V_2$ (or $V_2$ and $V_3$). For a near DC input signal (as described in Eqn. 2, supra) than any two consecutive time intervals (corresponding to the same reference level) may be used in order to measure the period of the carrier signal. For time varying input signal (described below with respect to Eqns. 20 and 21) a zero crossings method is used in order to determine the carrier period. This is required because the time intervals that correspond to reference levels that are other than zero, will be "skewed" due to time variations in the input signal.

In another variant, the carrier period is measured by averaging the time intervals between any two consecutive reference level crossings (that correspond to the same reference level) modulated signal over a period of time, that is 10 to 100 times longer than the carrier period. Such approach provides accurate estimates of the carrier period for DC and time varying input signal.

Figure 1L:
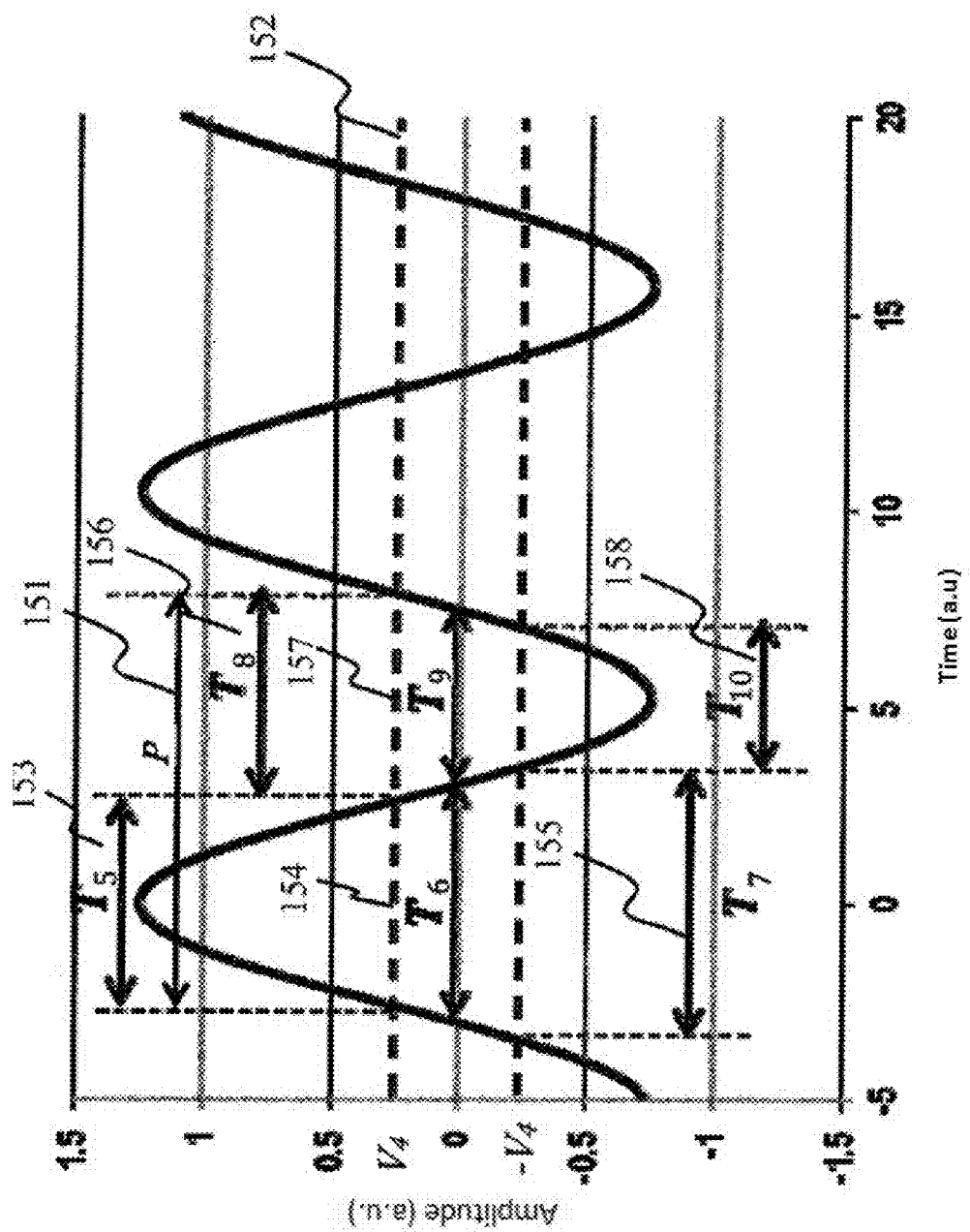
FIG. 1L is a plot illustrating various embodiments of a method of measuring an input modulation signal using a two reference level TDS ADC according to the present invention.

Referring now to FIG. 1L, sampling parameters for a sinusoidal wave are shown. These parameters are used to construct estimates of the amplitude of the signal input combined with the carrier wave. These estimates are then used to derive signal input amplitude without the using the relation in Eqn. 2. In various embodiments of the invention, the alternate and independent formulations of the estimate of input voltage ($V_{input}$) signal are used. Such equations include, but are not limited to, the equations in Table 2 as follows:

TABLE 2

$$V_{input} = \frac{-V_4\cos\left(\frac{\pi T_6}{P}\right)}{\cos\left(\frac{\pi T_5}{P}\right) - \cos\left(\frac{\pi T_6}{P}\right)} \qquad 7$$

$$V_{input} = \frac{-V_4\cos\left(\frac{\pi T_5}{P}\right)}{\cos\left(\frac{\pi T_5}{P}\right) - \cos\left(\frac{\pi T_6}{P}\right)} + V_4 \qquad 8$$

$$V_{input} = \frac{-V_4\cos\left(\frac{\pi T_6}{P}\right)}{\cos\left(\frac{\pi T_6}{P}\right) - \cos\left(\frac{\pi T_7}{P}\right)} \qquad 9$$

$$V_{input} = V_4 - \frac{2V_4\cos\left(\frac{\pi T_5}{P}\right)}{\cos\left(\frac{\pi T_5}{P}\right) - \cos\left(\frac{\pi T_7}{P}\right)} \qquad 10$$

$$V_{input} = -V_4 + \frac{2V_4\cos\left(\frac{\pi T_7}{P}\right)}{\cos\left(\frac{\pi T_5}{P}\right) - \cos\left(\frac{\pi T_7}{P}\right)} \qquad 11$$

$$V_{input} = \frac{V_4\cos\left(\frac{\pi T_9}{P}\right)}{\cos\left(\frac{\pi T_{10}}{P}\right) - \cos\left(\frac{\pi T_9}{P}\right)} \qquad 12$$

$$V_{input} = -V_4 + \frac{V_4\cos\left(\frac{\pi T_{10}}{P}\right)}{\cos\left(\frac{\pi T_{10}}{P}\right) - \cos\left(\frac{\pi T_9}{P}\right)} \qquad 13$$

$$V_{input} = \frac{V_4\cos\left(\frac{\pi T_9}{P}\right)}{\cos\left(\frac{\pi T_9}{P}\right) - \cos\left(\frac{\pi T_8}{P}\right)} \qquad 14$$

$$V_{input} = V_4 + \frac{2V_4\cos\left(\frac{\pi T_8}{P}\right)}{\cos\left(\frac{\pi T_{10}}{P}\right) - \cos\left(\frac{\pi T_8}{P}\right)} \qquad 15$$

$$V_{input} = -V_4 + \frac{2V_4\cos\left(\frac{\pi T_{10}}{P}\right)}{\cos\left(\frac{\pi T_{10}}{P}\right) - \cos\left(\frac{\pi T_8}{P}\right)} \qquad 16$$

$$V_{input} = -V_4 + \frac{2V_4\cos\left(\frac{\pi T_7}{P}\right)}{\cos\left(\frac{\pi T_8}{P}\right) - \cos\left(\frac{\pi T_7}{P}\right)} \qquad 17$$

TABLE 2-continued $$V_{input} = \frac{-2V_4\cos\left(\frac{\pi T_8}{P}\right)}{\cos\left(\frac{\pi T_8}{P}\right) - \cos\left(\frac{\pi T_7}{P}\right)} + V_4 \quad \text{18}$$

where: $V_{input}$ is the input voltage
P is the period of the oscillations of the carrier (151 of FIG. 1L, equal to $T_5+T_8$)
$V_4$ is the magnitude of the upper and lower reference voltage levels (152 of FIG. 1L)
$T_5$-$T_0$ are the periods between level crossings (153-158 FIG. 1L)

The equations of Table 2 may be used in concert with Eqns. 5 and 6, or amongst themselves to generate independent estimates of the input signal voltage.

Figure 1M:
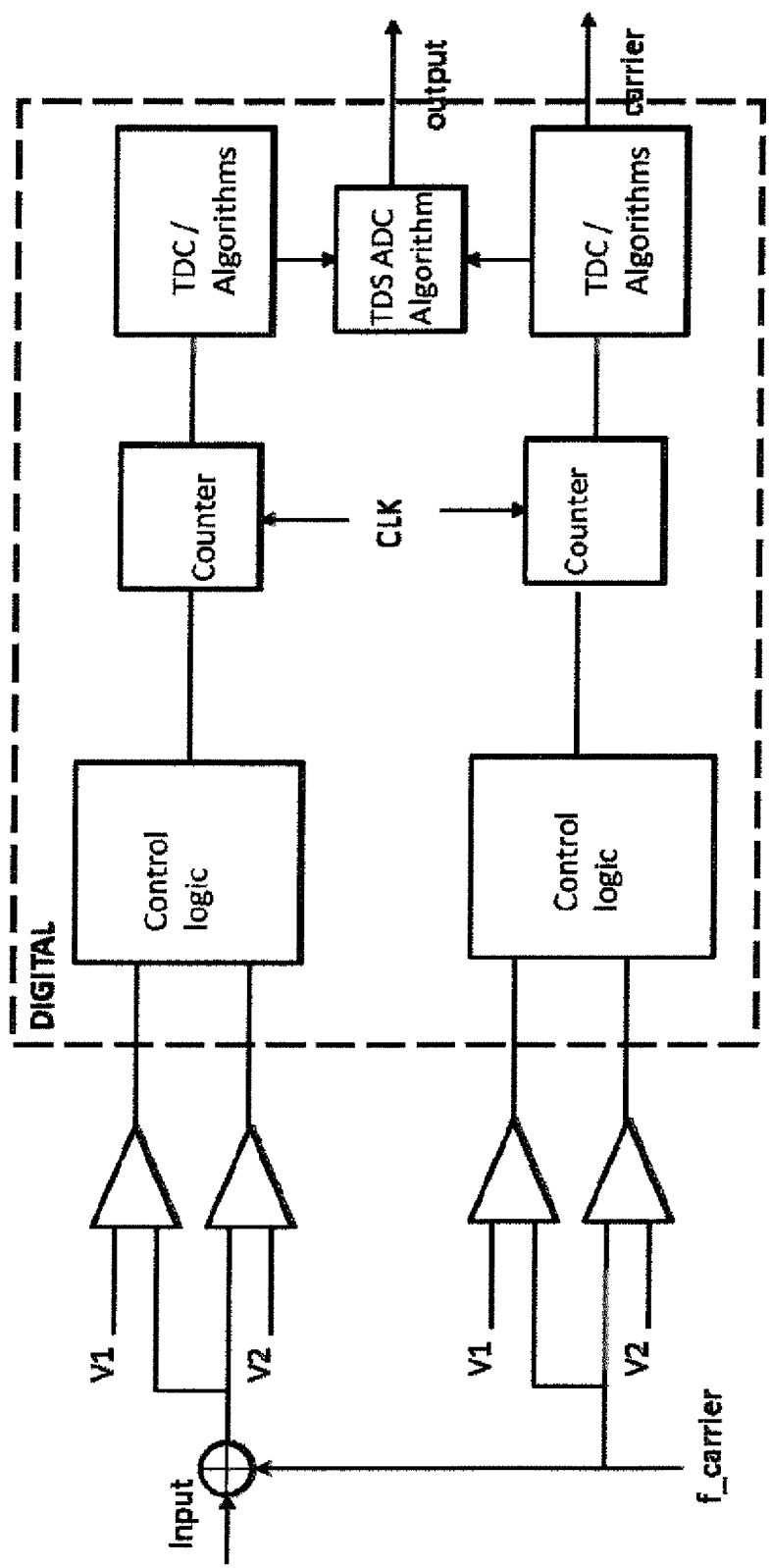
FIG. 1M is a block diagram depicting configuration of a two channel two reference level time domain switching ADC comprising independent carrier measurement according to one embodiment of the invention.

The programmable logic block comprises the comparator state register coupled to the output channels of two comparators, corresponding to the $V_1$ and $V_2$ reference signals. The logic states of the comparator are fed to the counter finite state machine (FSM), the latter which controls operation of four period counters, corresponding to the periods $T_1$ through $T_4$, respectively, of FIG. 1D. The counter outputs are coupled to the four registers, configured to store period duration counts $T_1$ through $T_4$, respectively. During operation, the modulation waveform changes due to influence of the input signal $V_{input}$, and hence generates trigger events corresponding to the reference signal levels (as illustrated in FIGS. 1C and 1D). The sensing block is configured to measure the time interval between successive trigger events (such as, for example, the trigger events (210 and 212) in FIG. 1A), and to determine the input signal using Eqns. 2-6 described above. The TDC and MCU blocks of FIG. 1M correspond to the digital portion of the ADC shown in FIG. 1N.

Figure 1N:
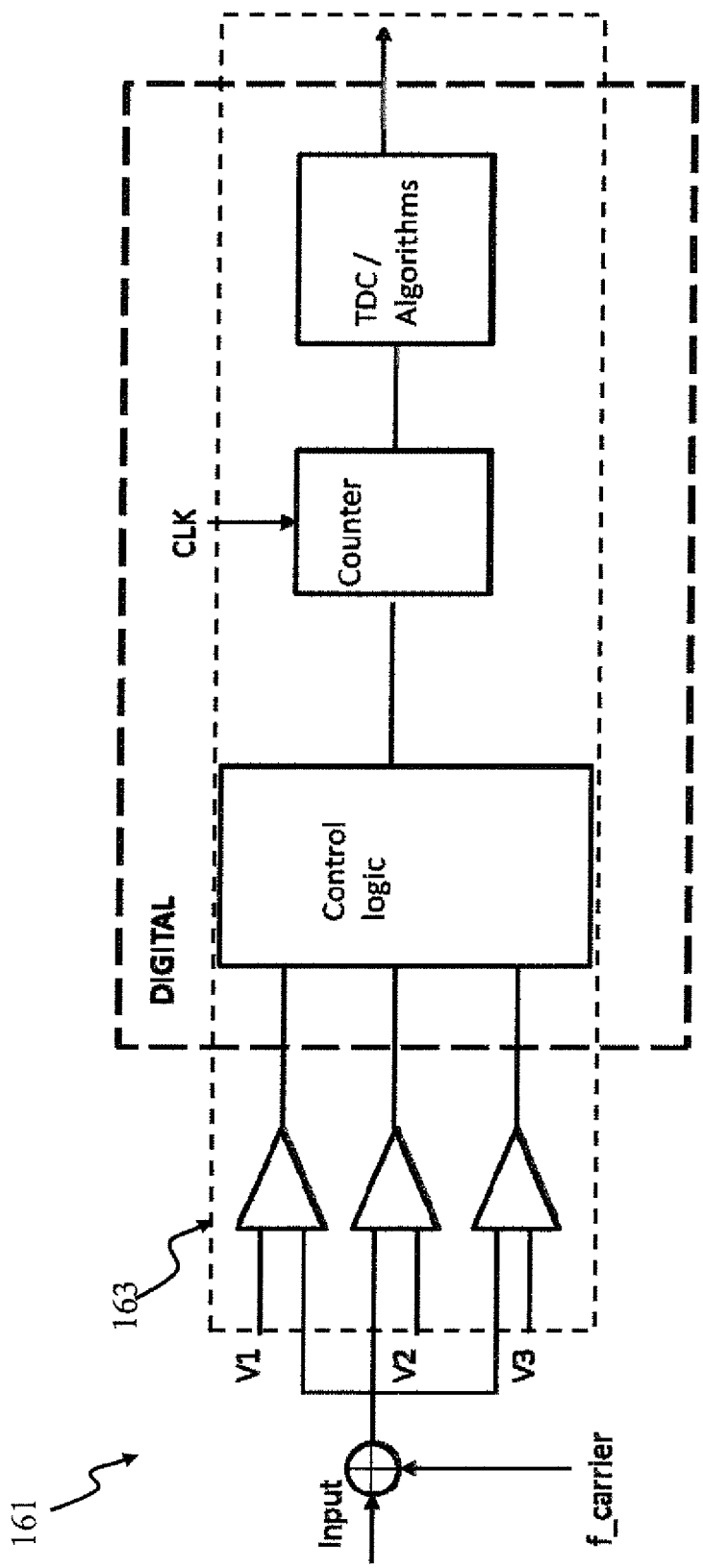
FIG. 1N is a block diagram depicting configuration of a three reference level time domain switching ADC according to one embodiment of the invention.

FIG. 1N presents one exemplary embodiment of the TDS ADC apparatus comprising three reference signals according to the invention. The use of two reference levels (such as shown in FIGS. 1C and 1D) provides additional trigger events (trigger events 114 in FIG. 1C) thus doubling the number of time interval sampling points (i.e. 2 samples per cycle). (The three voltage approach is useful when dealing with jerk or a time varying input.

Referring again to FIG. 1N, the ADC apparatus 161 comprises a combining block 163 that combines the input signal with the carrier and generates the summed modulated signal. The modulated signal is fed to a bank of comparators or window detectors or any device capable of produce a pulse or a state change from 1 to 0 or 0 to 1. Each comparator compares the received modulated signal V(t) to the respective reference signal (e.g., $V_1$, $V_2$, $V_3$). The voltage, $V_1$, $V_2$, and $V_3$, ideally should be stable and can be set to any value that is convenient provided it is within the voltage range of the summed signals. The control logic block receives comparator output and generates respective trigger events (such as the trigger events, 210, 212, 214, described with respect to FIG. 1K, supra). In response to the trigger events, the control logic starts/stops counter block, configured to estimate duration of the time intervals $T_1$, $T_2$, $T_3$, and $T_4$ using the reference clock. The output of the counter block is fed to the time to digital converter that provides time period measurements using a variety of applicable implementations, such as, for example, an FPGA, or MCU implementation.

Figure 1O:
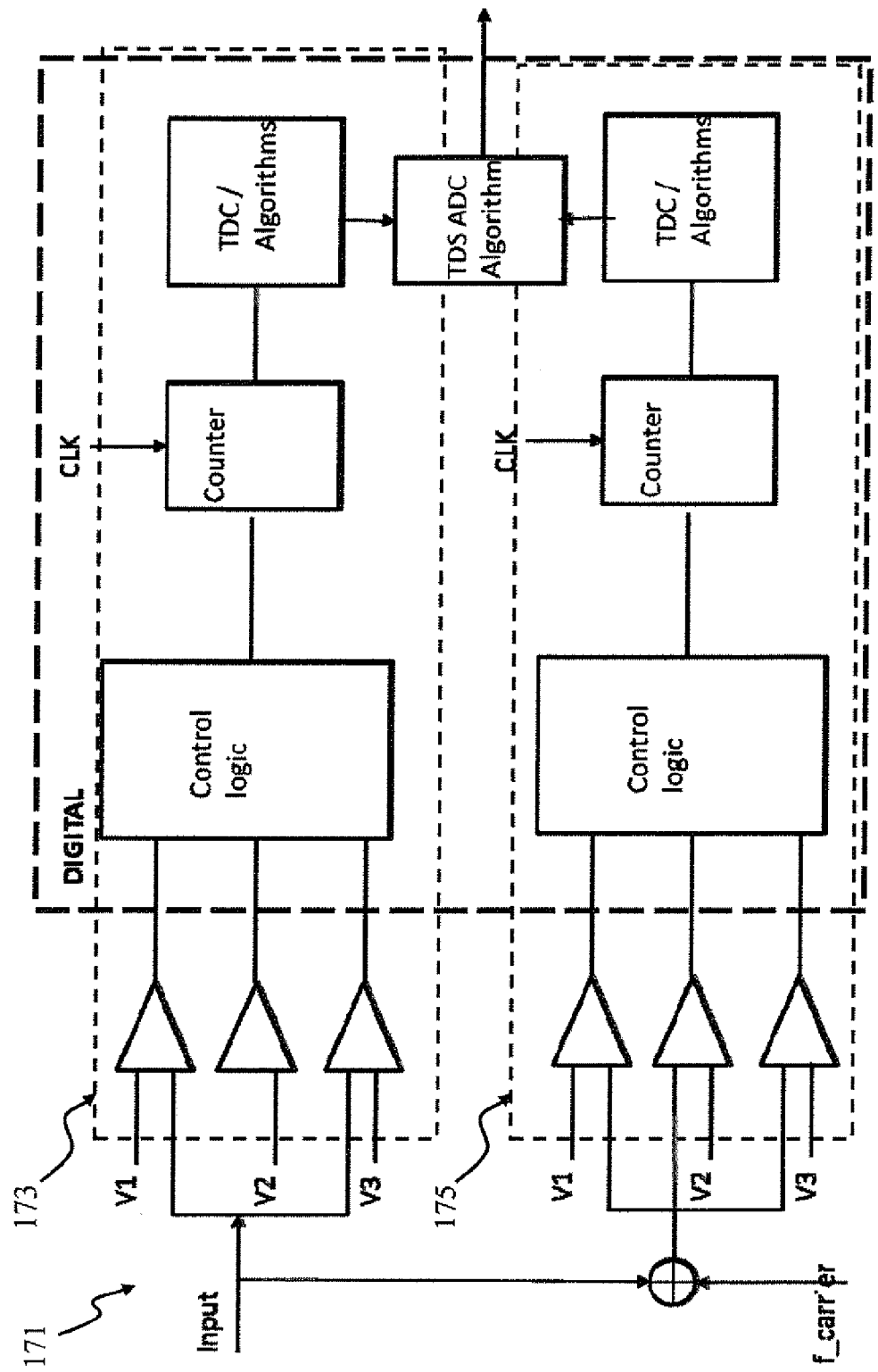
FIG. 1O is a block diagram depicting another embodiment of a three reference level time domain switching ADC of the invention.

In another embodiment shown in FIG. 1O, the ADC block 173 of the apparatus 171 is configured to receive and measure the un-modified input signal, while the ADC block 175 of the apparatus 171 is configured to receive and measure the summed modulated signal.

Figure 1P:
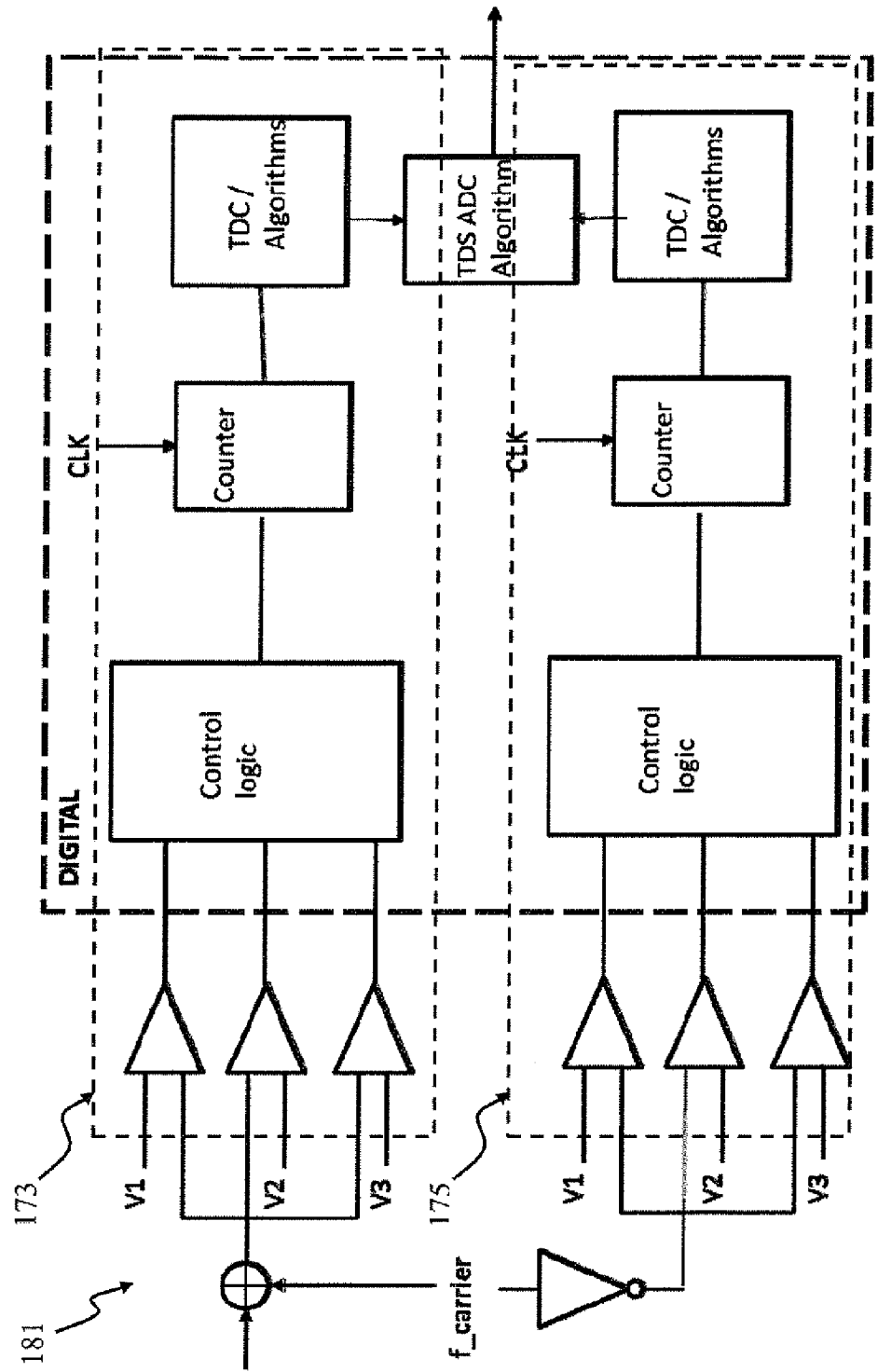
FIG. 1P is a block diagram depicting one embodiment of an inverted carrier three reference level time domain switching ADC of the invention.

FIG. 1P depicts another embodiment of the TDS ADC apparatus, where the ADC block 175 of the ADC apparatus 181 receives the inverted carrier signal, while the ADC block 173 receives the summed modulation signal.

Figure 1Q:
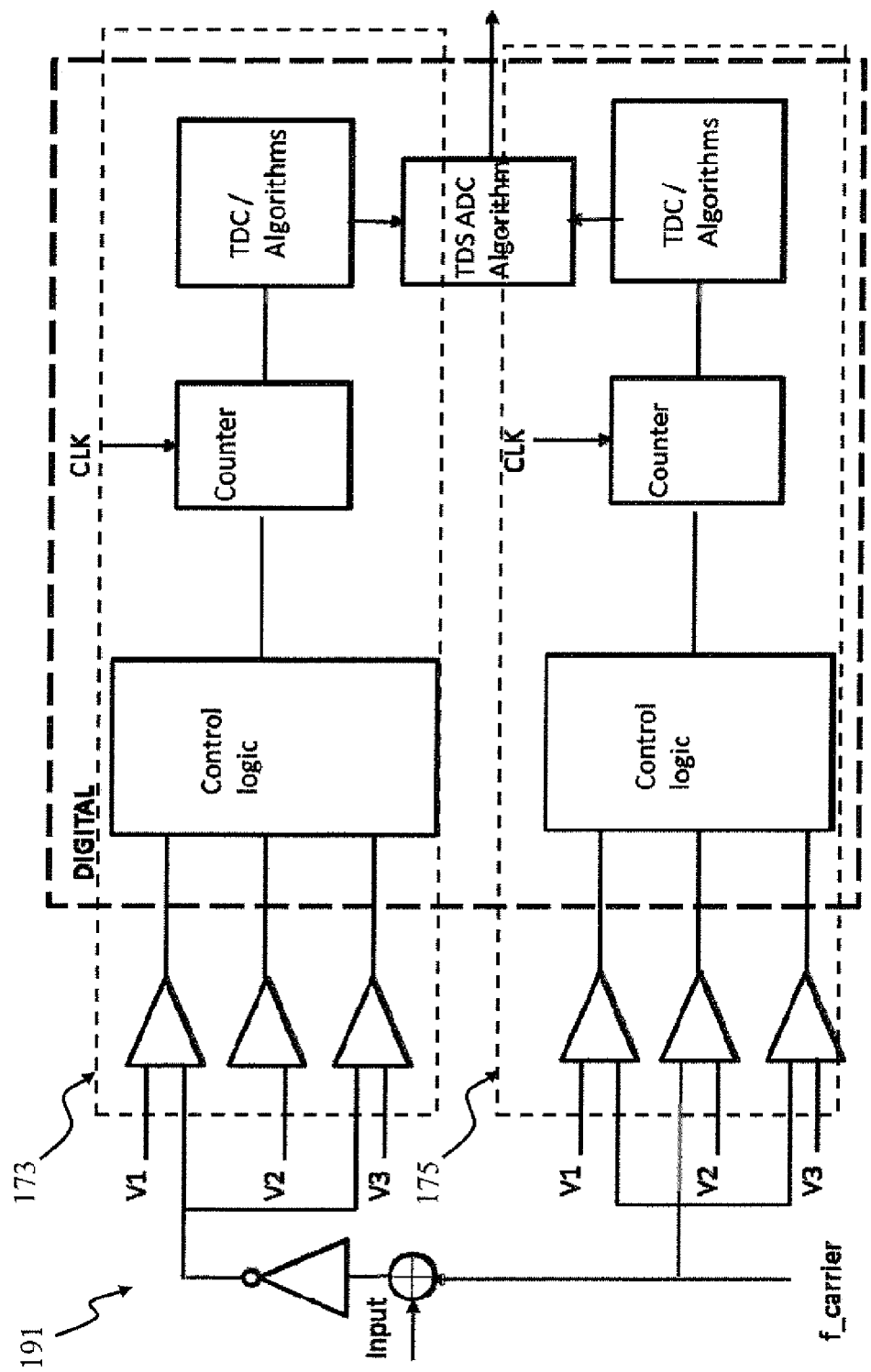
FIG. 1Q is a block diagram depicting another embodiment of a three reference level time domain switching ADC of the invention.

FIG. 1Q depicts yet another embodiment of the TDS ADC apparatus that is similar to the ADC embodiment of FIG. 1P. In the embodiment of FIG. 1Q, the ADC block 175 of the ADC apparatus 191 receives the carrier signal, while the ADC block 173 receives the inverted version of summed modulated signal.

Figure 1R:
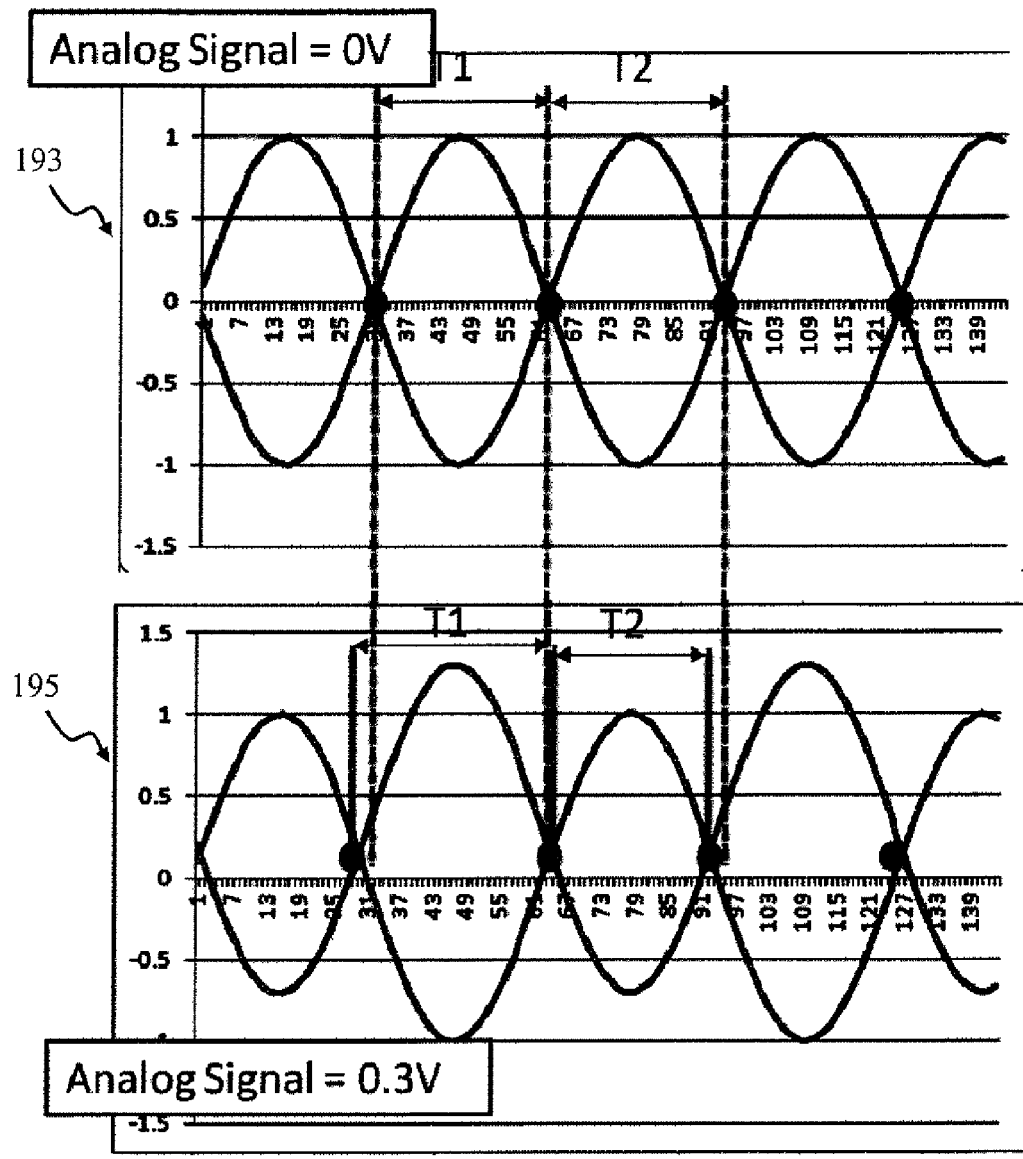
FIG. 1R is a plot depicting one embodiment of modulation signal waveform measurement consistent with the ADC embodiments of FIGS. 1Q and 1R according to the invention.

The ADC apparatus configurations of FIGS. 1P and 1Q enable direct reconstruction of the input signal according to a method illustrated in FIG. 1R. The method illustrated in FIG. 1R uses differencing of the time intervals (e.g., the intervals $T_1$, $T_2$, $T_3$, $T_4$) measured by the two ADC blocks (e.g., the blocks 173, 175 of the ADC 181 of FIG. 1P) in order to obtain a digital representation of the input signal. The top panel 193 in FIG. 1R illustrates signal waveforms fed to the ADC blocks 173, 175 of the ADC apparatus 181 for the input signal $V_{input}$ of 0 V. The bottom panel 195 in FIG. 1R illustrates signal waveforms fed to the ADC blocks 173, 175 of the ADC apparatus 181 for the input signal $V_{input}$ of 0.3V.

It will be appreciated by those skilled in the arts that while the embodiments shown in FIGS. 1N-1Q are implemented using the three level TDS ADC. However, any conversion apparatus that uses a single level, two levels (such as for example, the ADCs embodiments of FIGS. 1B, 1M), or any other practical number of reference levels can be used as well.

Figure 2:
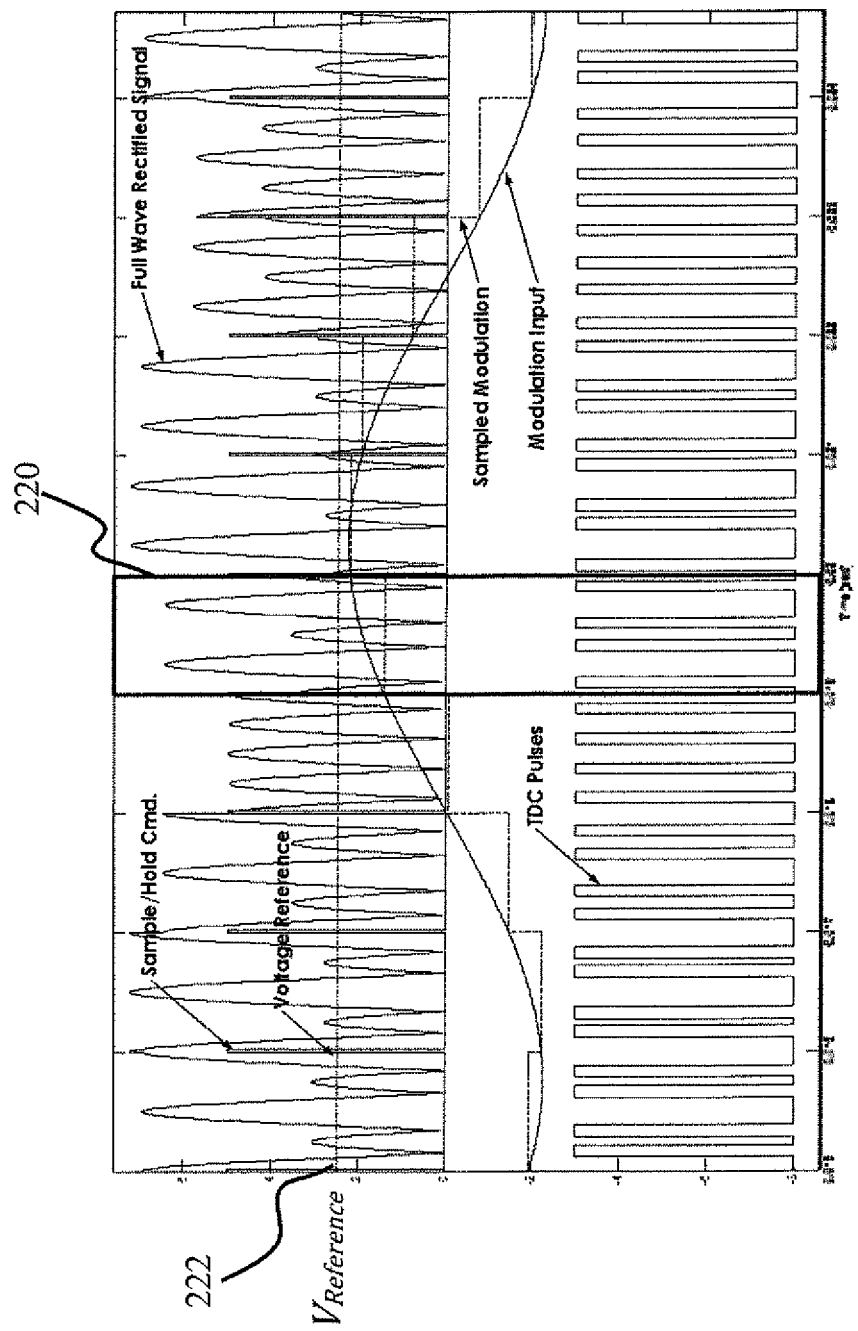
FIG. 2 is a plot illustrating one embodiment of a method of measuring an input modulation signal using a single reference level waveform-rectifying TDS ADC according to the present invention.
Figure 2A:
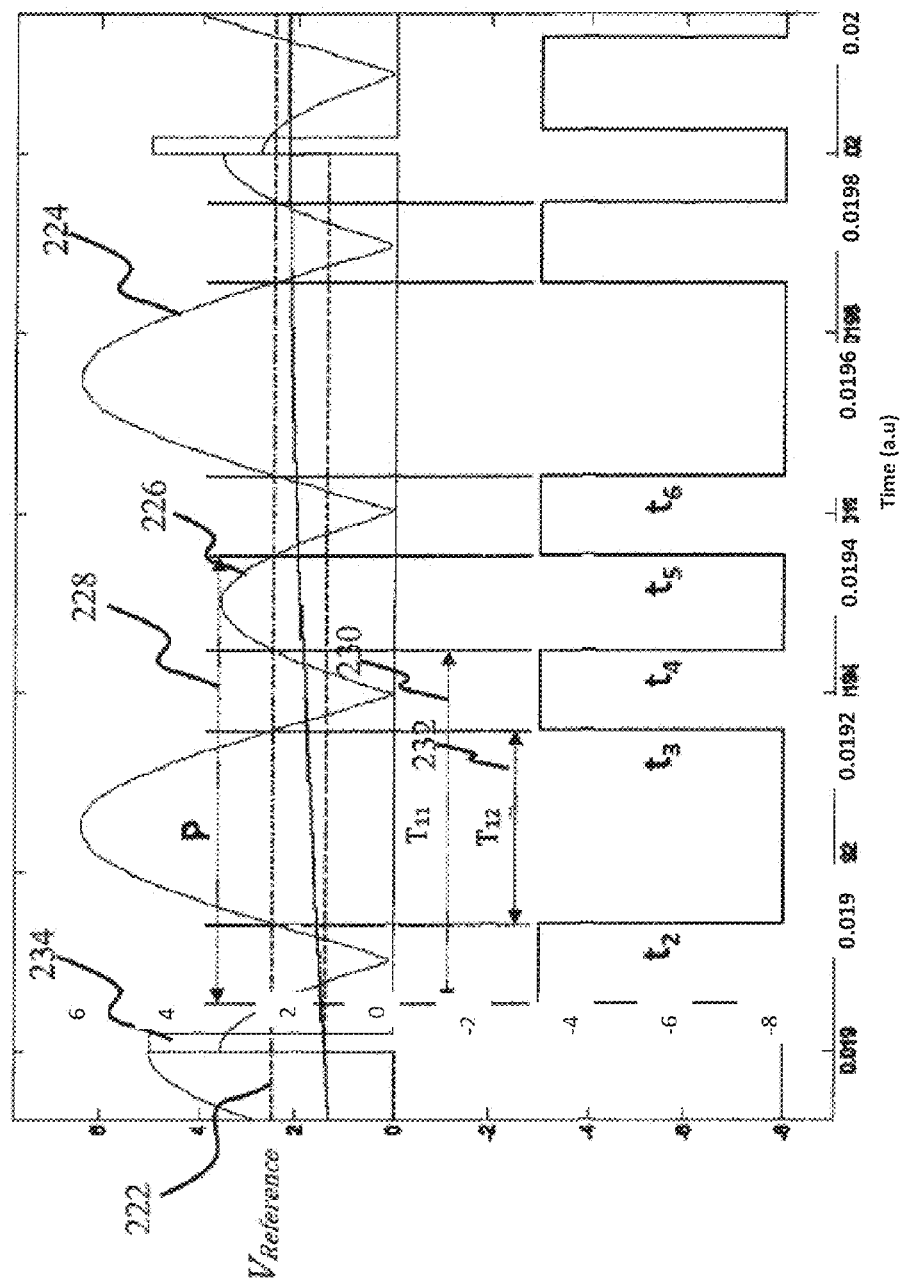
FIG. 2A is a plot illustrating an area of detail of the embodiment of the method shown in FIG. 2.

Various implementations of the invention utilize full-wave rectification. Full-wave rectification is the process of reflecting the negative going portion of a signal to corresponding positive-only values (i.e., the absolute value of a signal). This process is applied to the TDS ADC to halve the required number of signal comparisons, thereby reducing hardware for reference-crossing time discrimination. FIGS. 2 and 2A show graphs featuring a fully rectified wave. Both the reflected and positive waves cross the single reference level (222, $V_{Reference}$). From the portion of expanded detail (220 of FIG. 2), it can be seen that the timing parameters ($T_{11}$, $T_{12}$, $t_1$, $t_2$, $t_3$, $t_4$, $t_5$, $t_6$) are extracted by measuring the periods between reference level crossings for the rectified signal wave (224, 226 of FIG. 2A). In these embodiments, a single reference level may be used in place of two or more levels, given the increased number of potential level crossings. In one exemplary embodiment, the input signal may be estimated using:

$$V_{input} = V_{Reference}\left(\frac{\cos\left(\frac{\pi T_{11}}{P}\right) + \cos\left(\frac{\pi T_{12}}{P}\right)}{\cos\left(\frac{\pi T_{11}}{P}\right) - \cos\left(\frac{\pi T_{12}}{P}\right)}\right) \quad \text{(Eqn. 19)}$$

where: $V_{input}$ is the input voltage
P is the period of the oscillations of the carrier (228 of FIG. 2A)
$V_{Reference}$ is the magnitude of the reference voltage level (222 of FIGS. 2 and 2A)
$T_{11}$ and $T_{12}$ are the periods (230, 232) as defined in FIG. 2A

It should be noted, that Eqn. 19 is provided by way of example, and other independent estimates of the input voltage may be used including, but not limited to, those modified from Eqns. 5-18 using a single reference voltage. Further, a full-wave rectified system may use two or more reference levels to generate an increased number of independent signal level estimates (e.g. to increase measurement precision, implement average techniques, or execute noise compensation methods as discussed infra). A full-wave rectification based system also simplifies/reduces electronics requirements. This reduces associated noise contributions. Further, reference level drift effects may be reduced because of the reduced number of required reference levels. In the embodiment shown in the FIGS. 2 and 2A, a sample and hold command 234 is used to hold the amplitude of the rectified wave constant during the sampling period. This process is used to mitigate certain distortions in the waveform sampling process, as discussed below.

Distortion and Noise Compensation

In various implementations, output harmonic distortion is mitigated via the usage of a sample-and-hold (S/H) function. A S/H function dictates that a given sampling level persists for a minimum time interval rather than returning to a default level (e.g. zero level), or being treated a single point sample. The persistence of the sampling level creates a piece-wise constant output from a constantly varying input. In some variants, the minimum persistence time is tuned in reference to the sampling period. Alternatively, the persistence time may be based on other factors (such as a time constant related to the sampled signal, TDS carrier period, or a systemic noise component, etc.) Given a purely sinusoidal carrier signal, distortions can arise from processing timing data using certain TDS ADC algorithm equations (e.g., Eqn. 7) when the input modulation signal is not constant during a given sampling interval. The S/H operation creates a piecewise constant output from a given input signal and sampling clock (S/H is also referred to as a zero-order-hold, and/or a track-and-hold device). A number of implementations of the S/H enable the complete elimination of harmonic distortion products related to time-changing input modulation signals.

The time domain switching analog-to-digital conversion methodology described supra assumes pseudo-stationary (near DC) input signal $V_{input}$ (see Eqn. 2). In one implementation, in order to adapt the above methods to measurements of time varying input signals (that vary on time scales that are comparable to the carrier signal period), the time varying input signal is modeled as a linear change over one period P of the carrier signal as follows:

$$V(t) = A_c \cos(\omega_c t + \varphi_c) + \frac{dV_{AC_{Input}}(t)}{dt} t + V_{DC\_Input}, \quad \text{(Eqn. 20)}$$

where:
  V(t) is the modulated signal;
  $V_{DC\_input}$ is the DC component of the input signal that is to be measured;
  $V_{AC\_input}(t)$ is the time dependent (AC) component of the input signal that is to be measured;
  $\phi_c$ is the carrier signal phase with respect to the reference clock;
  $A_c$ is the carrier signal amplitude; and
  $\omega_c$ is the carrier signal radial frequency $\omega_c=2\pi f_c$.

Given a small time increment dt, the continuous Eqn. 20 is represented in a discrete form as follows:

$$V_i = A_{c_i} \cos(\omega_{c_i} t_i + \varphi_{c_i}) + \frac{dV_{AC\_Input_i}}{P}(t_i - t_{i-1}) + V_{DC\_Input}, \quad \text{(Eqn. 21)}$$

where:
  $t_i$, $t_{i-1}$ are successive discrete time instances, $t_i > t_{i-1}$;
  $V_i$ is the modulated signal at time $t_i$;
  $A_{ci}$ is the carrier signal amplitude at time $t_i$;
  $V_{DC\_input}$ is the DC component of the input signal;
  $V_{AC\_input\_i}$ is the time dependent (AC) component of the input signal time $t_i$;
  P is the carrier period;
  $\omega_{ci}$ is the carrier signal phase at time $t_i$.
  $\omega_{ci}$ is the carrier signal radial frequency at time $t_i$.

For time varying input signals the Eqns. 20 and 21 describe the change in total modulated signal V(t) due to input signal changes with time $V_{input}(t)$.

Figure 3:
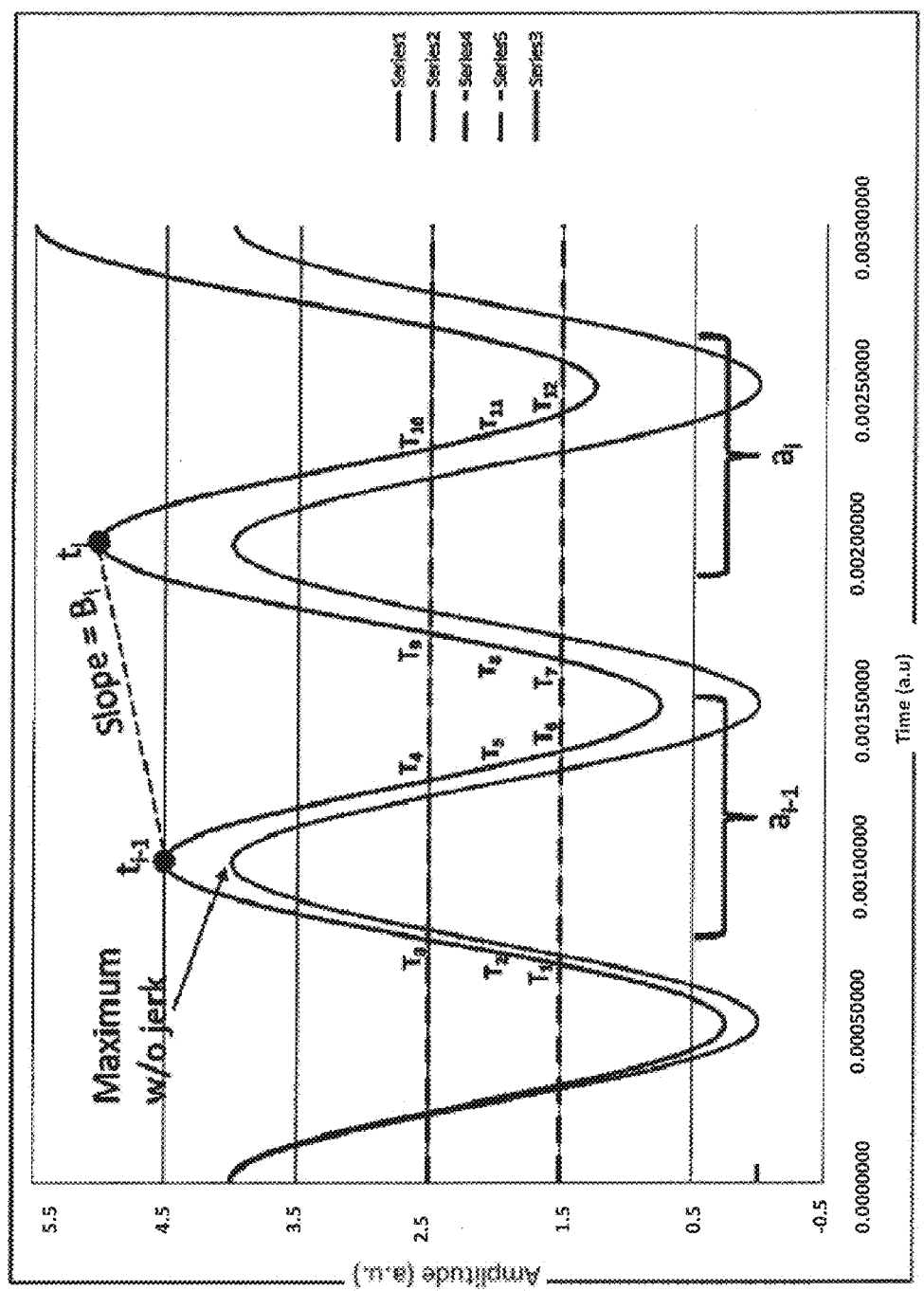
FIG. 3 is a plot illustrating one embodiment of a time-varying modulation signal waveform measurement according to the invention.

FIG. 3 illustrates one embodiment of time varying input signal measurement method using the discrete Eqn. 21. Green trace is the carrier signal for comparison only. The blue signal is the modulated signal showing a time varying input signal. The effect is to "skew" the time periods so the more general Eqn. 21 must be used to solve (or the sample-and-hold circuit with Eqns. 5 and 6).

In another embodiment of the invention, the time varying input signals are accurately measured using a sample-and-hold circuit combined with the Eqns. 5 and 6. The purpose of the sample-and-hold block is to create a quasi-DC level between successive ADC samples such that Eqns. 5 and 6 hold true. Provided that the input signal does not change substantially between any two successive samples (e.g. over a time interval $\Delta t = t_i - t_{i-1}$). Note, solving Eqns. 20 and 21 does not require a sample-and-hold circuit.

Figure 3A:
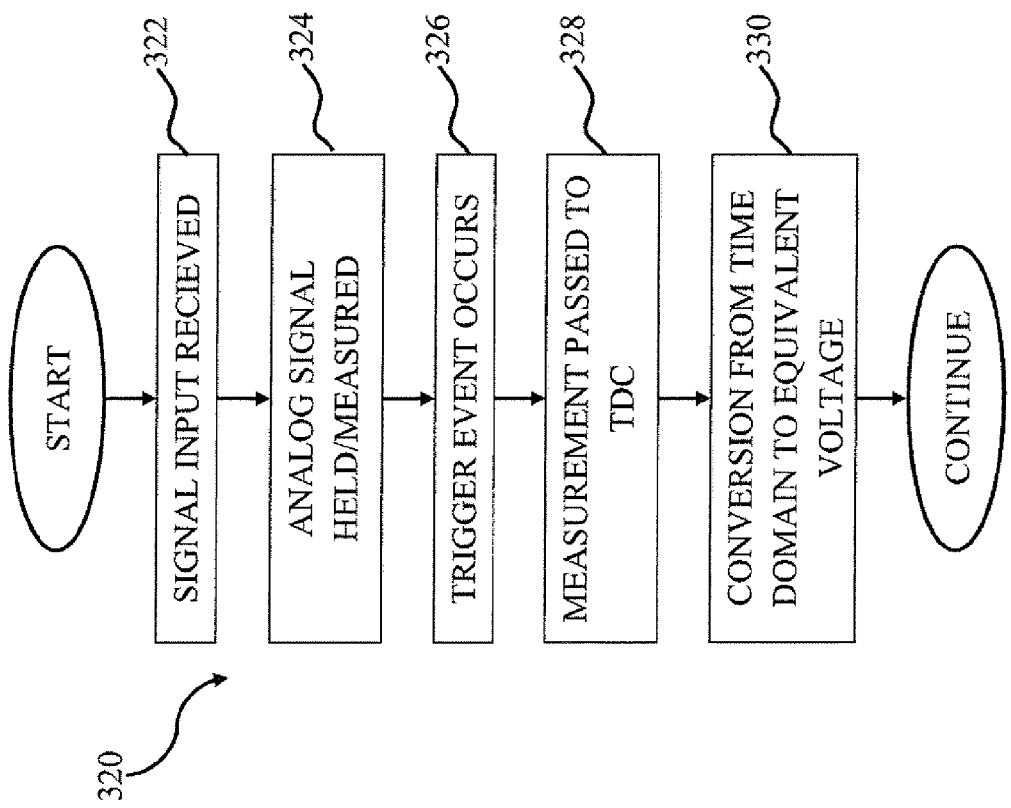
FIG. 3A is logical flow diagram illustrating one embodiment of a generalized method of applying a sample hold technique to a TDS ADC consistent with the present invention.

Referring now to FIG. 3A, one embodiment of a generalized method 320 for the implementation of a S/H technique is shown. At step 322, an analog signal including the input signal modulated by the carrier is received at the S/H circuit. At step 324, a trigger event occurs (e.g. a reference voltage level crossing, etc.). Upon occurrence of the trigger event, the analog signal level is measured (step 326), and the measurement waveform is held at the measurement level form the persistence time (e.g. until another sample is taken, portion of the carrier period, etc.) of the S/H circuit (step 326). The measurement waveform is then passed to other TDC circuits for further analysis (step 328). Once the TDC output is obtained, the timing values are converted from the time domain in to the voltage level equivalents using the known values of the reference levels and carrier frequency. The generalized method 320 may be applied using, for example, with the exemplary circuit 370 of FIG. 3E, infra.

Figure 3C:
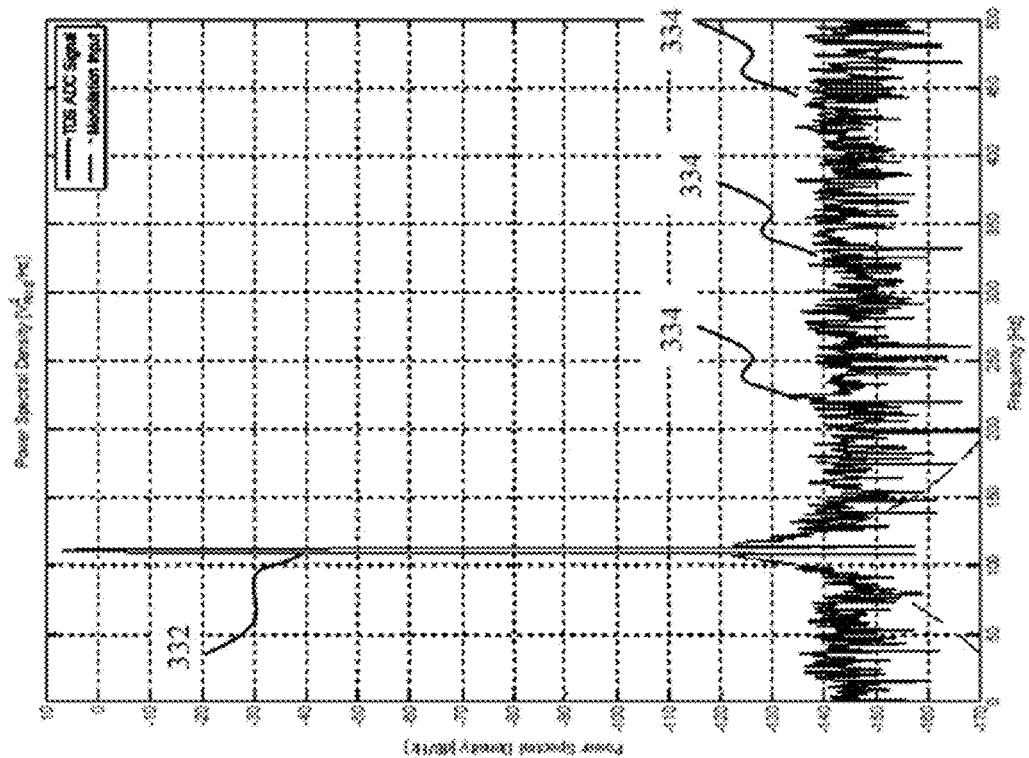
FIG. 3C is a plot illustrating simulation results of an exemplary TDS ADC measurement method utilizing a sample-and-hold according to the invention.
Figure 3B:
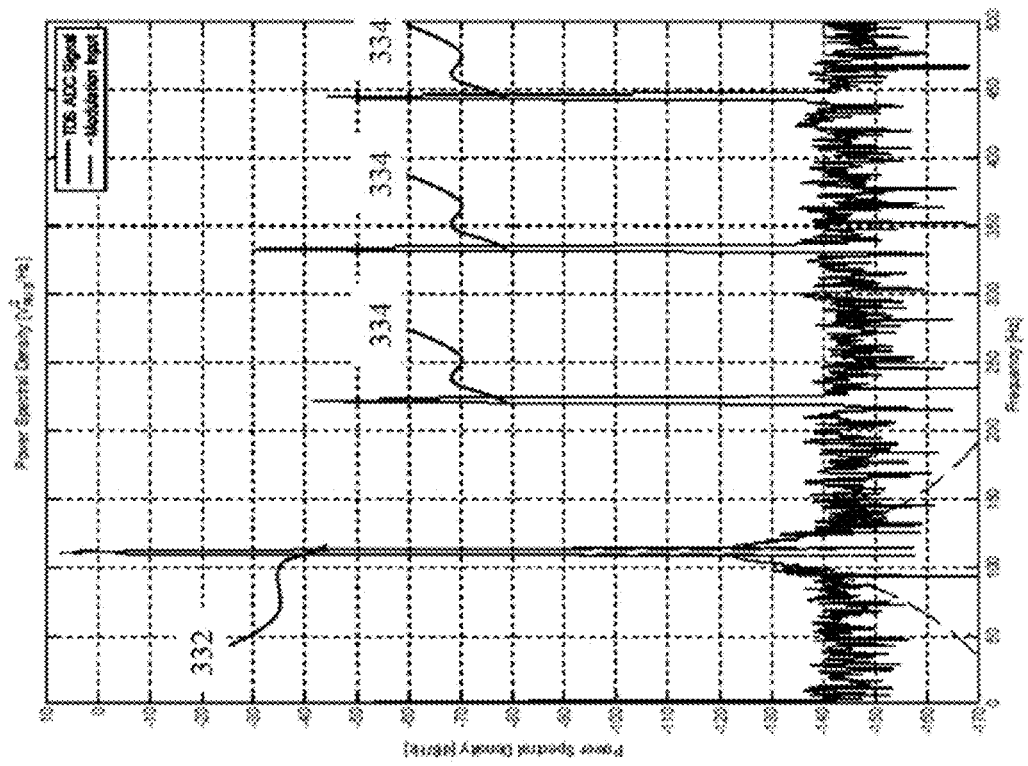
FIG. 3B is a plot illustrating simulation results of an exemplary TDS ADC measurement method not utilizing a sample-and-hold according to the invention.

Referring now to FIGS. 3B and 3C, the efficacy of the exemplary embodiment of the sample-and-hold technique 320 is shown. FIG. 3B shows a simulation in which S/H techniques are not implemented. Both the input signal 332 and harmonics 334 are present in the output signal. In the simulation results shown in FIG. 3C, the method 320 is implemented and the harmonics 334 are completely suppressed while the input signal 332 is still present.

Figure 3D:
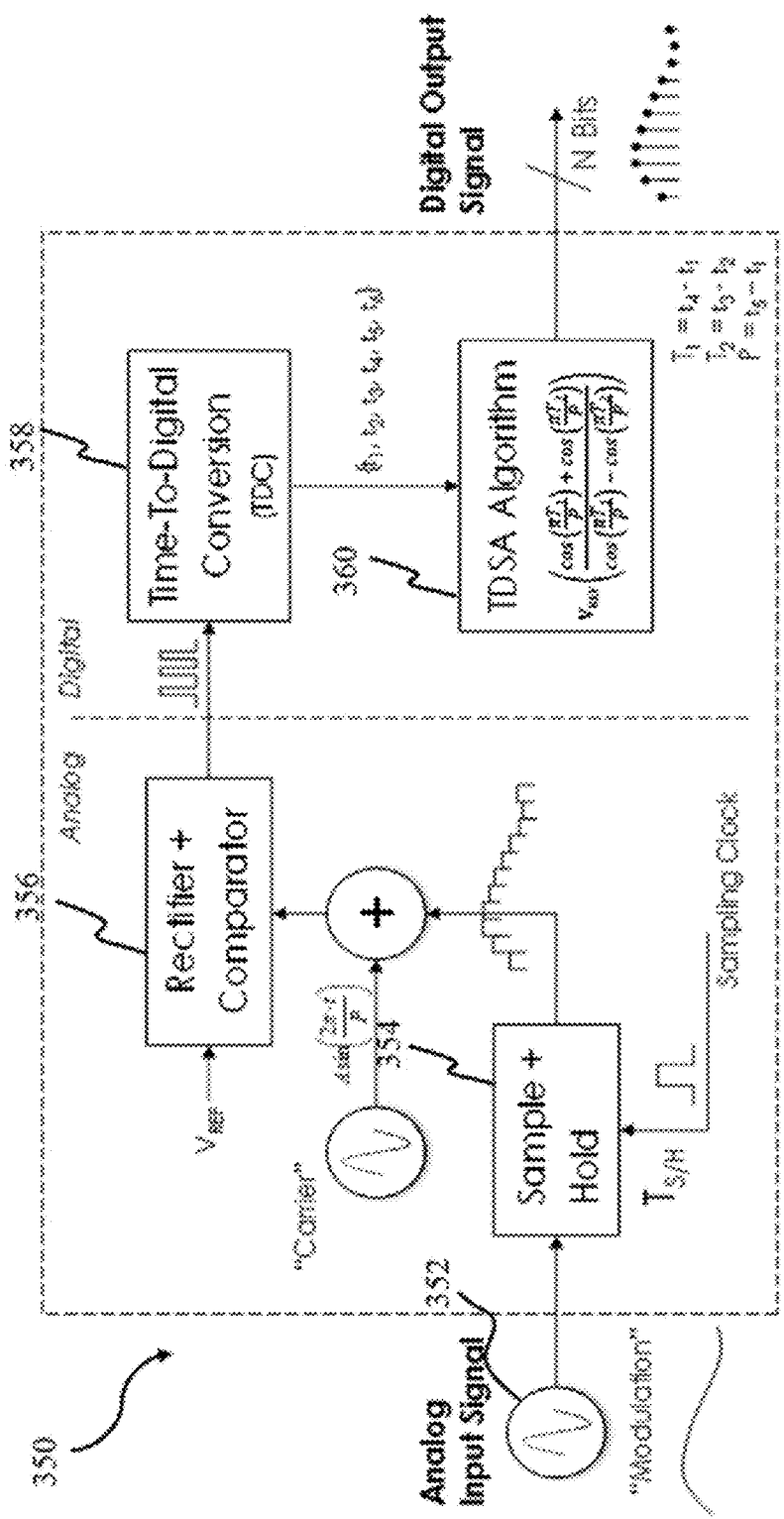
FIG. 3D is a block diagram depicting configuration of a sample-and-hold waveform-rectifying TDS ADC consistent with one embodiment of the invention.

Another embodiment 350 of the TDS ADC is shown in FIG. 3D. An external analog signal 350 is provided to the system 350. A sample-and-hold device 354 is applied to the input signal resulting in a piecewise constant value to be held for fixed intervals having twice the period of the carrier signal. A sinusoidal carrier signal synchronized (for convenience) with the sampling intervals is summed with the sampled input signal. The result is a full waveform that is rectified and compared to a fixed reference level to produce digital timing pulses using the rectifier/comparator block 356. The pulses are received by a time-to-digital conversion device 358 (e.g., ACAM Messelectronic gmbh, Friedrich-List-Strasse 4, 76297 Stutensee-Blankenloch, Germany; part number: GP21) and transformed to an equivalent set of digital time values ($t_1$, $t_2$, $t_3$, $t_4$, $t_5$, $t_6$); the measured time series is processed using the TDS ADC algorithm element 360 represented by Eqn. 19 to produce an output digital value. In this case, the algorithm is implemented in software, and the output values are floating-point numbers.

Figure 3E:
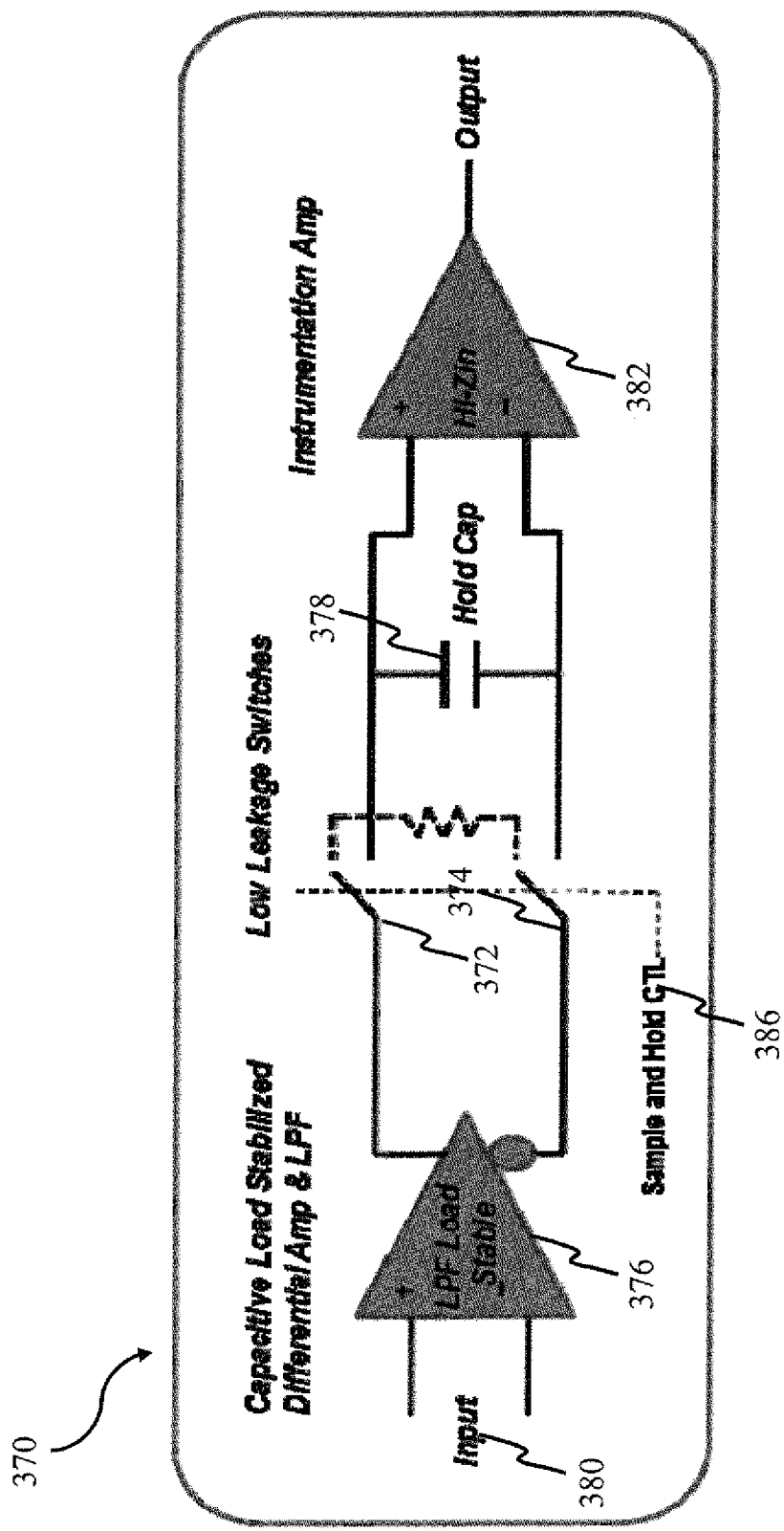
FIG. 3E is a functional block diagram illustrating an exemplary sample-and-hold circuit consistent with the present invention.

The high signal fidelity of the S/H device ensures a maximal signal-to-noise and low distortion transformation. Referring to FIG. 3E, an exemplary S/H circuit 370 is shown. The S/H circuit shown in FIG. 3E may be used for example with the exemplary method 320 of FIG. 3A, discussed supra, or others.

With both switches (372 and 374) closed (the switches are depicted in the open position in FIG. 3E), the differential amplifier 376 drives the hold capacitor 378 load differentially. The input signal 380 is tracked with minimal distortion and added noise due to the differential amplifier and hold capacitor. The instrumentation amplifier 382 transfers the capacitor's charge with little or no voltage droop distortion to the circuit's low impedance output drive.

With both switches (372 and 374) open, the charge on the hold capacitor 378 is maintained due to its high dissipation factor, and the high impedance input of the instrumentation amplifier. The held charge on the capacitor is continuously transferred by the instrumentation amplifier to the output drive (again, with little or no voltage droop).

In an exemplary embodiment, the switches (372 and 374) are opened and closed by the S/H control device 386 to create a frequency chopped signal. The chopped signal result is integrated using the hold capacitor, resulting in a differential summing of the signal.

Figure 3F:
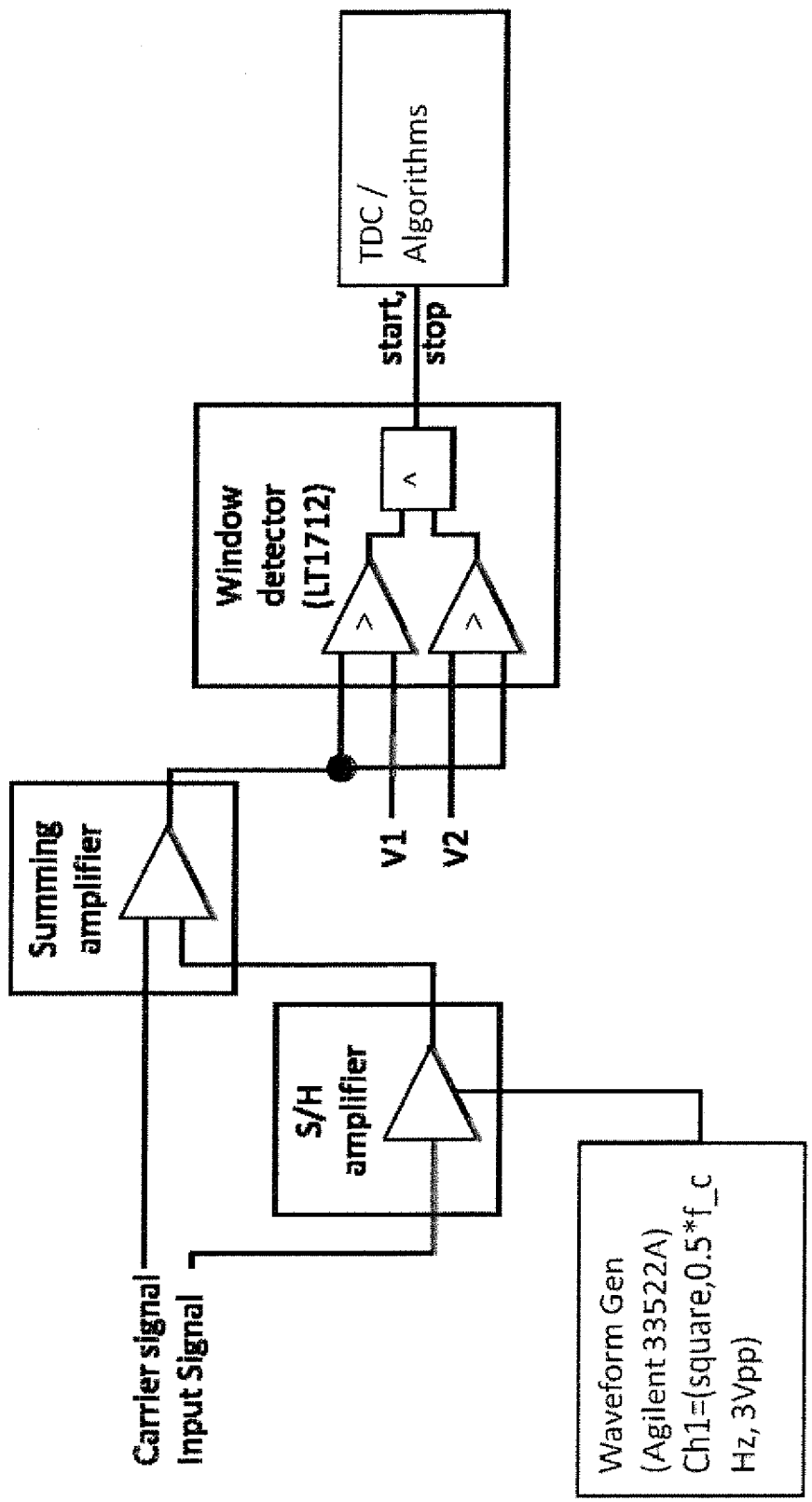
FIG. 3F is an electrical diagram of the TDS ADC embodiment of FIG. 3D according to the invention.

FIG. 3F shows an electrical diagram of the TDS ADC apparatus embodiment shown and described with respect to FIG. 3D.

Figure 3G:
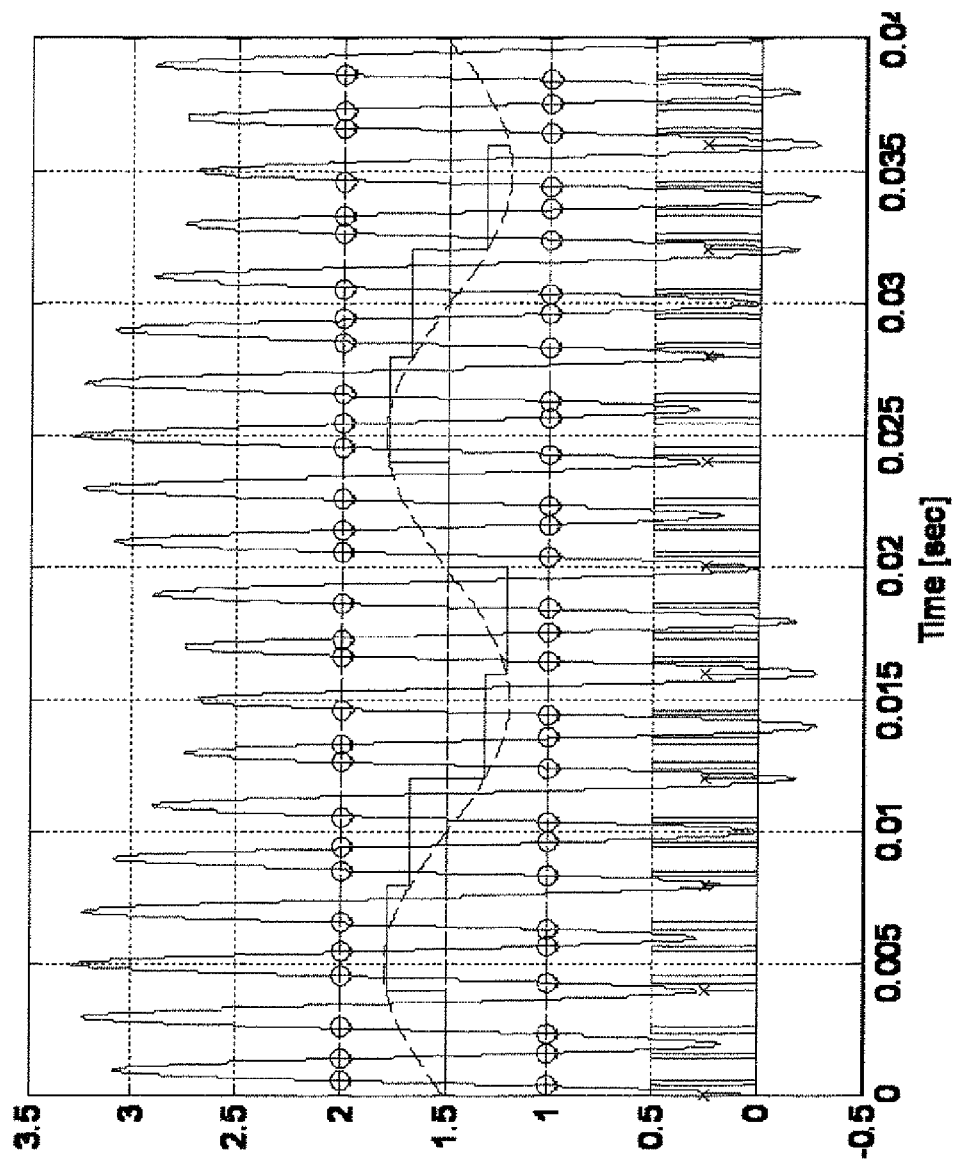
FIG. 3G is a plot illustrating simulation results of TDS ADC measurement method of time varying input signals utilizing sample-and-hold according to the invention.

FIG. 3G presents data related to TDS ADC simulation that utilized the sample-and-hold method to create a quasi-static DC modulation signal every oscillation cycle. The data in FIG. 3G are obtained as follows: modulation (20% of amplitude at 50 Hz), carrier signal: 1.5V peak, 1.5V DC, frequency 500 Hz). The signal samples are computed every-other carrier period, corresponding to a dual reference level ADC configuration, such as described in FIG. 1B, supra.

In one variant, two sample-and-hold circuits are implemented one for the positive and another for the negative oscillation cycles, thereby doubling the sampling rate of the TDS ADC.

The S/H technique may be used to address distortions arising from the measured signal, or in the measurement itself. However, other distortions may arise from the carrier waveform itself. Any undesired distortion of the carrier will result in a corresponding distortion of the calculated signal. With the elimination of algorithmic distortion, distortion from the carrier can be eliminated using a polynomial compensation with specific coefficients related to the distortion of the carrier. For example, the corrected signal V' is related to the distorted value V by:

$$V' = V - a_1 V^2 - a_2 V^3 - a_3 V^4 - a_4 V^5 \ldots - a_n V^{n+1} \qquad \text{(Eqn. 22)}$$

The correction coefficients can be estimated from a measurement of the carrier distortion. Carrier distortion and correction coefficients may be initially set and calibrated, or the carrier distortion may be monitored during the lifetime of the device to periodically correct for change in carrier distortion over time. Further, the correction coefficients are related in a deterministic way to carrier amplitude. As the carrier amplitude is monitored, the coefficients can be updated accordingly. The carrier amplitude can be calculated (for example) as:

$$A = \frac{2V}{\cos\left(\frac{3\pi t}{P}\right) - \cos\left(\frac{4\pi t}{P}\right)} \qquad \text{(Eqn. 23)}$$

Let R represent the change in carrier amplitude from initial amplitude $A_0$:

$$R = \frac{A_0}{A} \qquad \text{(Eqn. 24)}$$

The first three harmonics of the carrier may be compensated in the measured input signal value by including a relation of R in the correction equation. As one example, to correct for three harmonics of the carrier, and taking into account change in carrier amplitude:

$$V' = V - (Ra_1 + 2Ra_3 - 2R^2 a_3 - a_3^2/a_1)V^2 - a_2 V^3 - a_3 V^4 \qquad \text{(Eqn. 25)}$$

To correct for four harmonics of the carrier, the following correction equation may be used:

$$V' = V - (Ra_1 + 2Ra_3 - 2R^2 a_3 - a_3^2/a_1)V^2 - (R^2 a_2 + 2R^2 a_4 - 2R^3 a_4 - a_4^2/a_2)V^3 - a_3 V^4 - a_4 V^5 \qquad \text{(Eqn. 26)}$$

As long as the distortion of the carrier (number and size of carrier harmonics) is known, the resulting distortion of the calculated signal may be corrected.

Figure 4:
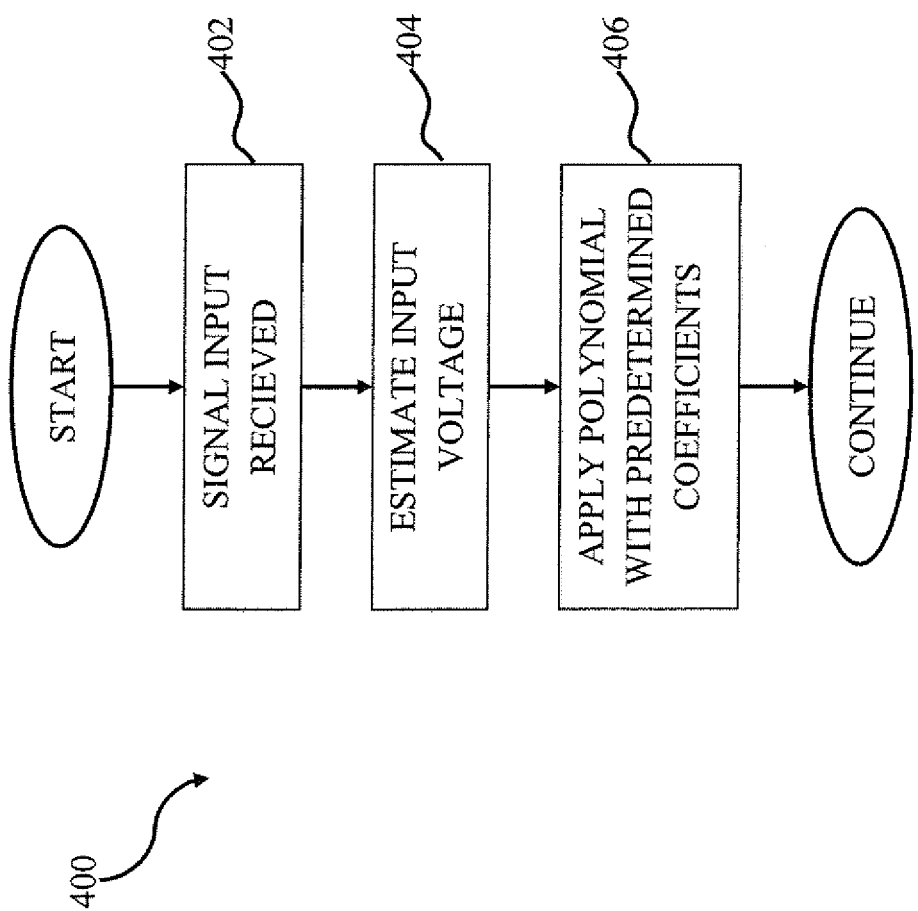
FIG. 4 is logical flow diagram illustrating one embodiment of a generalized method of applying a polynomial correction to a TDS ADC measurement according to the present invention.

Referring now to FIG. 4, one embodiment of a generalized method 400 for carrier distortion compensation is illustrated. At step 402, a modulated signal is received at the input. An estimate of the time varying amplitude is made, and in-turn this is used to estimate input voltage (step 404, i.e. the input signal without the carrier addition). The time-variance in the carrier component that is added to the signal may give rise to harmonic distortions in the process of estimation of the input voltage. This is in contrast to the sample-and-hold method 320, which accounts for distortions arising from the time variance in the input voltage itself or its measurement. Thus, at step 406, a polynomial expression of the carrier wave with predetermined correction coefficients (see Eqn. 26) is applied to the measured signal mitigating the effect of the harmonic components of the carrier.

Figure 4A:
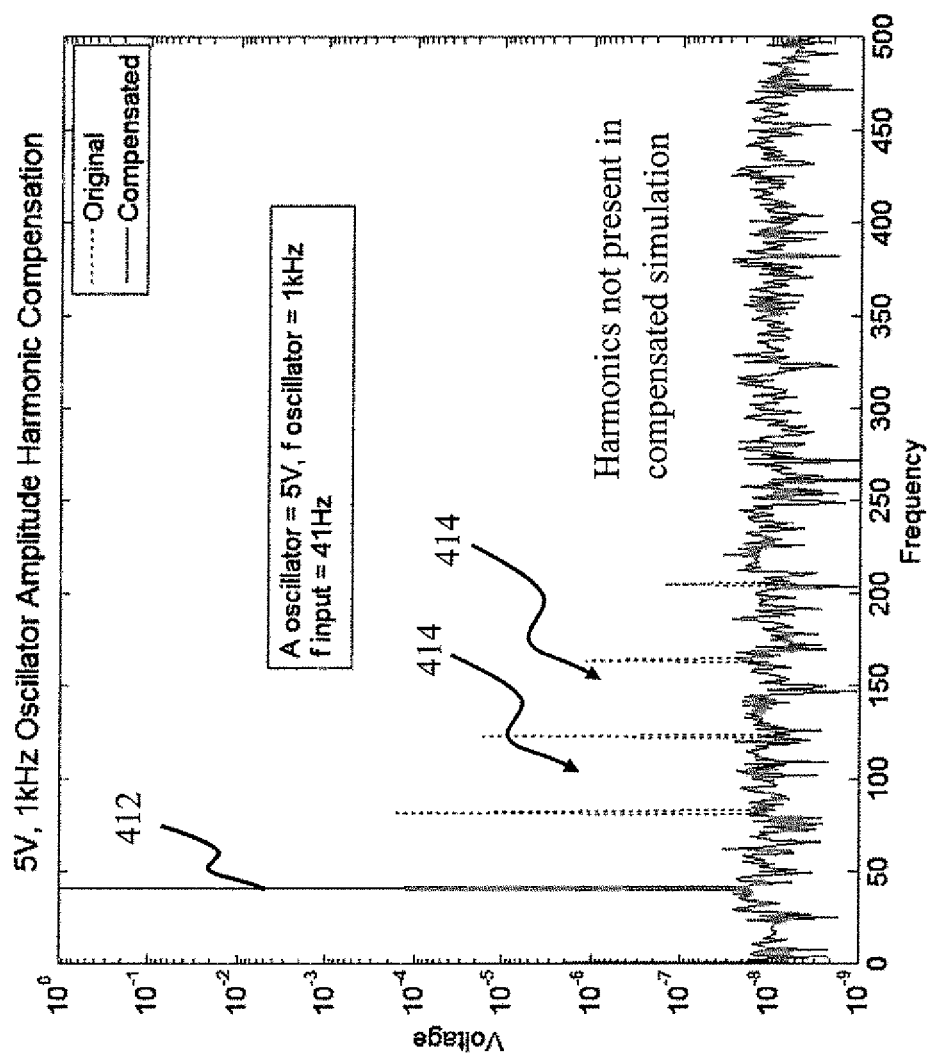
FIG. 4A is a plot illustrating simulation results demonstrating the effect of an exemplary TDS ADC measurement method utilizing a polynomial correction with a single carrier input according to the invention.
Figure 4B:
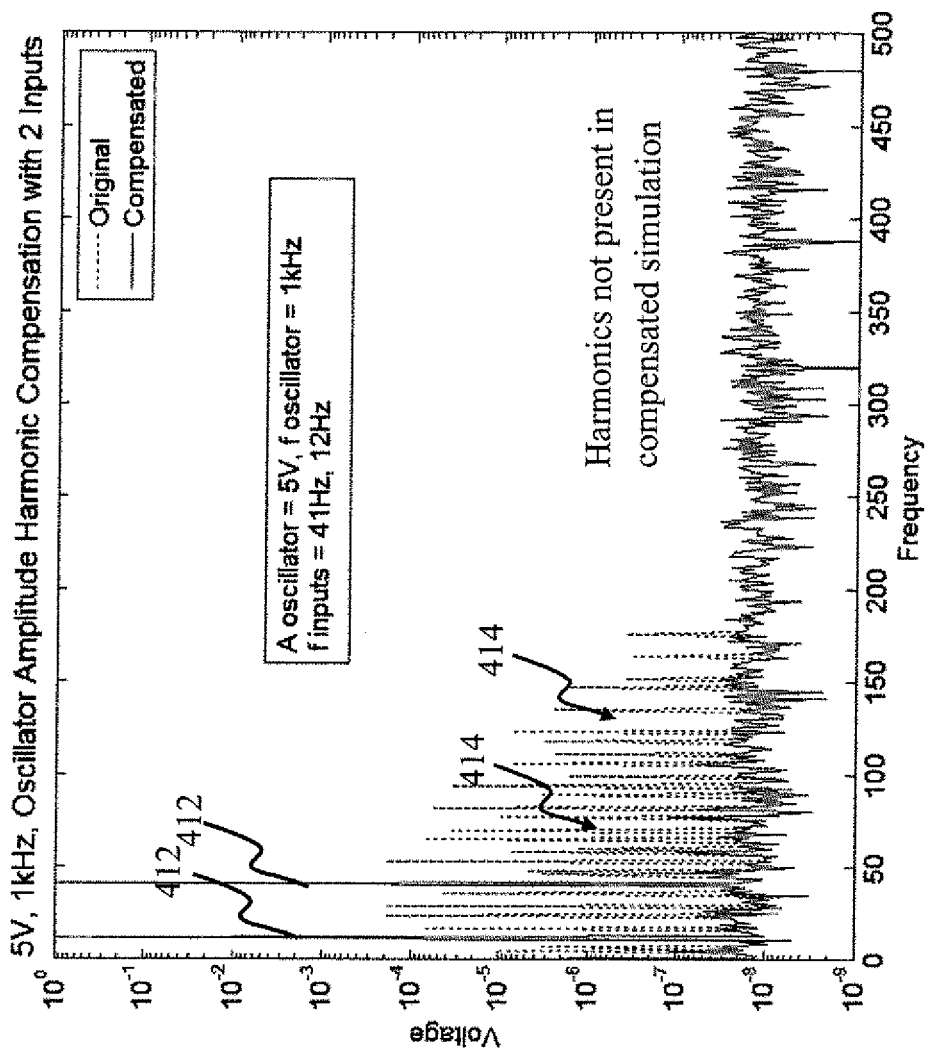
FIGS. 4B and 4C are plots illustrating simulation results demonstrating the effects of exemplary TDS ADC measurement methods utilizing polynomial corrections with multiple carrier inputs according to the invention.
Figure 4C:
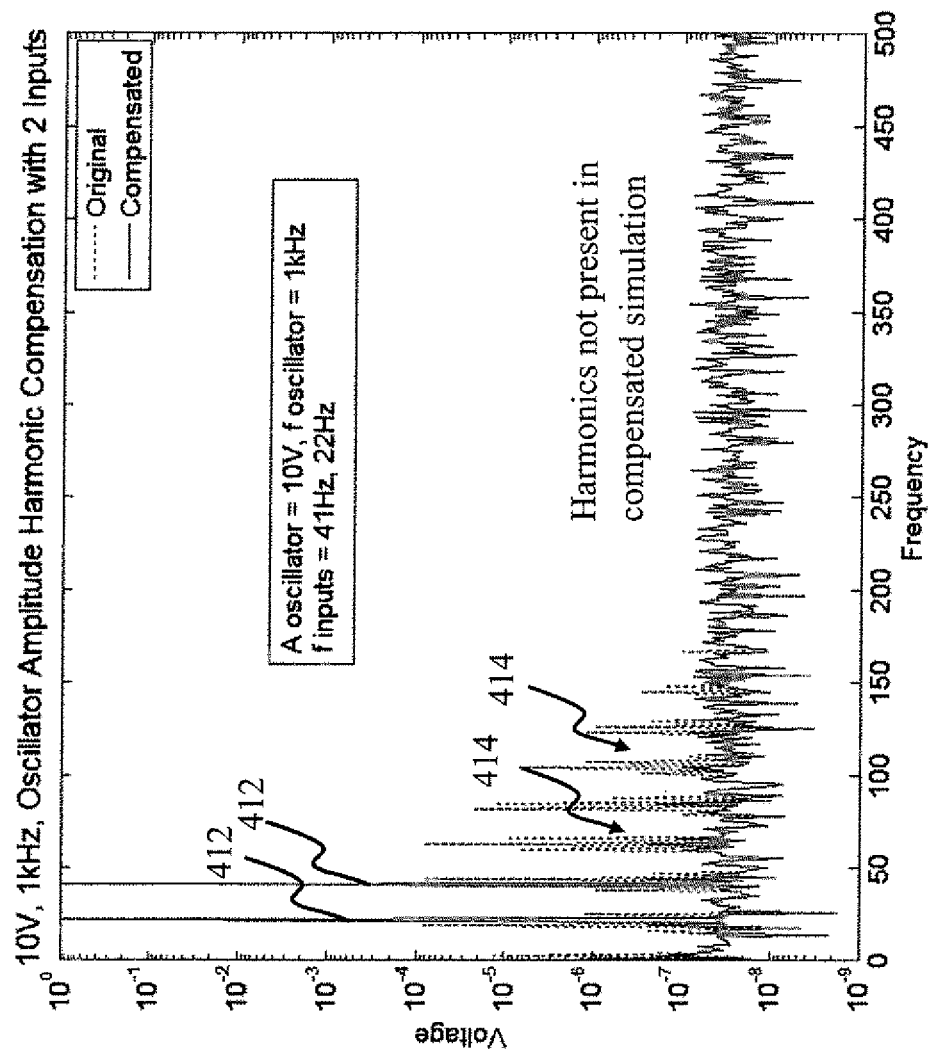

Exemplary results of this method of distortion correction is shown in FIGS. 4A-4C. FIG. 4A shows two simulated outputs one without correction of distortion and one with correction of the distortion arising from a carrier with a single input frequency. In both simulated outputs, the carrier signal input contribution 412 is present. However, the harmonics 414 are present in the original output, but are not visible in the compensated output. FIGS. 4B and 4C show paired data sets demonstrating distortion correction with multiple input carrier frequencies (multiple peaks 412), and with change in carrier amplitude.

In some implementations, methods 320 and 400 may be combined resulting in an estimate with compensation for both input/measurement distortions and carrier waveform distortions.

The resolution of the analog to digital conversion is related to the spectral purity and noise characteristics of the carrier. Uncertainty in the frequency of the carrier (e.g., from spectral and noise components) causes a reduction in the precision at which the parameters used in the estimate of the input signal amplitude is based. One way to reduce this factor is to bandpass filter the carrier, a process which attenuates frequency components outside the predetermined passed bandwidth of a filter. Generally, the pass-band of the filter is selected to overlap with the center frequency of the carrier. Band-pass filtering reduces the amplitude (and thus the distortion contribution) of frequency components that deviate from the fundamental frequency of the carrier.

Figure 5:
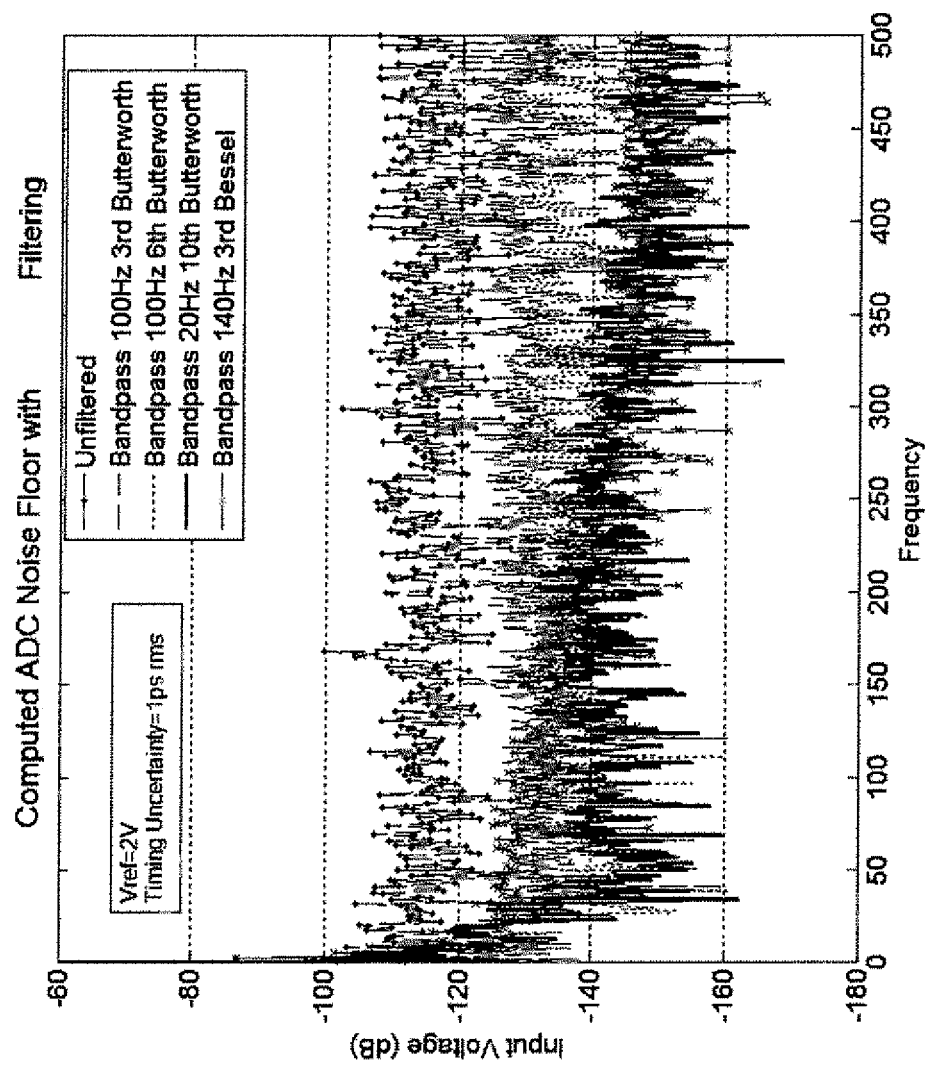
FIG. 5 is a plot illustrating simulation results of exemplary TDS ADC measurement methods utilizing carrier waveform filtering according to the invention.

FIG. 5 illustrates simulated reductions in measured input signal amplitude resolution in systems implementing band-pass filtering. The calculated input signal was simulated using measured carrier input noise as an input to the simulation. Digital filtering was applied to the carrier input.

Multiple input signals may be implemented by adding each input signal to a common carrier waveform. The input signals added to the common carrier may be e.g., time, phase, or frequency multiplexed. Alternatively, multiple-phase or frequency shifted carriers may be used. Each input signal/carrier combination may each be measured with a separate ADC, or time interleaved with a single ADC device.

Measurement accuracy of a signal can benefit from the use of multiple ADC channels. For example, multiple simultaneously measured carriers combined with the input signal, each channel measuring a carrier of different phase. Alternatively, multiple phase-shifted instances of the input signal may be added to a common carrier. The multiple ADC channels enable differential signal techniques, as well as carrier noise subtraction. Multiple ADC channels also allows additional averaging, improving the measurement accuracy of certain types of input signals.

Figure 6:
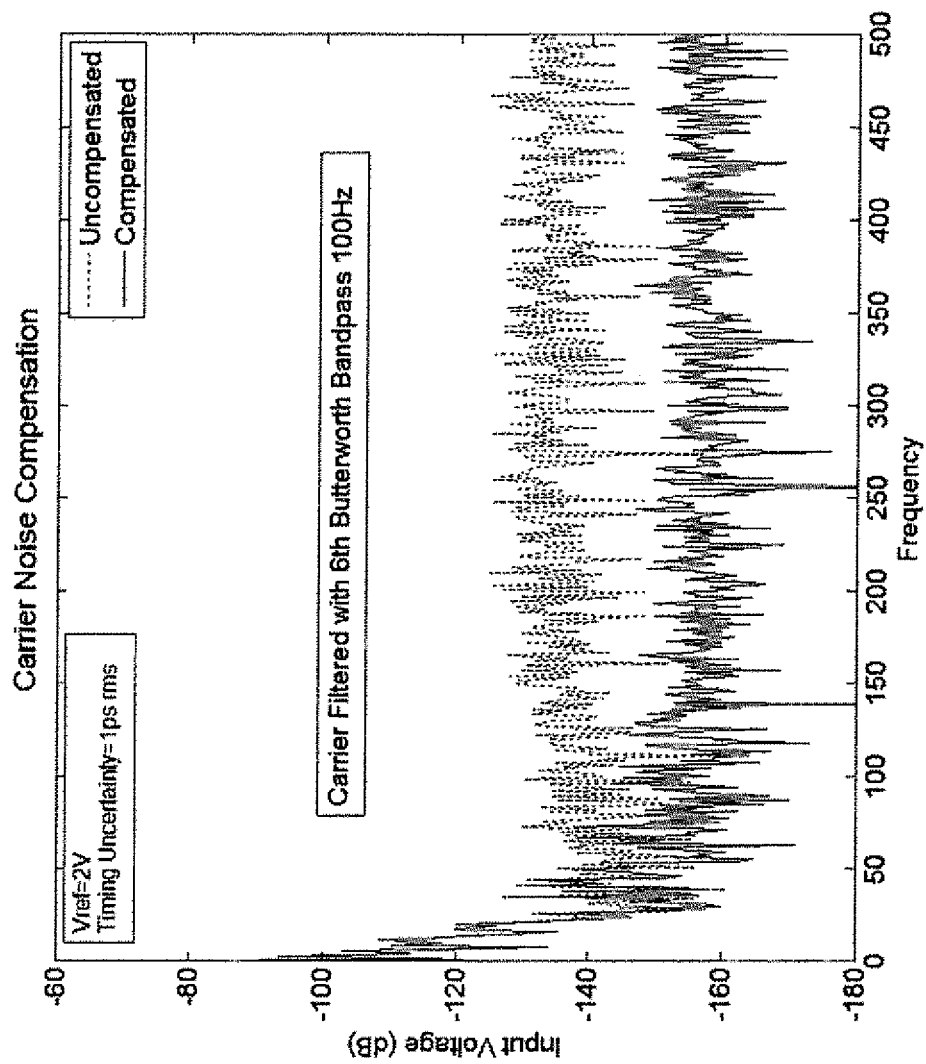
FIG. 6 is a plot illustrating simulation results of an exemplary TDS ADC measurement method utilizing differential signal noise compensation according to the invention.

The effect of carrier noise on conversion resolution can be reduced by implementing two or more simultaneous ADC measurement channels. In an exemplary embodiment, a measurement of time intervals generated by the input signal plus the carrier is measured on one channel, while a second channel is used to measure the same carrier without an input signal. Measured uncertainty in time intervals in both ADC channels may be correlated to the common mode noise from the carrier. Once quantified, this uncertainty component may be removed. The conversion resolution improvement for an exemplary simulated system is shown in FIG. 6. In this case, an actual carrier waveform was sampled and used as the basis for the simulated results. For this example, the benefits of carrier uncertainty subtraction are seen clearly in conjunction with appropriate pre-filtering of the carrier waveform.

Figure 6A:
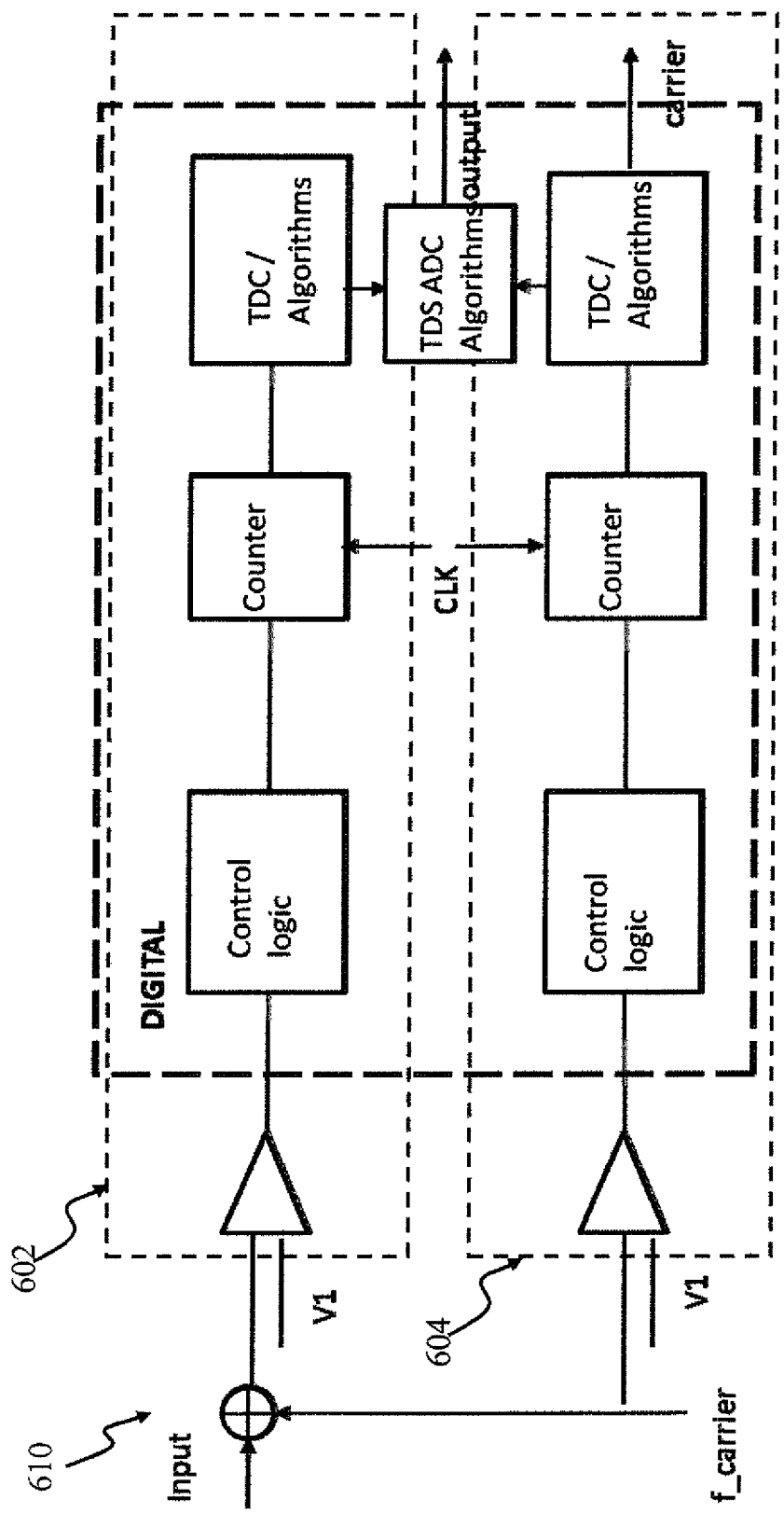
FIG. 6A is a block diagram depicting configuration of a two channel single reference level time domain switching ADC comprising independent carrier measurement according to one embodiment of the invention.

FIG. 6A presents one embodiment of the TDS ADC that is configured to provide measurements of the carrier frequency and amplitude simultaneously and independently from the input signal measurements. The ADC apparatus of FIG. 6A comprises two ADC blocks 602 and 604 (such as the ADC block 123 shown in FIG. 1B, supra). The ADC block 602 is configured to receive and measure the summed modulated signal while the block 604 is configured to receive the carrier signal only. The ADC apparatus 610 further comprises a TDS ADC processing block that implements common mode noise estimation and rejection and input signal estimation algorithms (such as, for example, according to Eqns. 5 and 6). The ADC configuration, such as shown in FIG. 6A, advantageously provides a convenient means to measure the period and amplitude of the carrier which is used in both Eqns. 5 and 6.

Figure 6B:
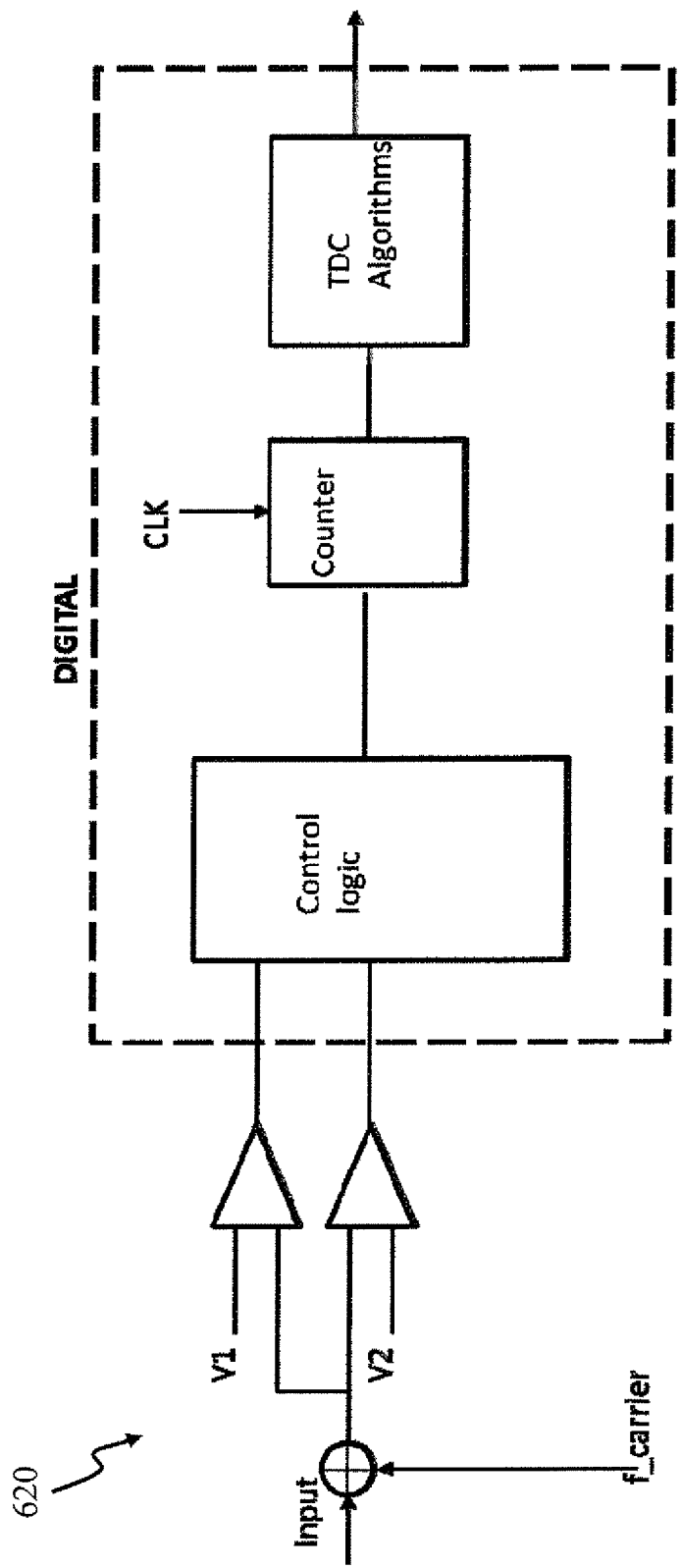
FIG. 6B is a block diagram depicting configuration of a single channel two reference level time domain switching ADC according to one embodiment of the invention.

FIG. 6B illustrates a block diagram of one exemplary embodiment of the time domain analog to digital conversion apparatus that used two reference signal levels. The apparatus 121 of FIG. 1B comprises a combining circuit that combines the input signal with the carrier. The summed modulated signal is fed to a bank of comparators (or window detectors as shown in FIG. 1E, supra) Each comparator compares the received modulated signal V(t) to the respective reference signal (e.g., $V_1$, $V_2$). As discussed above, the reference levels $V_1$ and $V_2$, ideally should be stable and can be set to any value that is convenient provided it is within the voltage range of the summed modulated signal. The control logic block receives comparator output and generates respective trigger events (such as the trigger events, 110, 112, described with respect to FIG. 1C, supra). In response to the trigger events, the control logic starts/stops counter block, configured to estimate duration of the time intervals $T_1$ and $T_2$ using the input clock. The output of the counter block is fed to the time to digital converter that provides digital representation of the time interval between successive trigger pulses.

Figure 6C:
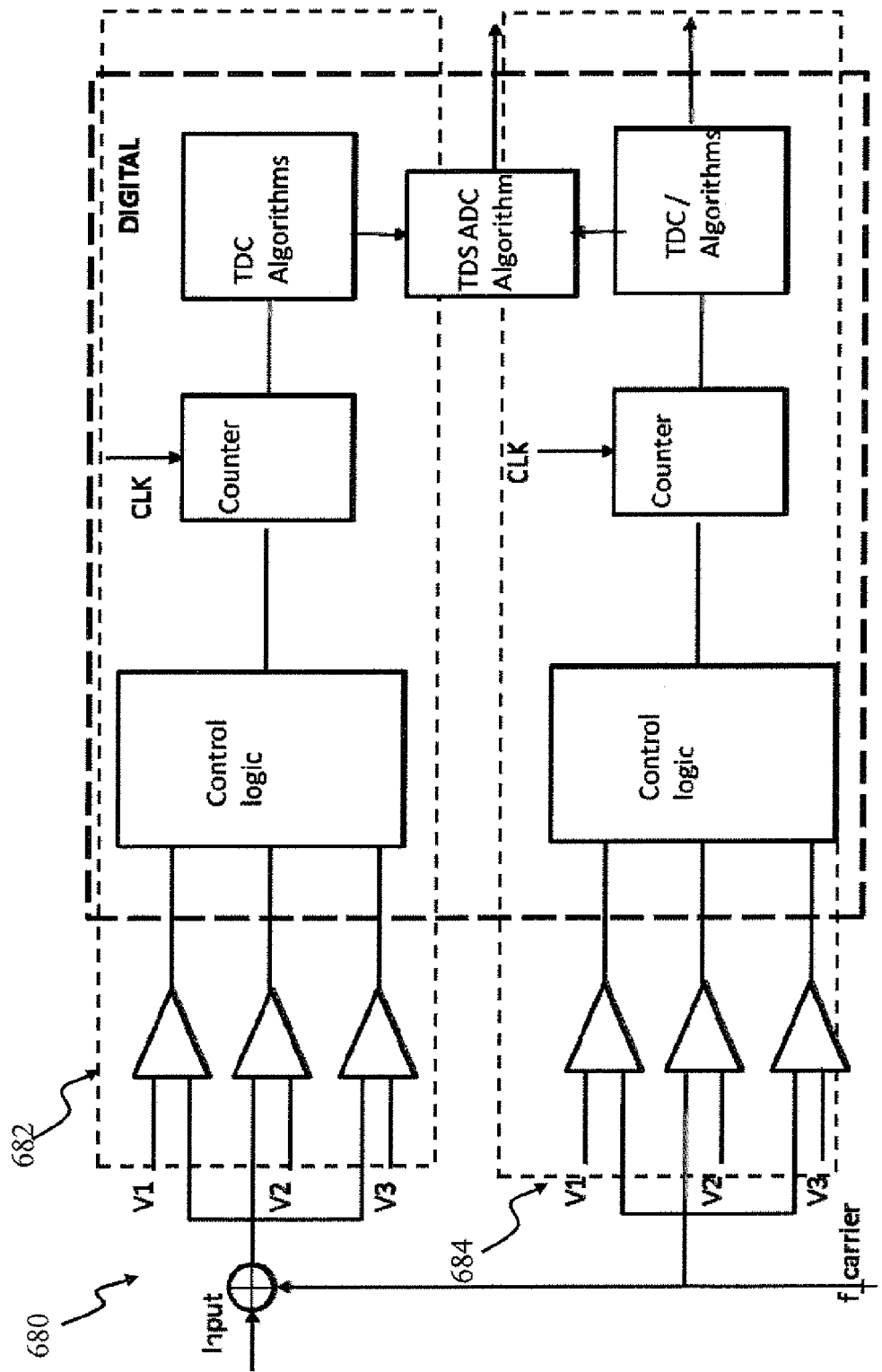
FIG. 6C is a block diagram depicting configuration of a three reference level time domain switching ADC comprising independent carrier measurement according to one embodiment of the invention.

FIG. 6C presents one embodiment of the TDS ADC that is configured to provide measurements of the carrier frequency and amplitude simultaneously and independently from the input signal measurements. The ADC apparatus 680 comprises two ADC blocks 682 and 684. The ADC block 682 is configured to receive and measure the summed modulated signal while the block 684 is configured to receive the carrier signal only. The ADC apparatus 680 further comprises a TDSA processing block that implements common mode noise estimation and rejection algorithms. The ADC embodiment of FIG. 6C advantageously allows calculation for both positive and negative cycles of the carrier using Eqns. 5 and 6 as described above. Although it is also possible to measure both positive and negative modulation signal cycles using only two references, due to symmetry of the modulation oscillations and the reference signal configuration, three references are desirable. Such configuration is advantageous in order to be able to accurately measure the slope on each side of the modulated signal to predict a velocity and acceleration term (assuming the y-axis is displacement instead of a voltage) thus enabling measurements of rapidly changing input signals more accurately.

The ADC configuration, such as shown in FIG. 6C, advantageously enables common mode noise estimation (and compensation) by comparing the time intervals of the carrier (e.g., measured with the ADC block 684) with that of the modulated carrier (measured with the ADC block 682). Because both ADC blocks 682, 684 use the same signal references, the common-mode noise can be estimated and removed. Furthermore, the ADC configuration of FIG. 6C advantageously provides a convenient means to measure the period and amplitude of the carrier which is used in both Eqns. 5 and 6.

Figure 7:
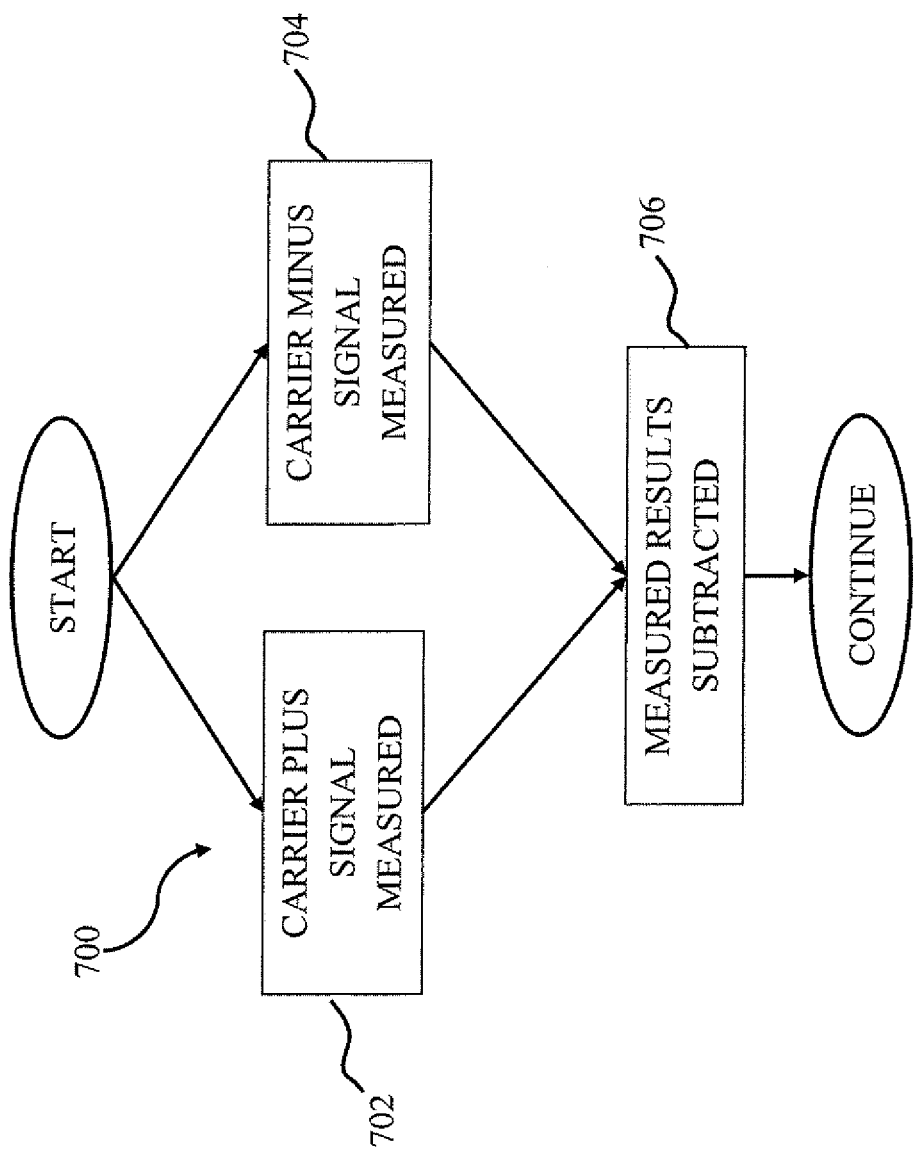
FIG. 7 is logical flow diagram illustrating one embodiment of a generalized method of utilizing differential modulated signal measurement in a TDS ADC consistent with the present invention.
Figure 7A:
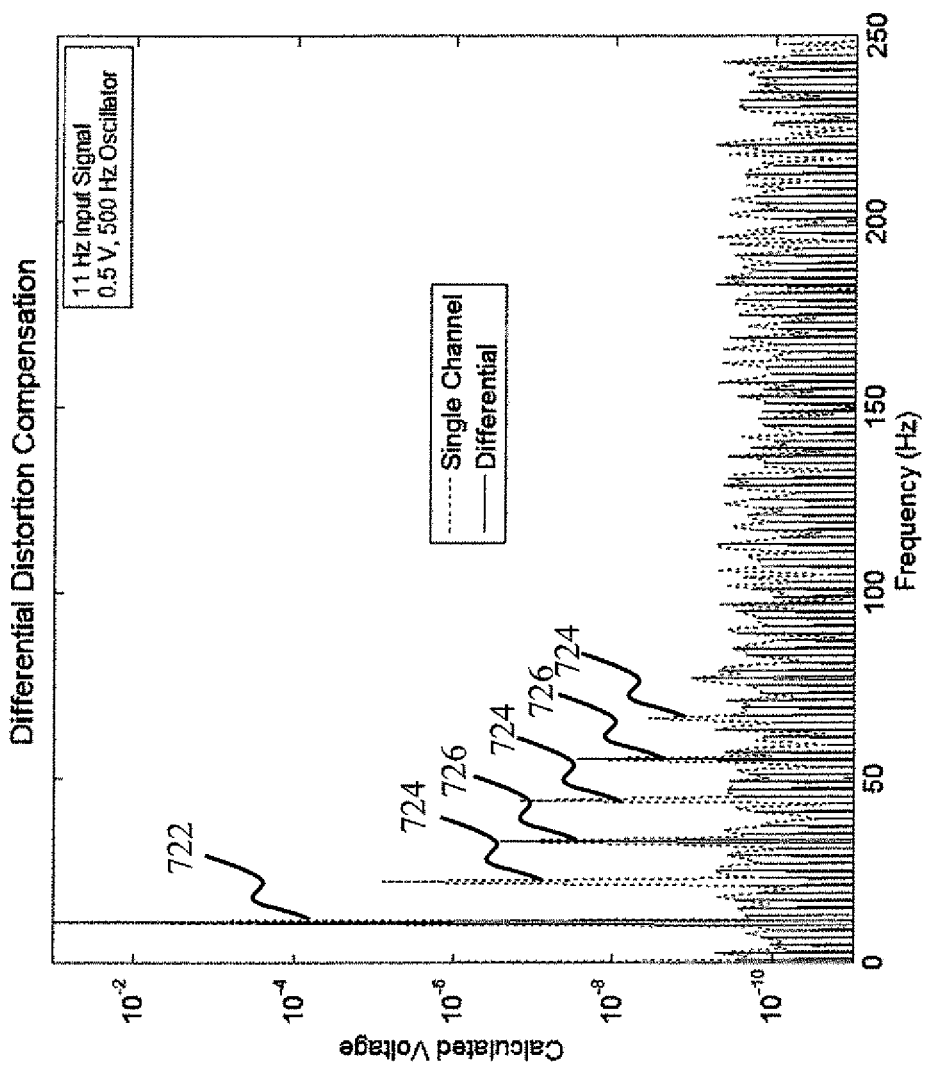
FIG. 7A is a plot illustrating simulation results of an exemplary TDS ADC measurement method utilizing differential ADC skew compensation according to the invention.

Various other implementations rely on other types of two-channel measurement. Referring now to FIG. 7, an exemplary differential signal technique 700 is shown. At step 702, on a first channel, time intervals (i.e. the periods between reference level crossings) of the carrier plus the input waveform are measured. At parallel step 704, time intervals corresponding to the carrier minus the input waveform are measured on a second channel. The results are then subtracted from one another producing an estimate of twice the signal input level (step 706). In some variants, the results are subtracted after to estimating the input signal level. In other variants, the results are subtracted prior to estimating the input signal level. Referring now to FIG. 7A, the effect of the method 700 is illustrated. This method 700 has been shown through simulations to preserve the signal input 722 and eliminate all even harmonies 724, and therefore a significant portion of the resulting harmonic distortion. However, the odd harmonics remain 726.

Figure 7B:
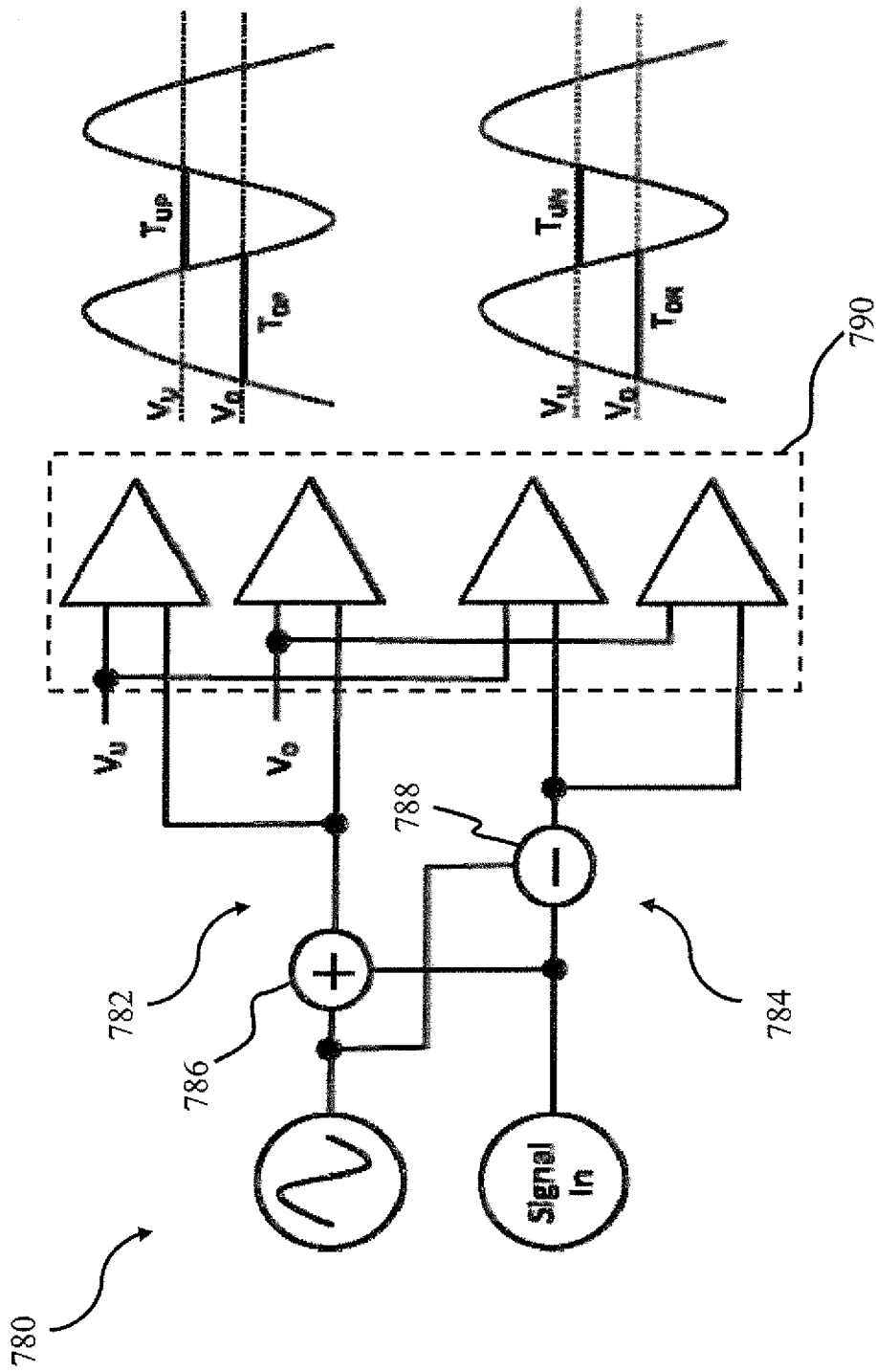
FIG. 7B is a functional block diagram illustrating a differential measurement TDS ADC according to one embodiment of the present invention.

Referring to FIG. 7B, the functional block diagram illustrates a wiring pattern for an exemplary embodiment 780 of a differential measurement circuit. In this embodiment, the carrier and signal are divided into two parallel paths (782 and 784). One path uses a voltage adder 786, and the other uses a voltage subtractor 788. The modulated waveforms are then input into TDS ADCs 790, independently measured, and the outputs of the two paths are compared. Other differential schemes involving two or more channels, and various combinations of input signal and carrier, may further reduce harmonic distortion without requiring curve fitting or a sample-and-hold.

Figure 7C:
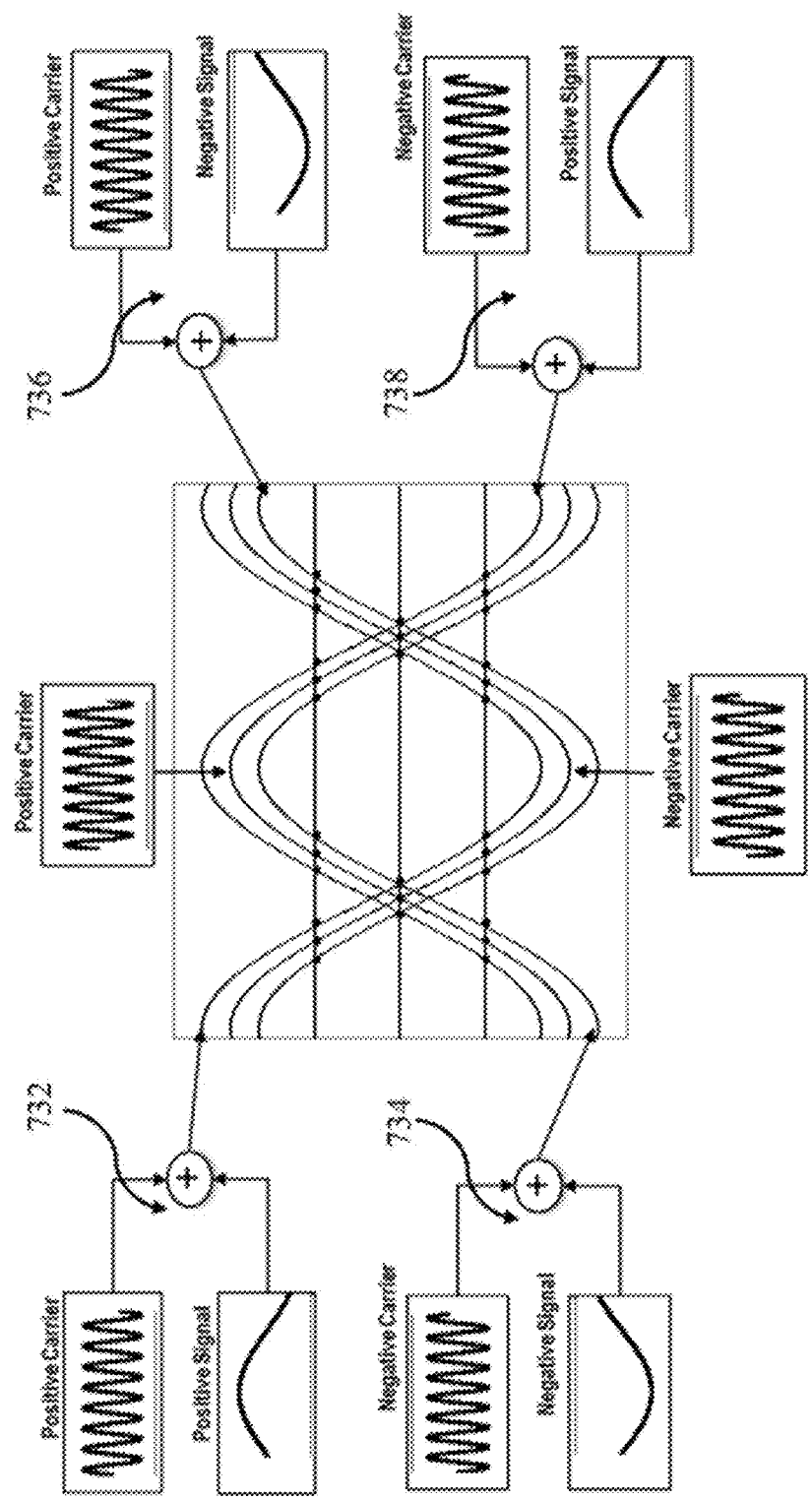
FIG. 7C is functional block diagram illustrating various exemplary signal and carrier combinations for differential signal measurement consistent with the present invention.

In some variants, other differential signal/carrier combinations are used. In these cases, a positive or negative (amplitude inverted) input signal is mixed with a positive or negative carrier waveform. This creates four possibilities (732, 734, 736, 738) which are illustrated in FIG. 7C. These different combinations produce varying independent time event measurements that may be used in the method 700 to mitigate distortions arising at various stages of the ADC process (e.g. sampling, measurement, carrier wave effects, etc.).

Figure 7D:
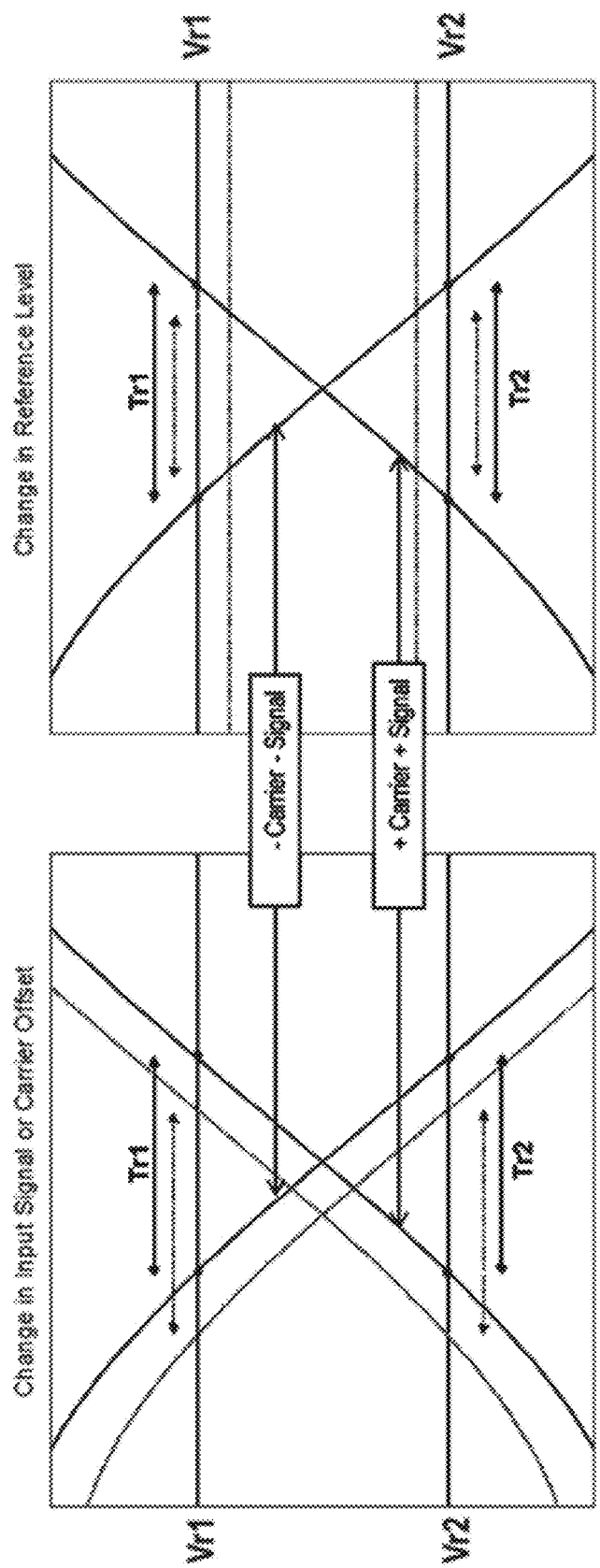
FIG. 7D is plot detailing the effect of various distortion components on various exemplary embodiments of the present invention.

Referring now to FIG. 7D, the plots illustrate an exemplary process by which differential signal techniques may be used to indicate situations of reference level drift. Differential techniques (e.g. the process 700 of FIG. 7) distinguish between a shift in carrier or signal offset and reference level drift. The differential measurement is insensitive to changes in carrier or signal offset (i.e. the timing values change in the same way for positive/positive modulated input and negative/negative modulated input). However, the timing values shift by differing amounts (for the various differential combinations) for reference level drift. Comparing these shifts may be used to indicate reference level drift.

Some embodiments of the present invention implement averaging methods. Exemplary averaging techniques include for instance: (i) one that combines data points produced by the TDS ADC algorithms, (ii) another that involves averaging the timing intervals prior to the application of the signal estimation algorithm, and (iii) a technique based on multiple reference levels.

Combining the points produced by the TDS ADC involves making multiple estimates of the signal level (e.g. on a repeating/constant signal or many measurements in parallel on a single signal), and then averaging the results.

Averaging the timing intervals involves moving the averaging step earlier in the process, rather than waiting until the estimate is complete. The multiple measurement of the interval themselves are averaged, and a estimate of the signal input is made from the average timing interval value. In this case, the average may also be based on multiple parallel measurements of the same signal, and/or multiple serial measurements of a repeating/constant signal. It should be noted that, in some cases, signal that is time variant on a scale much larger than the sampling rate may treated as a constant signal.

Multiple reference levels allow for multiple calculations of the input signal to be performed, using time intervals with uncorrelated noise. As the number of reference levels increase, the number of measurements, and thus the number of averages, increases. In the case of multiple reference levels, the measurement accuracy is improved by some increase in circuit complexity. However, the complexity must be weighed against benefits in the form of the ability to implement multiple averages without reducing system bandwidth.

Figure 8:
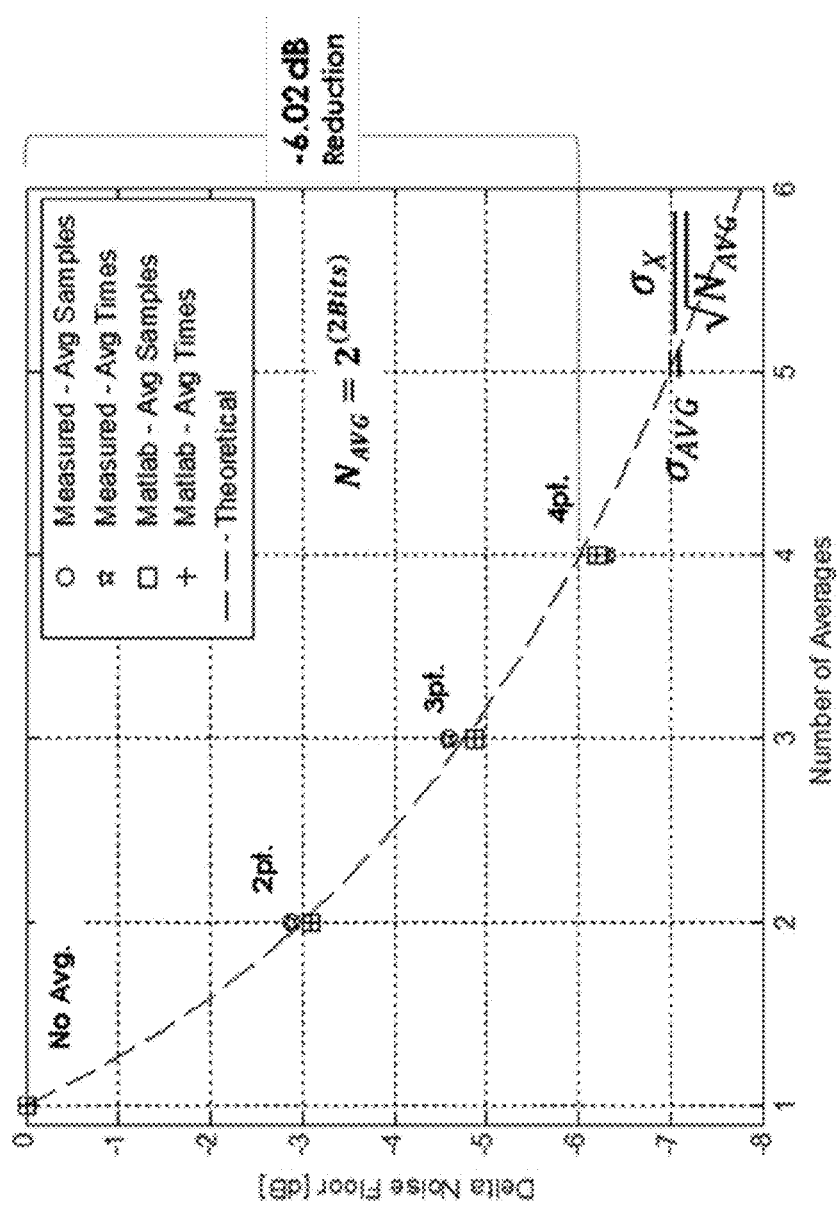
FIG. 8 is a plot showing effects on noise levels of various exemplary TDS ADC averaging techniques based on making multiple uncorrelated measurements of timing intervals consistent with the present invention.
Figure 8A:
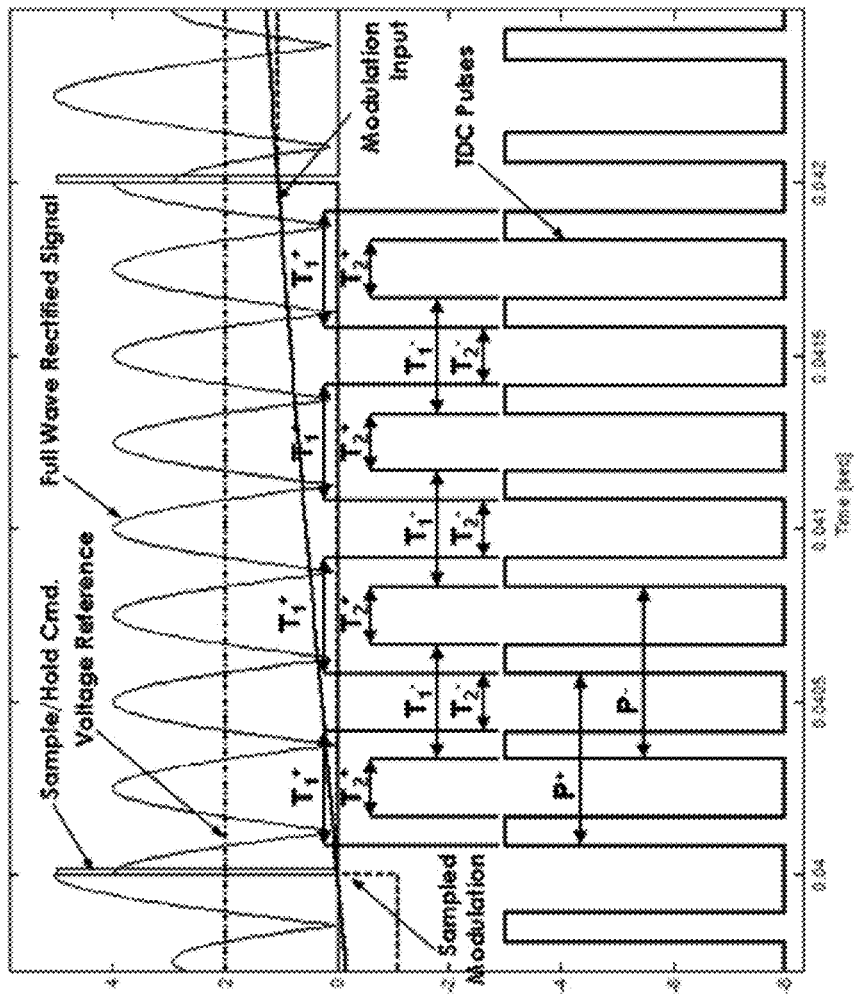
FIG. 8A is a plot illustrating an exemplary averaging method based on doubling the sampling period of a TDS ADC consistent with the present invention.

FIG. 8 is a graph showing noise level improvements using averaging techniques based on making multiple uncorrelated measurements of timing intervals. The graph shows that the improvement in the noise level approaches its theoretical limit. Another averaging technique, illustrated in FIG. 8A, is based on increasing the sampling period. This allows for an increased number of points to average. However, it increases the duration of the smallest feature that may be sampled by the system. Thus, this is equivalent to reducing the system bandwidth. More generally, the sampling period may be adjusted in relation to the carrier period. The sampling period may be compressed into a half cycle of the carrier. This may be used to increase averaging points. In other implementations this half cycle measurement may also be used to reduce the power-on time of the system, which reduces resource consumption.

Figure 8B:
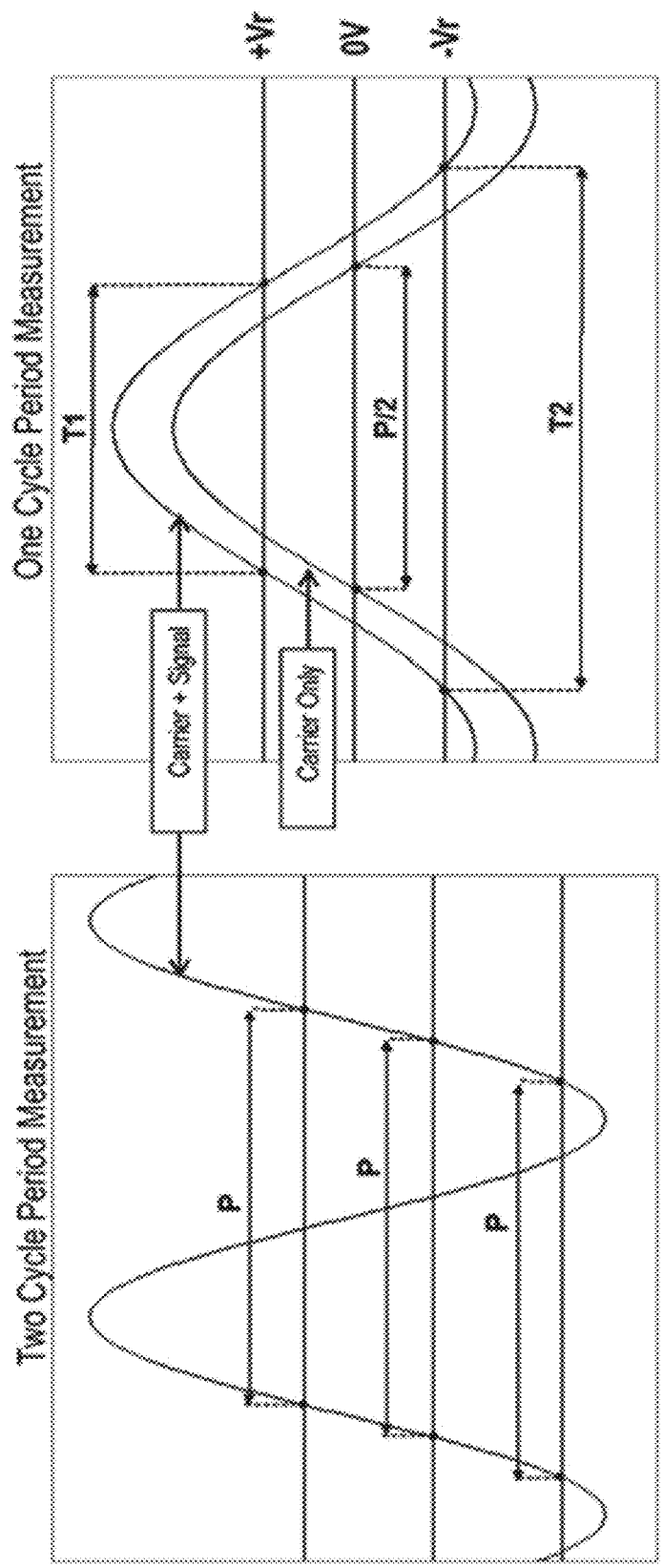
FIG. 8B is plot illustrating exemplary methods for altering the sampling period of a TDS ADC consistent with present invention.

Referring now to FIG. 8B, an exemplary embodiment of a sampling method using a shorter measurement period is shown. Such embodiments allow for increased measurement bandwidth compared with other compensation methods because no filtering or band-limiting circuitry is required. Power savings may be achieved with power cycling between measurements because the increased system bandwidth allows for shorter measurement cycles. Alternatively, these shorter cycles may be used to measure of the timing parameters over even shorter time intervals (e.g. half period measurement) to increase the sampling frequency. In addition, the reduced noise experienced by the system may be leveraged to achieve increased resolution.

Curve Fitting

Various implementations of the invention utilize curve fitting techniques. Various ones of these techniques are used to achieve reductions in algorithmic distortion, improvements input estimation accuracy, and/or estimates of the input level at any point in time. Such curve fitting techniques include, but are not limited to, Levenberg-Marquardt estimation, Nelder-Mead Simplex analysis, and polynomial curve fitting techniques.

Figure 9:
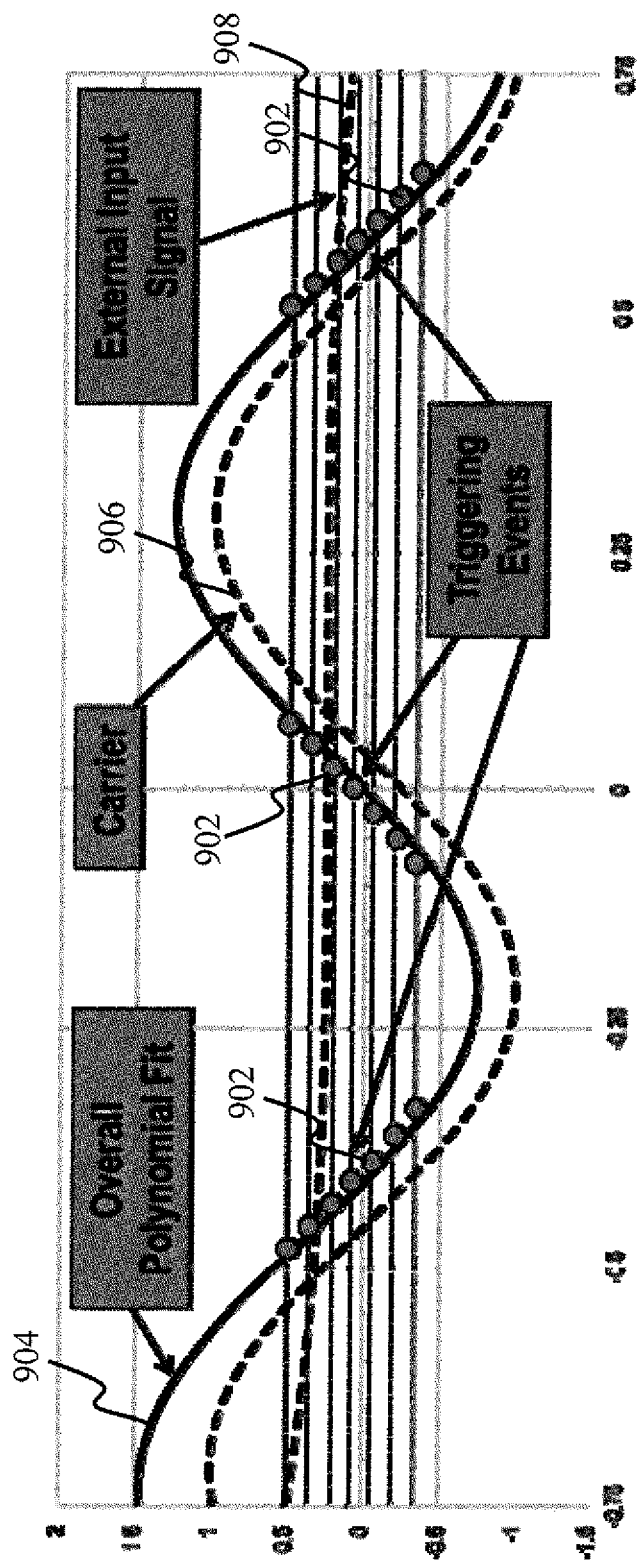
FIG. 9 is plot illustrating an exemplary embodiment of a method for implementing curve fitting in a TDS ADC according to the present invention.

By way of example, a polynomial fitting process is described as follows. In this case, the carrier is a sinusoidal waveform, and triggering times are generated from the addition of the carrier to the input signal to be measured. The relevant functions and parameters are shown in FIG. 9. The trigger points 902 are used to generated a fitted curve representing the total modulated input (904, overall polynomial fit). The carrier 906 is modeled as a polynomial estimate of the sine function. The carrier is subtracted from the overall polynomial fit to generate the external signal input 908. For this process, the total modulated input 904 (signal and carrier) is defined as:

$$V_{total}(t) = A\sin(\omega t + \phi) + V_{input}(t) \quad \text{(Eqn. 27)}$$

From the triggering events, a "least squares" polynomial fit 904 to $V_{total}(t)$ is generated. The measured trigger points and their associated reference levels form a matrix $\vec{V}$:

$$\begin{bmatrix} V_1 \\ V_2 \\ \vdots \\ V_k \end{bmatrix} = \begin{bmatrix} 1 & t_1 & t_1^2 & \cdots & t_1^n \\ 1 & t_2 & t_2^2 & \cdots & t_2^n \\ \vdots & \vdots & \vdots & \ddots & \vdots \\ 1 & t_k & t_k^2 & \cdots & t_k^n \end{bmatrix} \begin{bmatrix} 1 \\ P_1^1 \\ \vdots \\ P_n^n \end{bmatrix} = \vec{V} = \vec{T} \cdot \vec{P} \quad \text{(Eqn. 28)}$$

Matrix P is found using the relation:

$$\vec{P} = (\vec{T}^T \vec{T})^{-1} \vec{T}^T \cdot \vec{V} \quad \text{(Eqn. 29)}$$

The input signal 908 is then estimated by:

$$V_{input} = \vec{P} - A\sin(\omega t + \phi) \quad \text{(Eqn. 30)}$$

where the carrier 906 is:

$$A\sin(\omega t + \varphi) \approx A \begin{bmatrix} \sin(\varphi) + \cos(\varphi)\frac{\omega}{1!}t - \sin(\varphi)\frac{\omega^2}{2!}t^2 - \\ \cos(\varphi)\frac{\omega^3}{3!}t^3 + \ldots + \sin(\varphi)\frac{\omega^n}{n!}t^n \end{bmatrix} \quad \text{(Eqn. 31)}$$

Figure 9A:
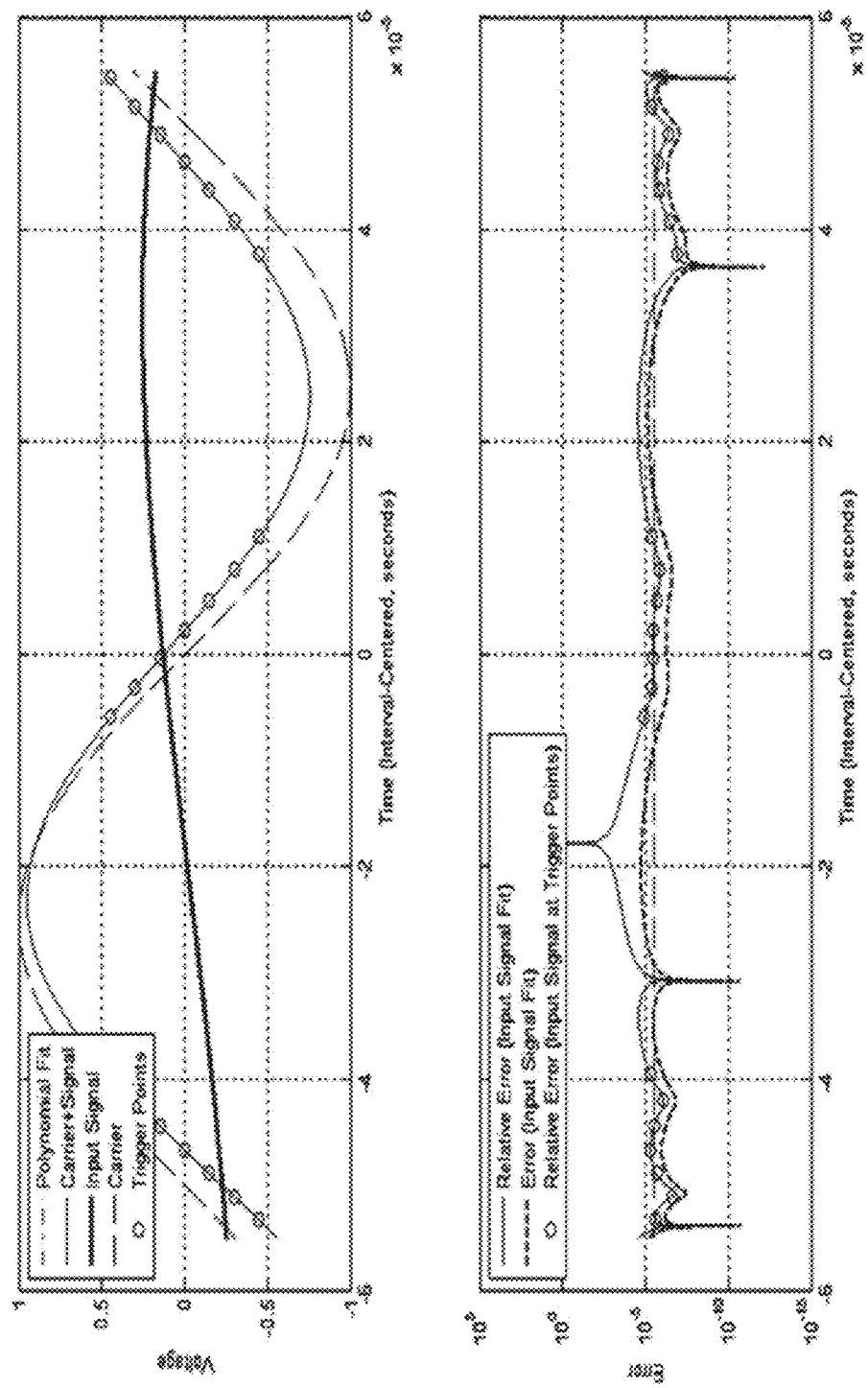
FIG. 9A is plot depicting a simulated output of an exemplary TDS ADC system utilizing curve fitting according to the present invention.

The results of a simulation utilizing such polynomial fitting method is shown in FIG. 9A. For the regions in proximity of the trigger points, an average error of 1.5 ppm is achieved in this example for the estimate of the signal input.

Reference Levels

Figure 10:
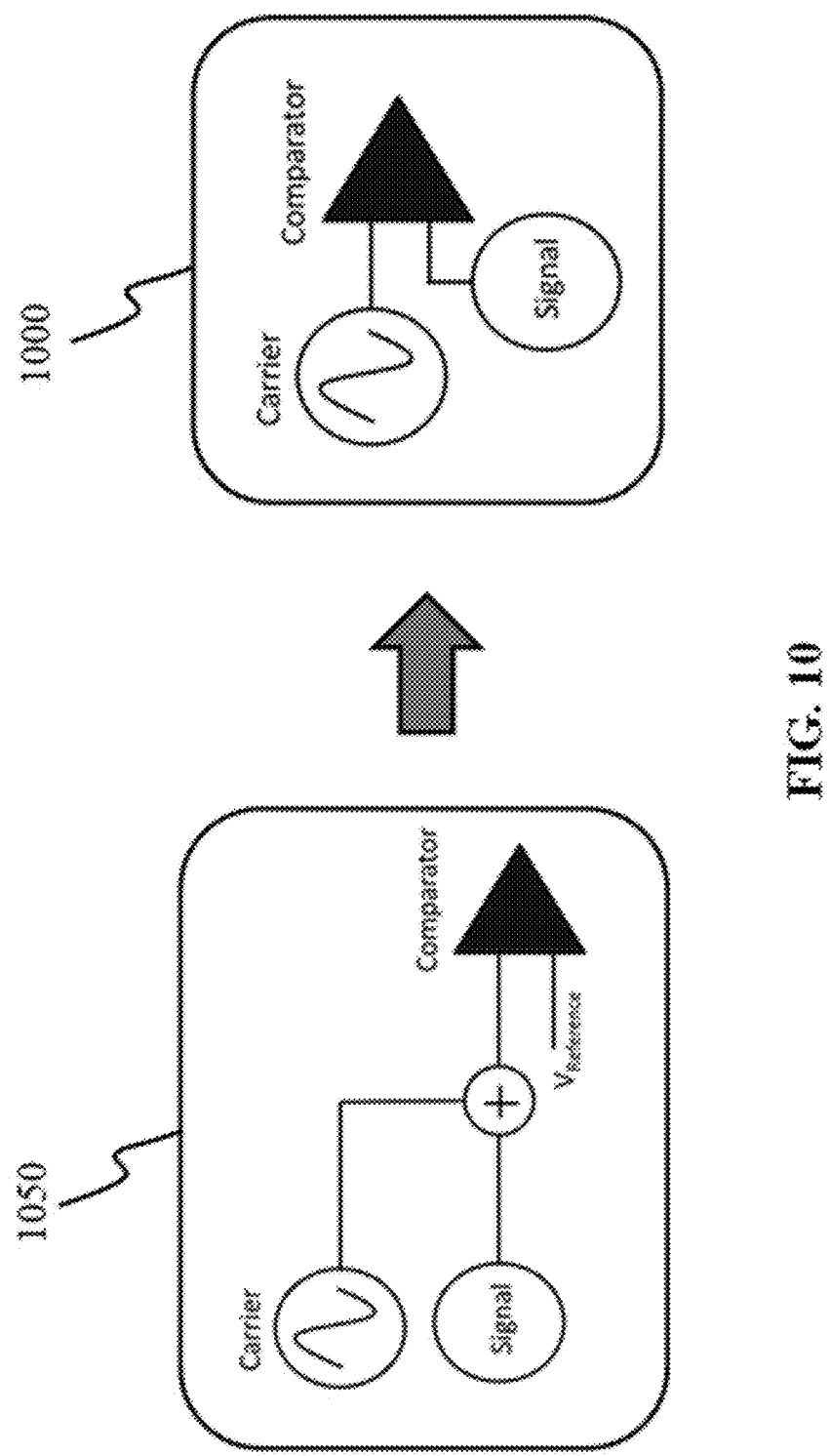
FIG. 10 is a functional block diagram illustrating a exemplary process of utilizing an input signal as a non-constant reference in a TDS ADC.
Figure 11:
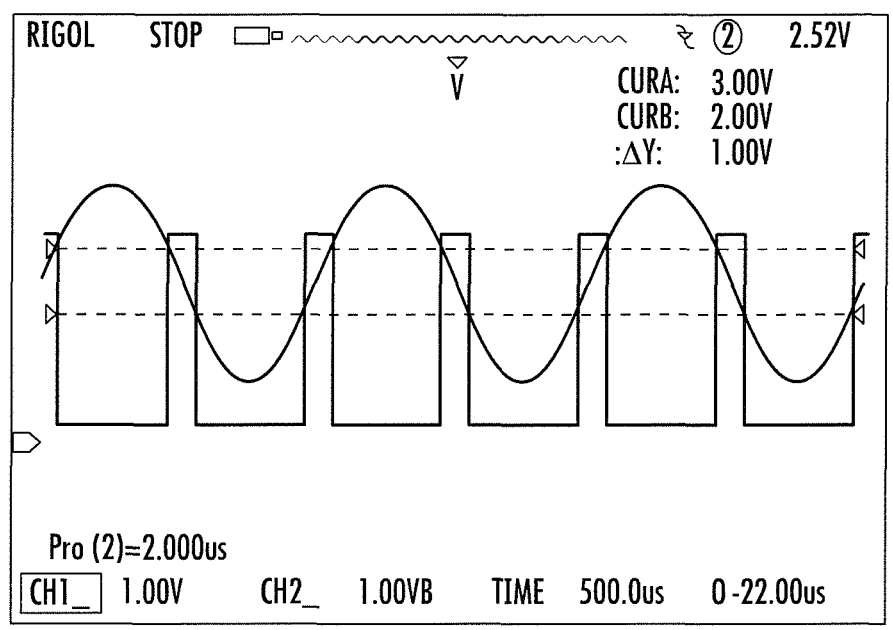

In various embodiments, the input signal itself (or processed versions of the input) may be used as the reference in place of a constant reference source. The input may be added or subtracted, multiplied or divided by a constant reference source. Alternatively, a phase-shifted carrier may be combined with or replace a constant reference. Each of these possibilities results in time intervals that can be used to calculate the input signal. A non-constant reference may provide advantages in reduction of common mode noise arising from the carrier or reference, as well as error from reference drift. FIG. 10 illustrates an exemplary embodiment wherein a constant reference level circuit 1050 is replaced with use of the input signal itself as a reference. In the signal reference embodiment 1000, the timing periods are defined by the events in which the carrier crosses the signal input voltage level. The timing between these crossing event changes as the voltage level of the signal input rises and falls. Conversely, if the voltage level of the signal stays constant, the timings also stay constant. Thus, these timing values may be used to estimate the current signal level.

Although some embodiments described supra used two and three reference signal levels, it will be appreciated by those skilled in the arts that implementations of the invention is not limited to such embodiments, and any practical number of reference levels may be used. Additional reference levels provide additional timing information thereby improving measurement of the modulation and input signals. Furthermore, additional signal levels improve converter frequency response. A time-varying input signal acts to "skew" the modulated carrier signal which may impact quality of the signal waveform fit function (e.g. see Eqns. 5 and 6). Additional trigger events associated with additional reference levels enable to obtain a better signal waveform fit.

Waveform Analysis

Figure 11:
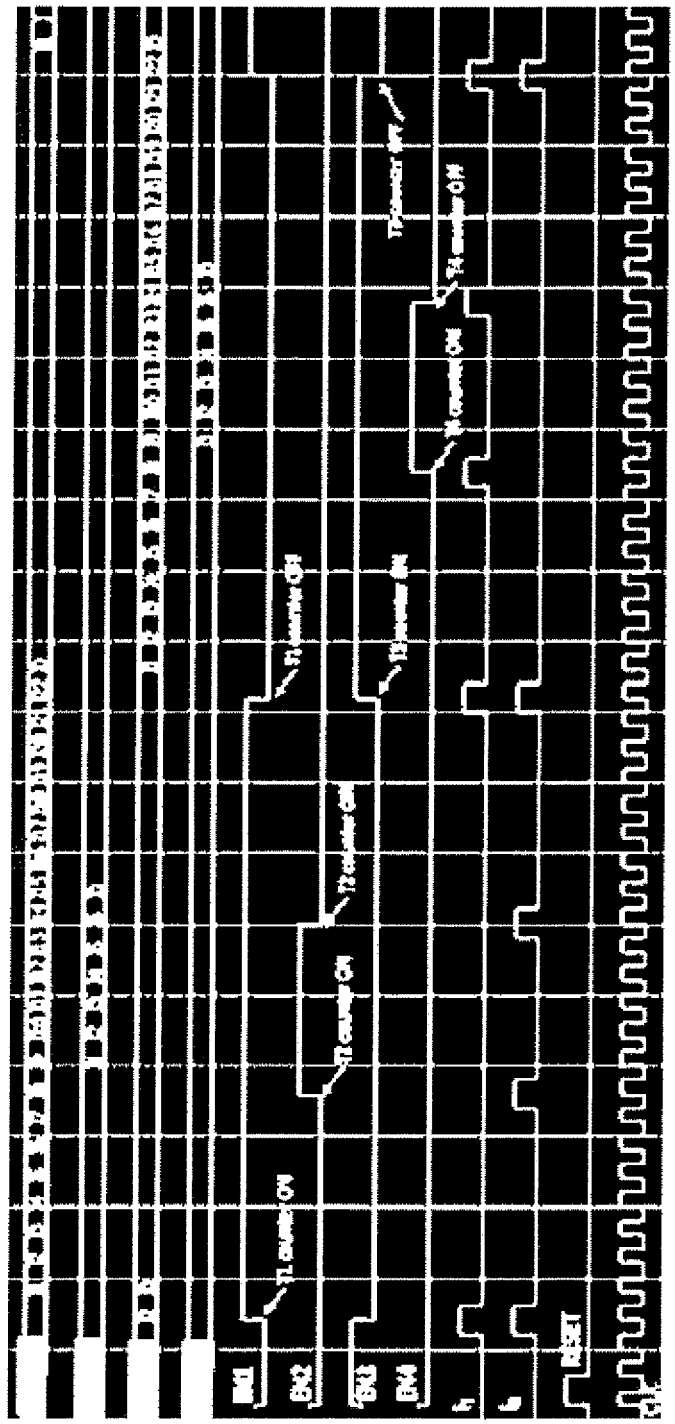
FIG. 11 is a plot illustrating one embodiment of a time interval measurement method with a varying DC level of input modulation signal for use with the two reference level time domain switching ADC according to the invention.

FIG. 11 shows an exemplary screen shot of the window detector illustrating the time intervals between two successive trigger events. These intervals may be varied as a function of the input signal DC bias level of the input modulated signal.

Figure 12:
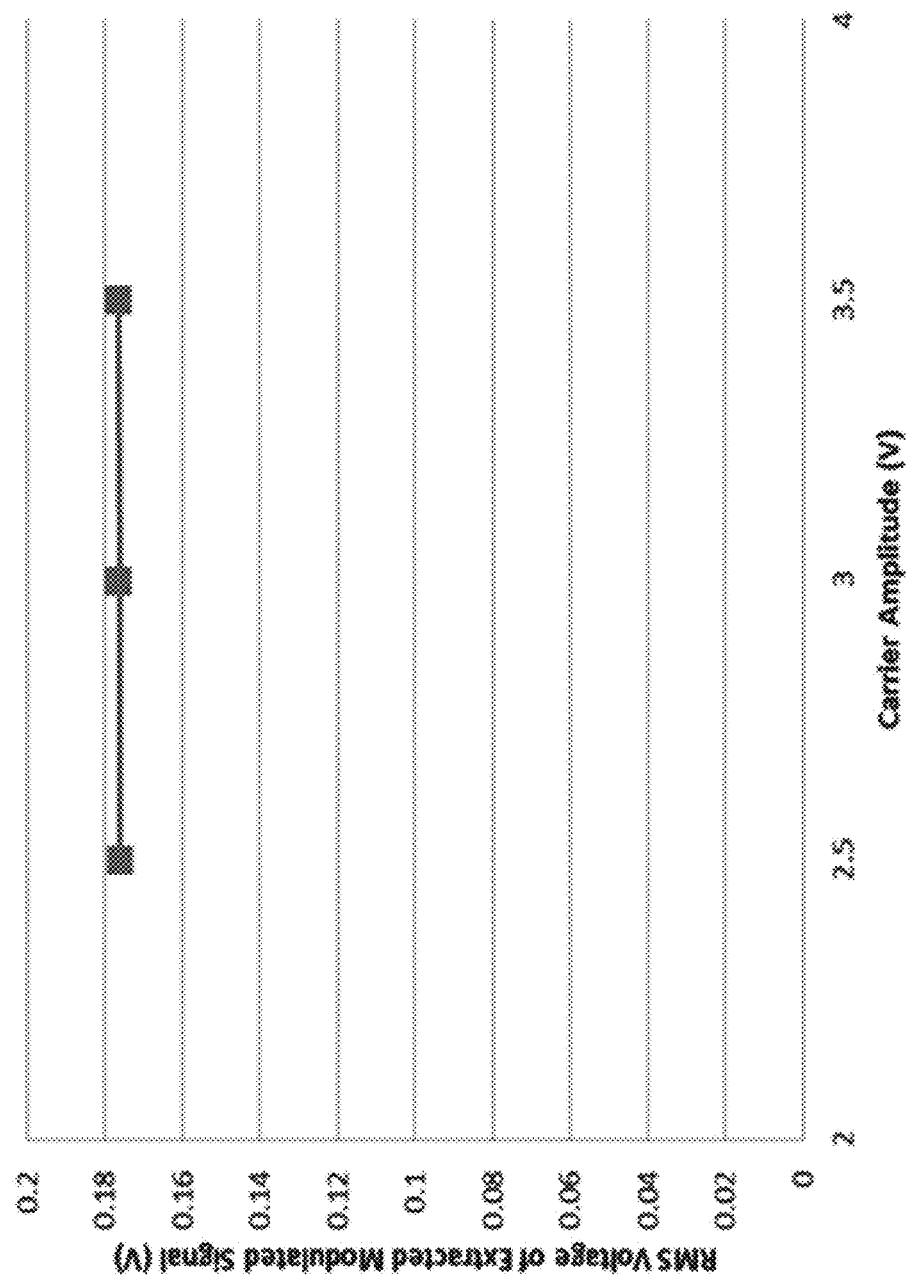
FIG. 12 is a plot illustrating invariance of modulation signal measurement to carrier amplitude according to one embodiment of the invention.
Figure 12A:
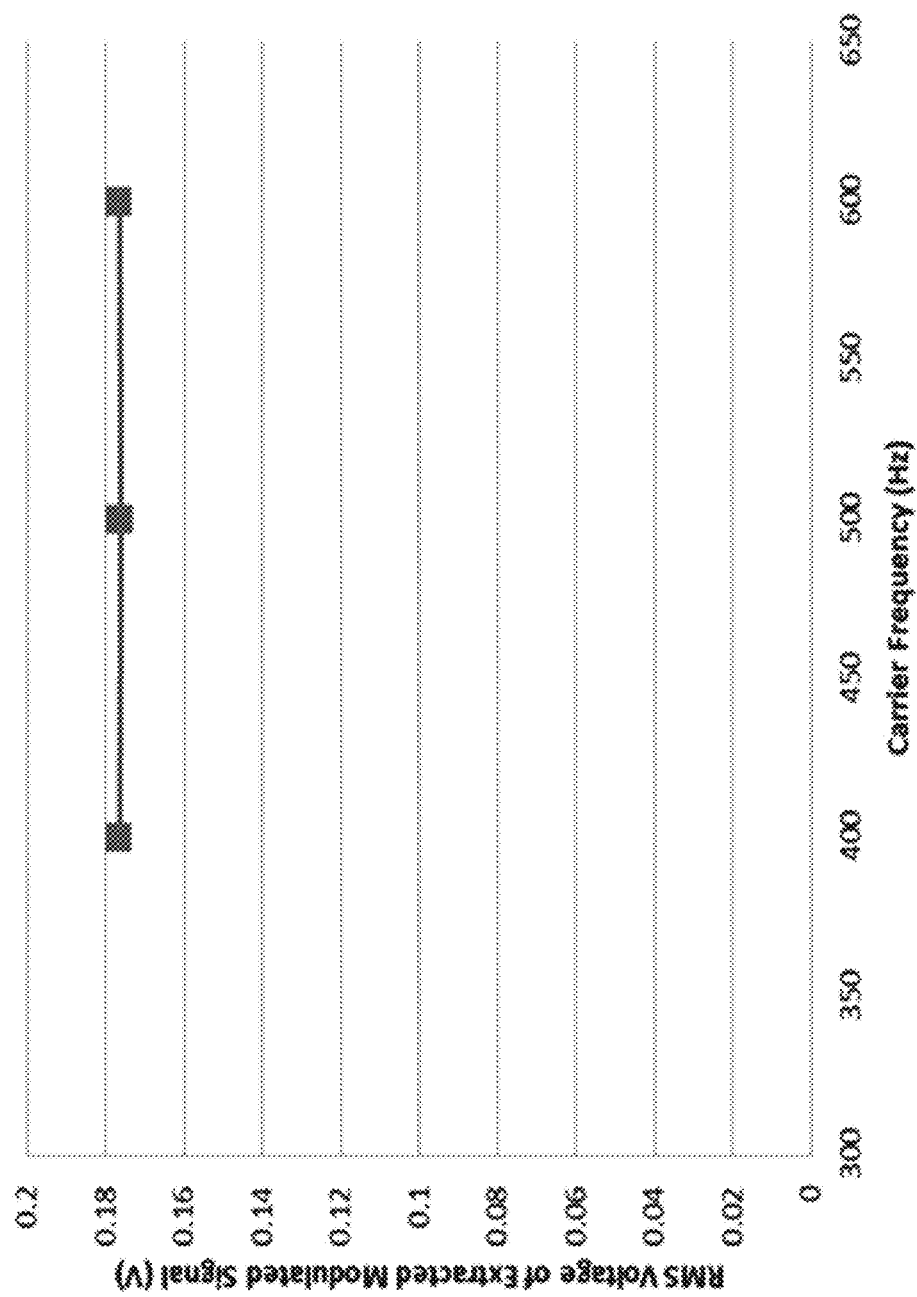
FIG. 12A is a plot illustrating invariance of modulation signal measurement to carrier frequency according to one embodiment of the invention.

The time domain switching analog to digital conversion method described by Eqns. 5 and 6 supra enables input signal measurements independently of the carrier signal amplitude and/or frequency. FIGS. 12 and 12A present simulation results obtained with the exemplary ADC apparatus of the embodiment of FIG. 11. FIG. 12 shows RMS voltage of extracted input signal (in Volts (V)) as a function of carrier amplitude (in V). The data shown in FIG. 12 demonstrate insensitivity of the TDS ADC measurement method of the invention to the carrier amplitude. FIG. 12A shows RMS voltage of extracted input signal (in V) as a function of carrier frequency (in Hz). The data shown in FIG. 12A demonstrate insensitivity of the TDS ADC measurement method of the invention to the carrier frequency.

The simulation results shown in FIGS. 12 and 12A confirm that the reconstructed (measured) signal is insensitive to time varying changes in amplitude and/or frequency of the carrier signal. These characteristics of the measurement method of the invention advantageously enable the TDS ADC apparatus of the invention to adjust measurements characteristics dynamically during operation. Specifically, varying the carrier amplitude enables adjustment of the sampling range of the signal, thereby enabling the ADC dynamic range adjustment in real-time by insuring that time intervals $T_2$ and $T_4$ stay above a required minimum value. Furthermore, varying the carrier frequency enables adjustment of the ADC sampling rate without impacting the reconstructed signal. This allows the sensitivity of the ADC to be adjusted in real-time (lower carrier frequency allows for more bits of resolution).

In one embodiment, the reference signal levels are scaled with the carrier signal amplitude, thereby enabling measurement of any input signal that is within electrical limits of the TDS ADC apparatus.

The frequency of the carrier can be adjusted by the user via an external input to the ADC or by automatically by monitoring the maximum rate of change in acceleration per cycle and adjusting the frequency appropriately.

Figure 13:
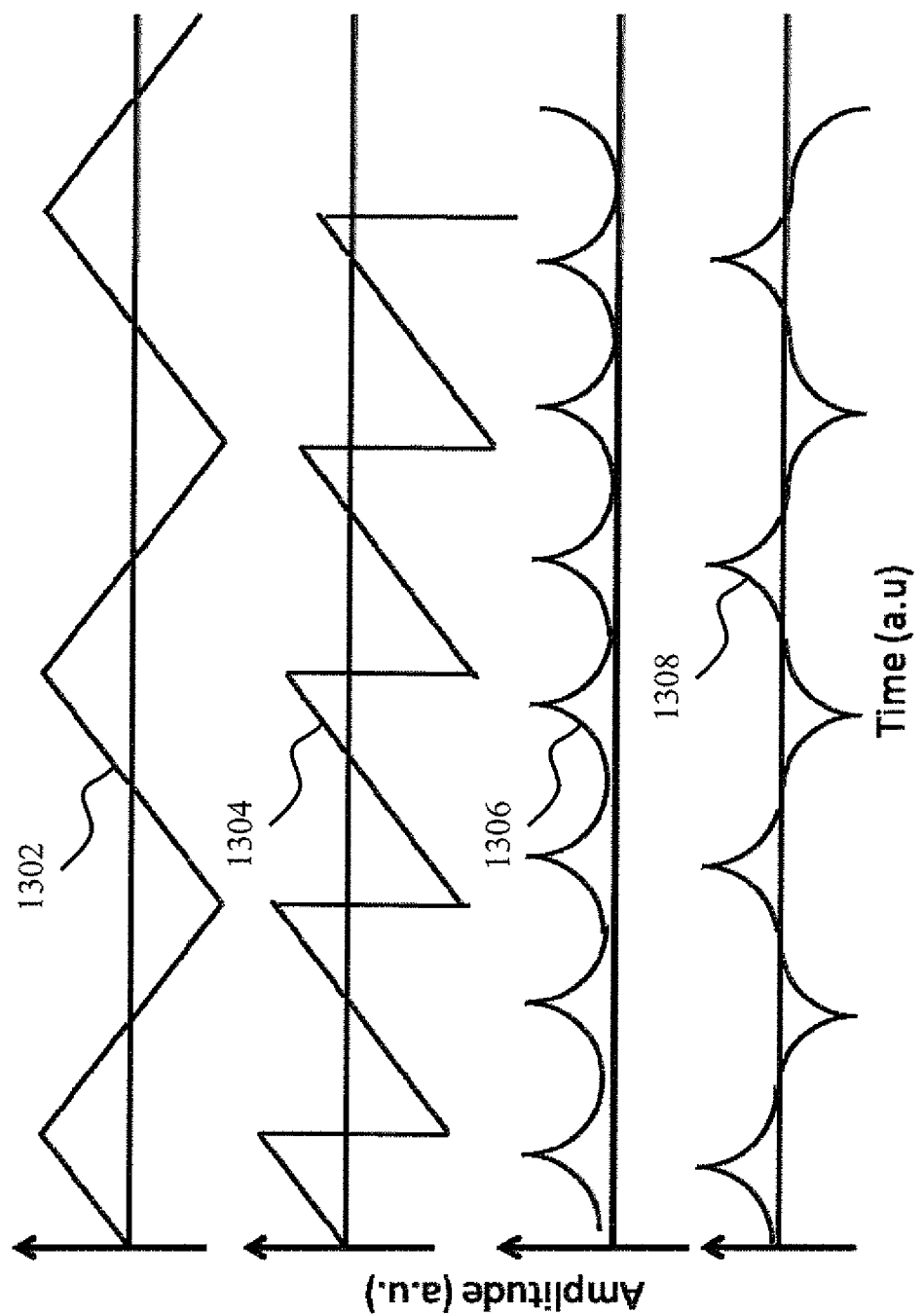
FIG. 13 is a plot illustrating various embodiments of carrier signal waveforms for use with TDS ADC apparatus and measurement methods of the invention.

FIG. 13 shows various embodiments of carrier signal waveforms (in addition to the sinusoidal signals described supra) useful with the time-domain switching analog-to-digital conversion apparatus and methods described herein. The saw tooth 1302 or the triangular-shaped 1304 waveforms provide a linear relationship between the measured time periods and the offset due to input signal. The waveforms 1306, 1308 may be useful for small input signal offsets because the slope of the carrier waveform is small near the origin (corresponding to small offsets). A small slope advantageously improves accuracy because the time period when the modulated signal is slowly varying across a threshold level can be more accurately measured compared to a modulated signal with a steep slope) when sampling low frequency signals without having to sacrifice sensor sampling bandwidth that would be associated with lowering the sampling frequency. The waveforms show in FIG. 13 are exemplary in nature. An infinite variety of carrier signals having a well-defined waveshape character which repeats in a predictable manner may be used to generate algorithms capable of performing the functions required for the TDS ADC operation.

Exemplary Performance

Figure 14:
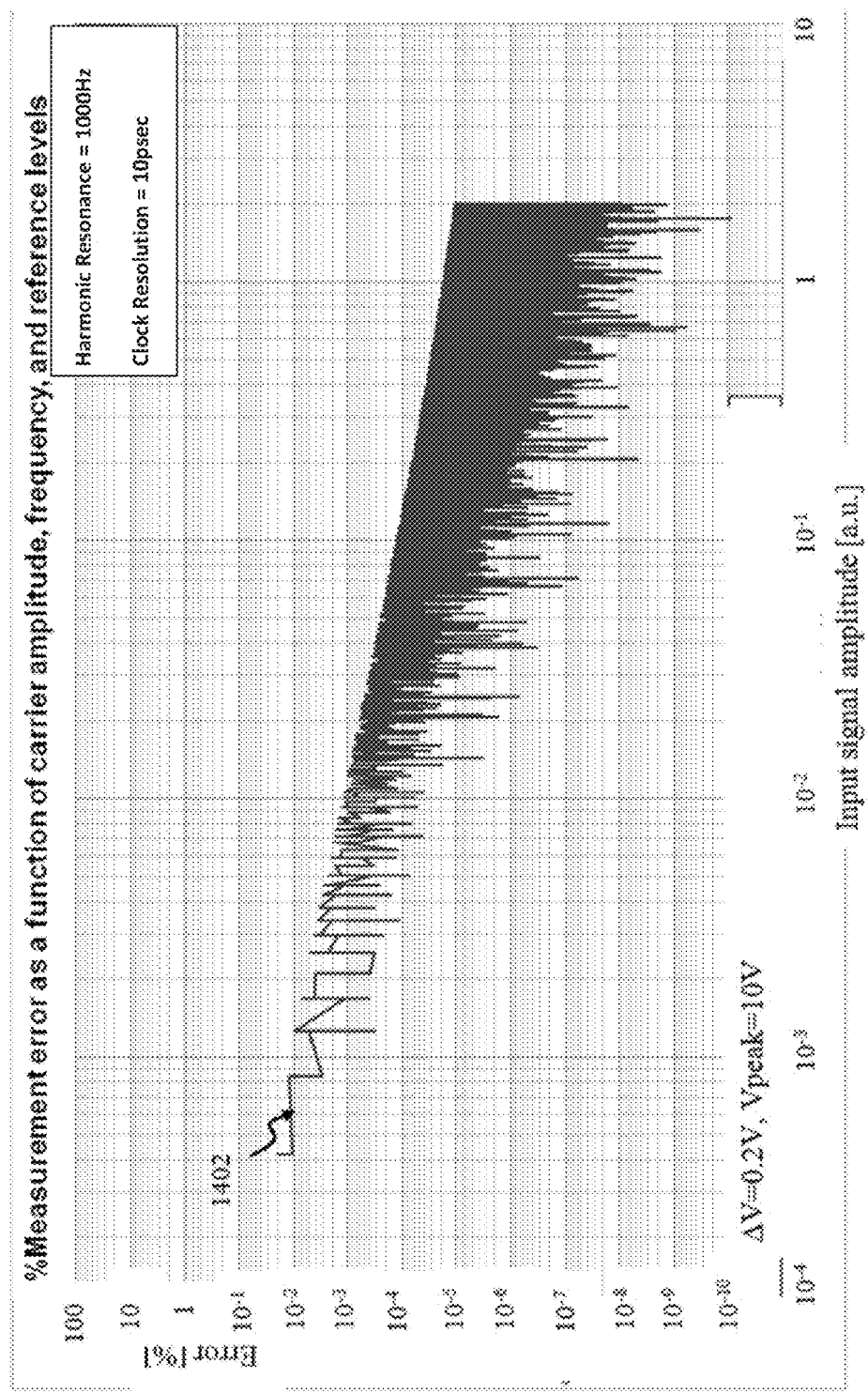
FIGS. 14-14H are a series of plots depicting the simulation of a dual voltage TDS ADC measurement relative error as a function of input voltage magnitude for different values of modulation amplitude and voltage separation, according to one embodiment of the invention.
Figure 14A:
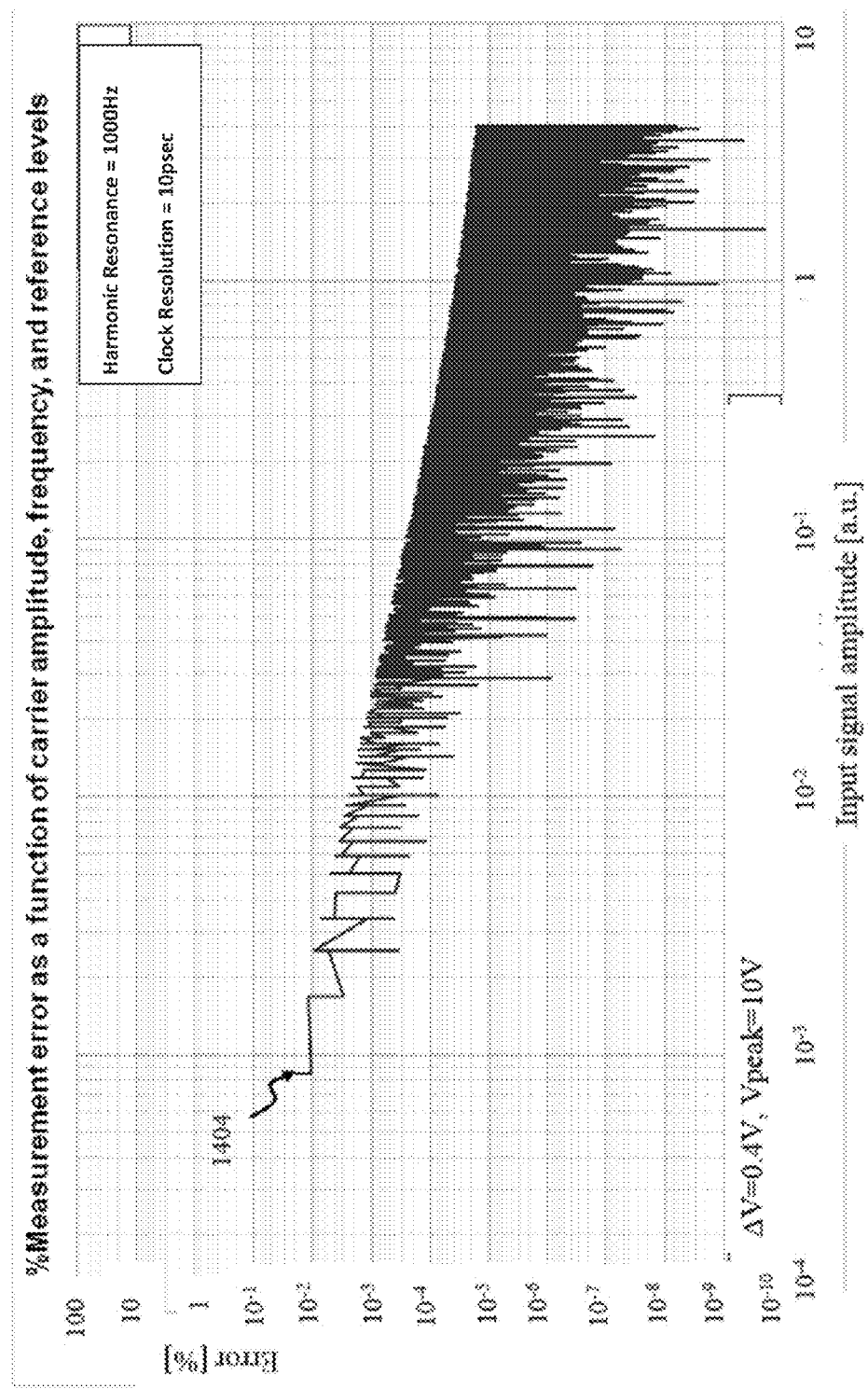
FIG. 14I is plot depicting the output noise versus jitter performance of an exemplary TDS ADC system.
Figure 14B:
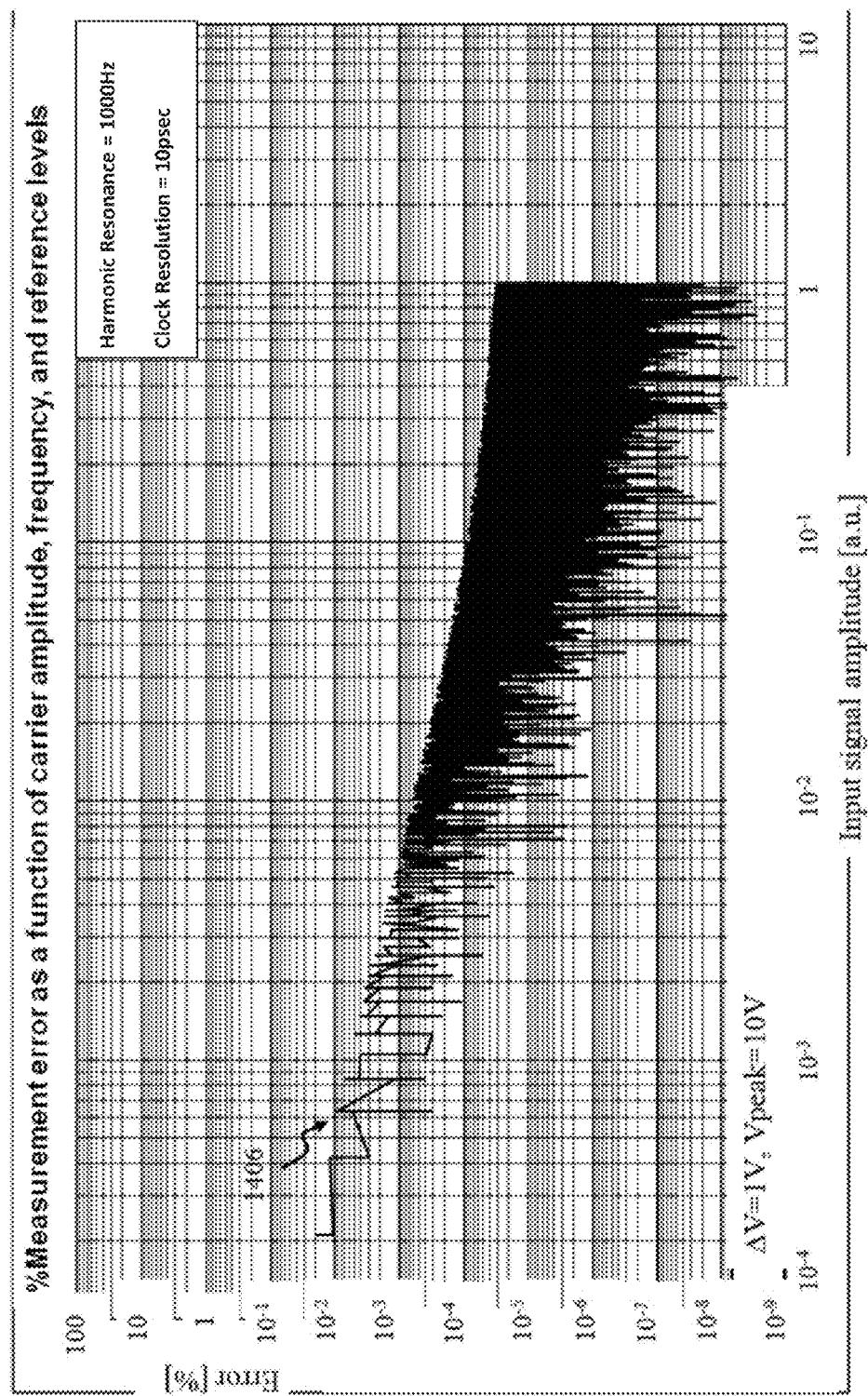
Figure 14C:
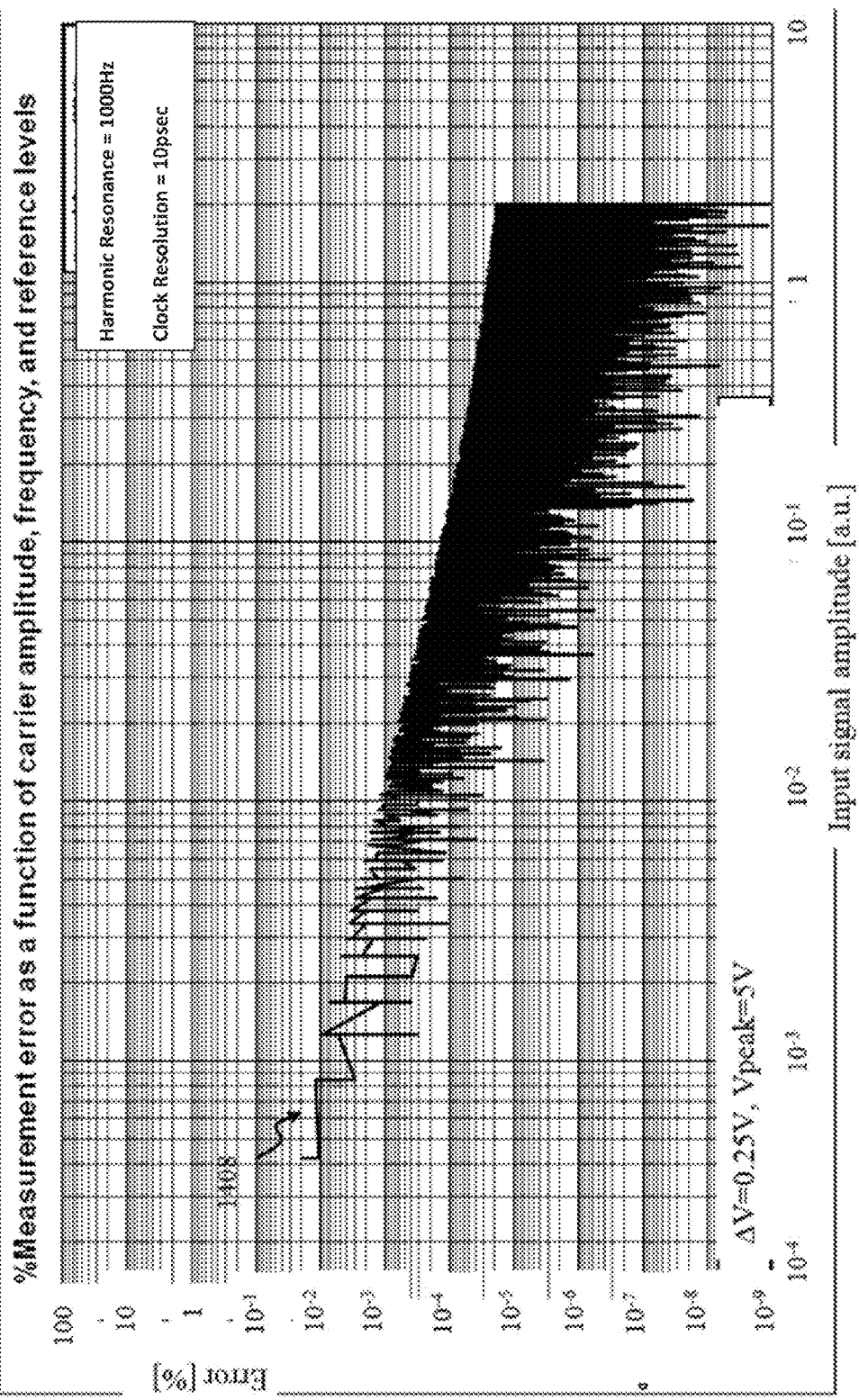
Figure 14D:
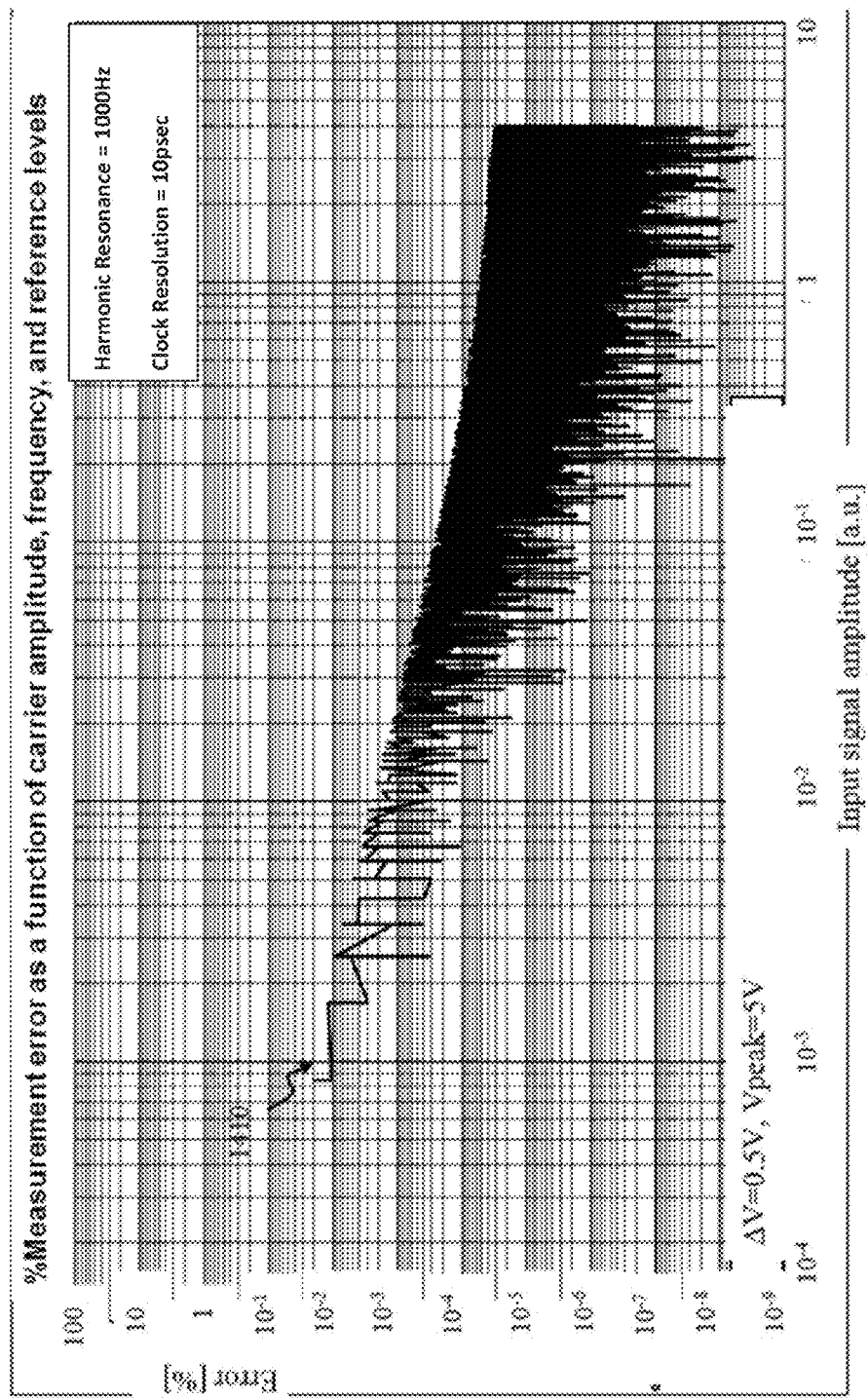
Figure 14E:
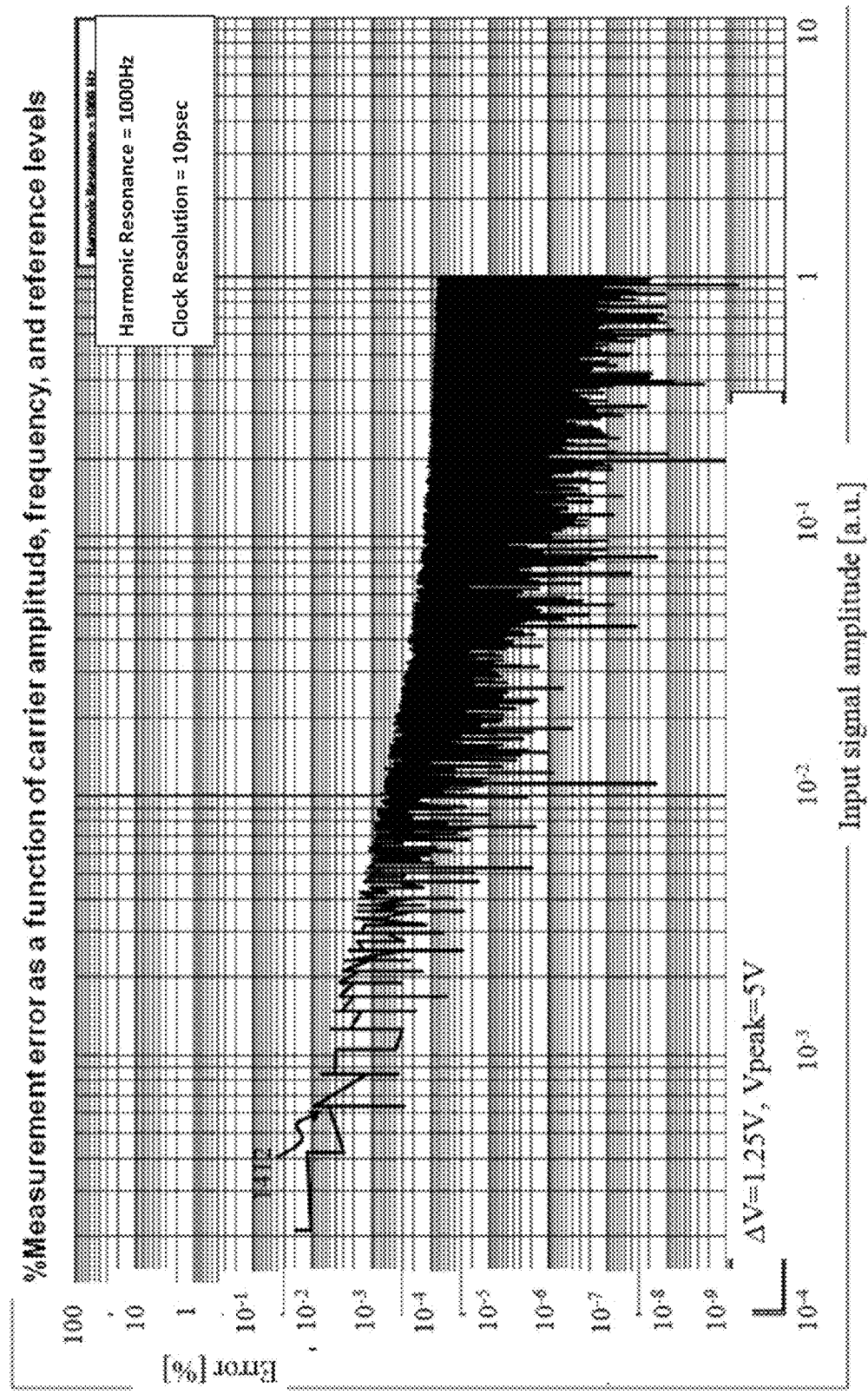
Figure 14F:
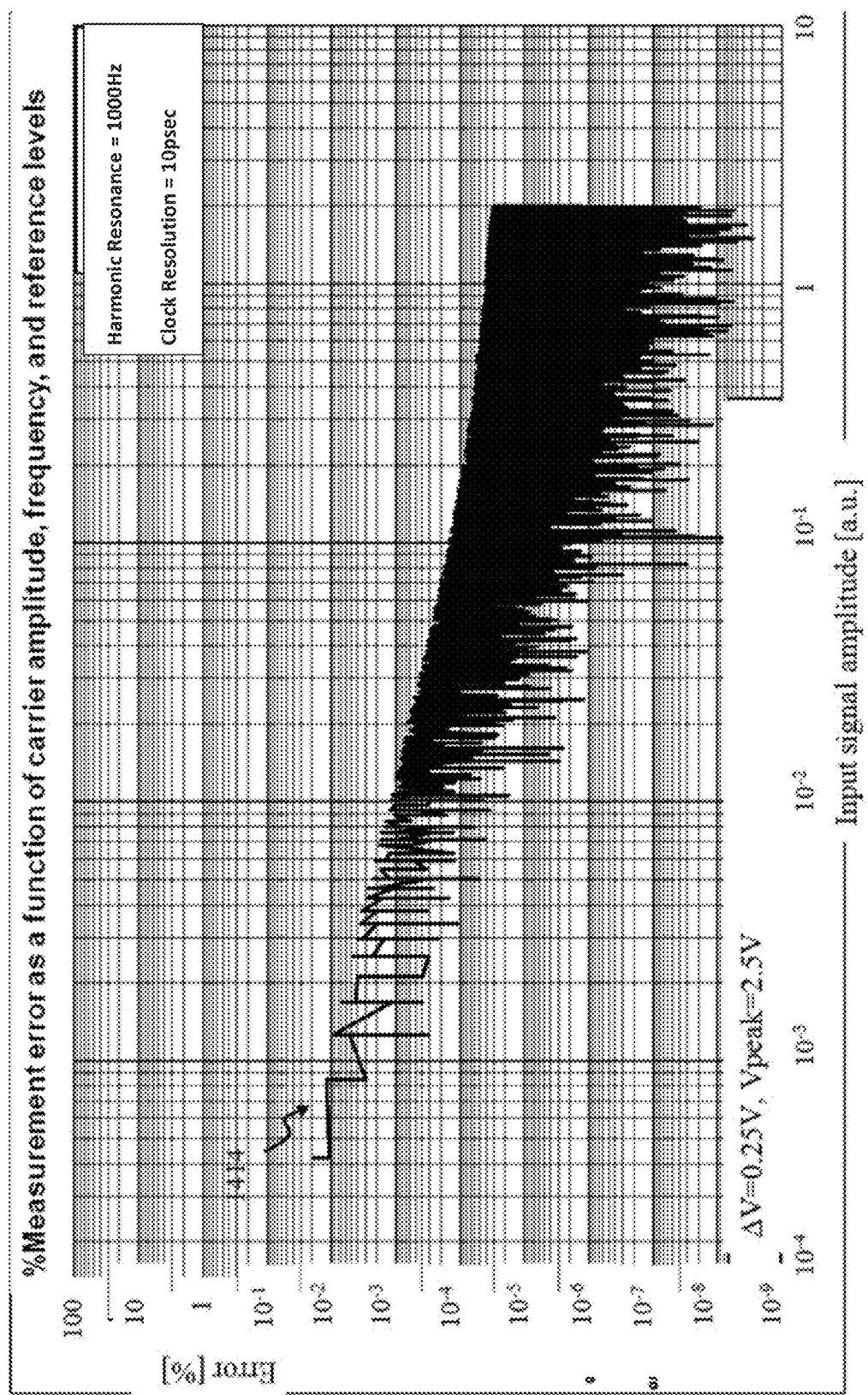
Figure 14G:
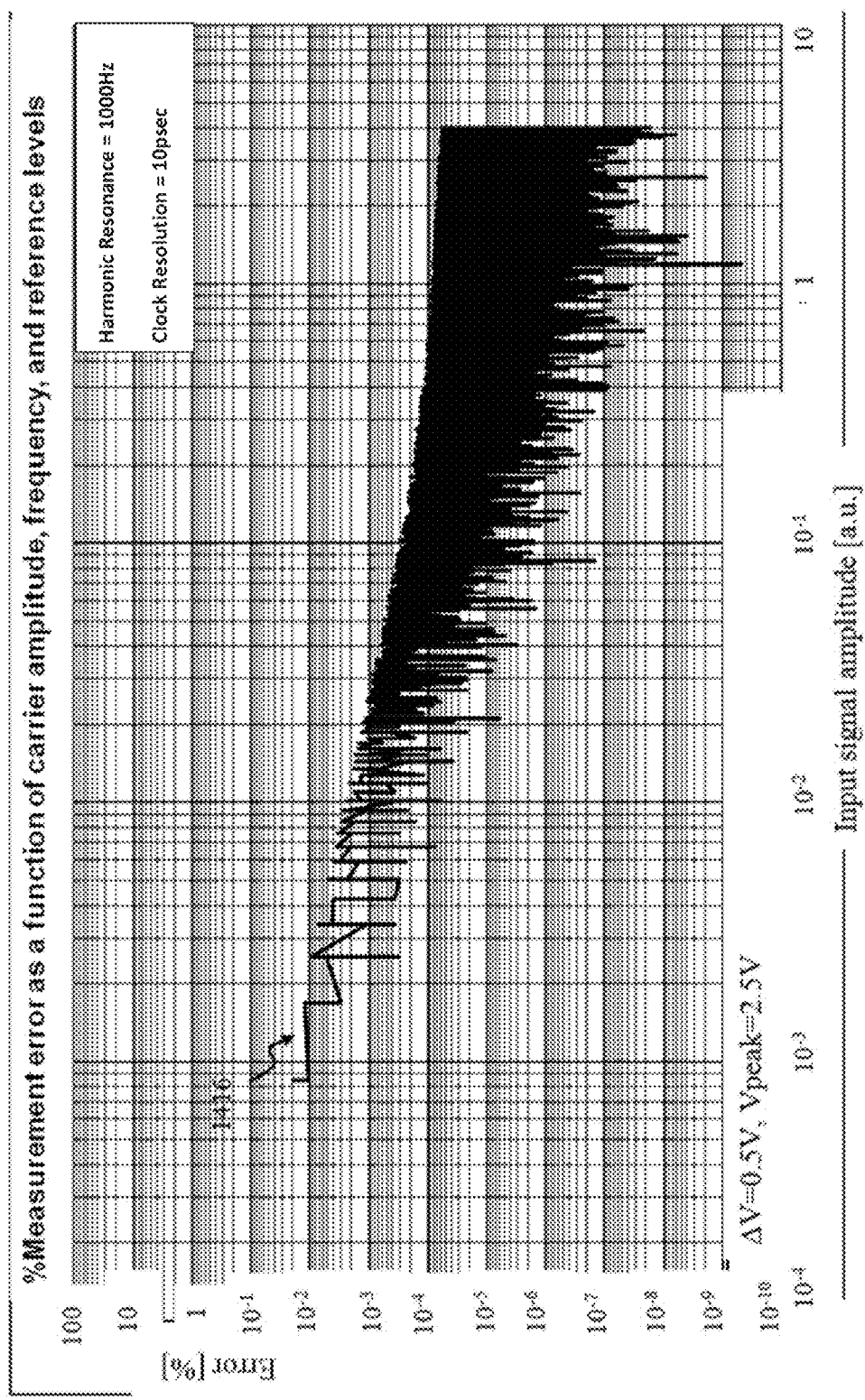
Figure 14H:
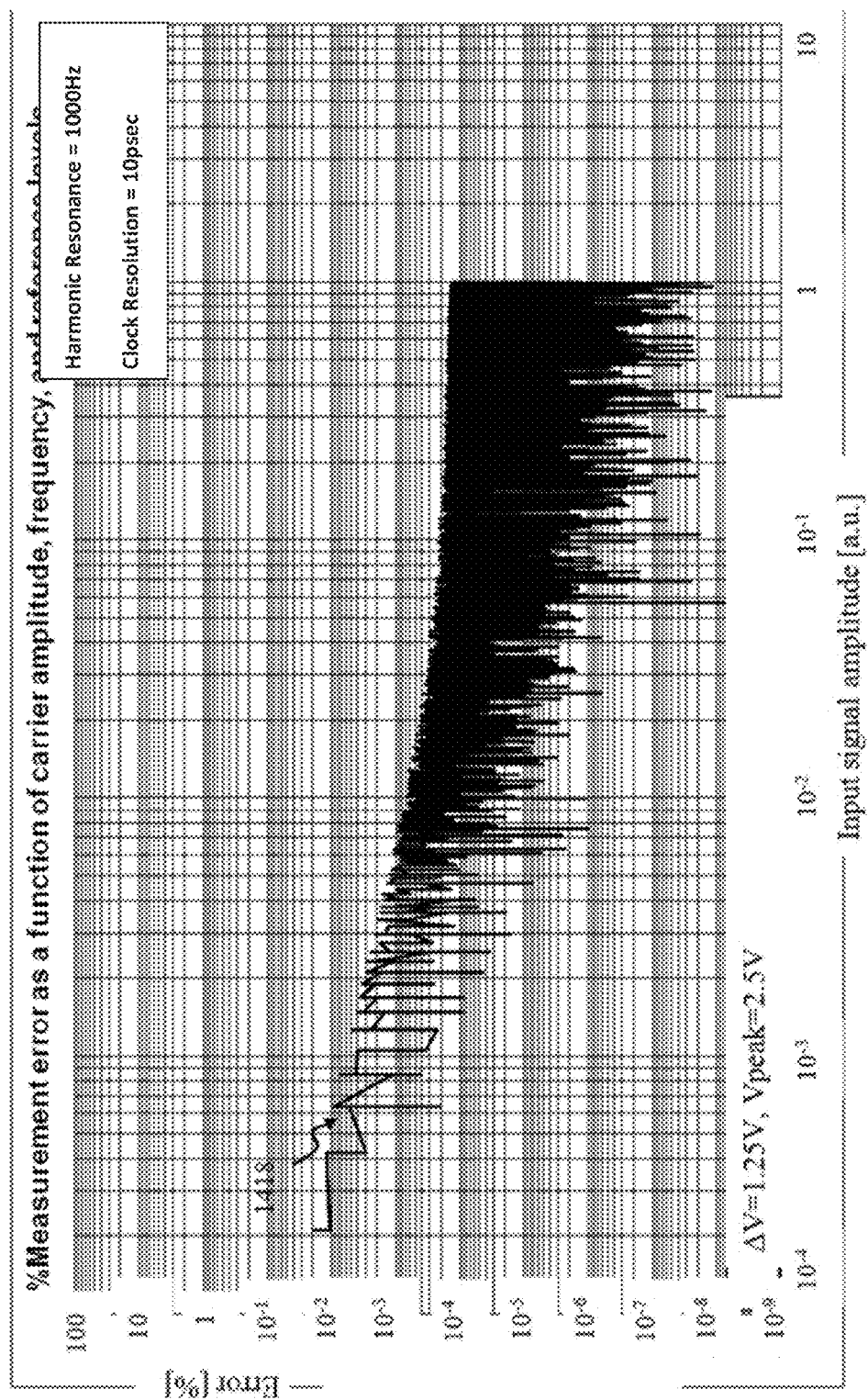

FIGS. 14-14H present exemplary data related to the relative error sensitivity to the carrier amplitude, and the reference signal voltage level difference $\Delta V = V_2 - V_1$. The data in FIGS. 14-14H are obtained for a fixed carrier frequency of 1000 Hz and sampling clock resolution of 10 picoseconds (ps). The lines in FIGS. 14-14H marked with the arrows 1402-1420, respectively, are obtained as follows:

FIGS. 14-14B correspond to the carrier amplitude of 10 V, and reference signal difference of 0.2 V, 0.4 V, and 1 V, respectively; and;

FIGS. 14C-14E correspond to the carrier amplitude of 5 V, and the reference signal difference of 0.25V, 0.5V, and 1.25 V, respectively; and FIGS. 14F-14H correspond to the carrier amplitude of 2.5 V, and the reference signal difference of 0.25 V, 0.5 V, and 1.25 V, respectively.

As seen from the data presented in FIGS. 14-14H, smaller reference signal difference $\Delta V$ generally corresponds to a higher relative error (as, for example, illustrated by the curve 1420 in FIG. 14H being shifted upward relative to the curve 1416 in FIG. 14G), while smaller carrier amplitude corresponds to a lower relative error and lower voltage measurement range, (as, for example, illustrated by the curve 1402 in FIG. 14 being shifted downward and to the left relative to the curve 1420 of FIG. 14H).

As seen from the data in FIGS. 14-14H, the exemplary TDS ADC performance is characterized by a certain quantization noise floor. That is, there is some detectable voltage level that can be detected and converted (to some level of accuracy). By way of example, a voltage of 0.2 millivolts (mV) can be measured with an accuracy of 50 nanovolts (nV). This implies that input signals that are lower than this threshold are not detectable by the TDS ADC, although the ADC resolution is much higher. In one embodiment useful for measuring low amplitude signals, the TDS ADC is configurable to add a small signal (of known amplitude) to the input signal in order to enable the use of the full range of the ADC down the 50 nV resolution level. By subtracting off the "known" input signal we can get a direct measure of the small input signal which would have otherwise been too small for us to detect. This embodiment is presented by way of example and in no way limits the invention to particular ranges of function.

Figure 14I:
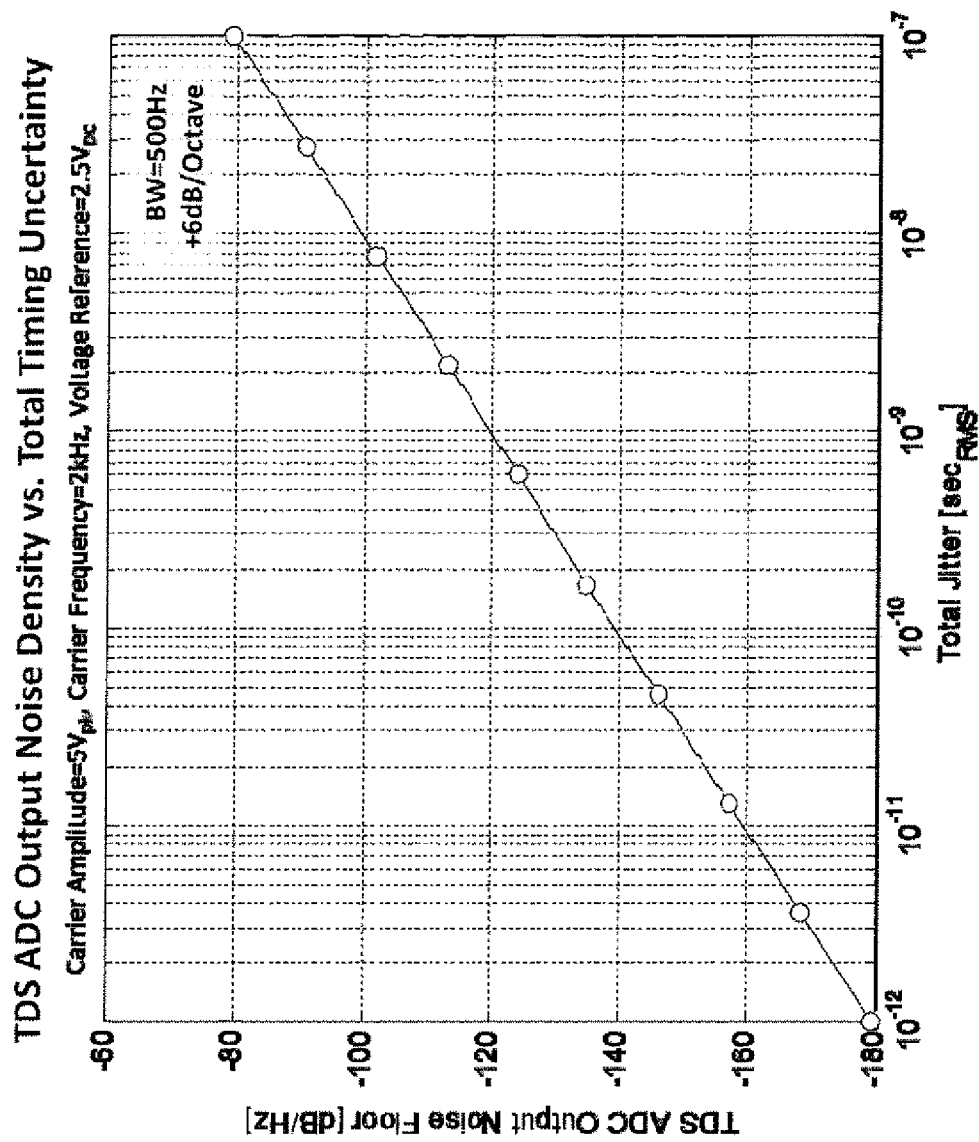

Referring now to FIG. 14I, a plot illustrating the output noise versus jitter performance of an exemplary IDS ADC system is shown.

Exemplary Uses and Applications

The exemplary TDS ADC apparatus and methods of the invention advantageously enable conversion of signals that vary over a wide dynamic range. In one variant, such wide dynamic range capability is achieved through adjustment of the carrier signal amplitude during ADC operation. Furthermore, by adjusting the carrier period, the signal conversion rate is controlled thereby facilitating real time adjustment of the ADC bandwidth and accuracy.

This feature, also colloquially referred to as "auto ranging", a single ADC of the exemplary embodiment of the invention can be used to measure a broad range of signal values (both in amplitude and frequency), thereby obviating use of multiple sensors tuned to particular (more narrow) ranges as in the prior art.

Furthermore, because the TDS ADC resolution is determined given by the ratio of input modulation frequency to the clock resolution, the ADC apparatus of the invention can attain very high resolution, e.g. in excess of 30 bits, without requiring expensive and high power implementations that are characterized by the presently available ADC devices. In addition, the TDS ADC resolution and bandwidth can be adjusted in real-time by tuning the carrier frequency.

Other than the front end comparators, the entire conversion method is digital, thus eliminating many of the sources of noise and drift; e.g., analog component drift. Accuracy of the exemplary time-domain switched analog to digital converter apparatus advantageously does not depend on the carrier signal amplitude or frequency, thereby eliminating the need for calibration. Such configuration further ensures that the accuracy of the device is only dependent on the consistency of the triggering events, the accuracy of the reference signal level difference, and the accuracy of the time measurement of adjacent triggered events.

The use of additional signal reference levels is used to further improve converter apparatus frequency response and accuracy.

As referenced above, certain sensor embodiments described herein measure input signals based on a ratio of clock frequency to modulation frequency, thereby making the sensor accuracy insensitive to clock drift (to the first order). Additionally, measurements averaged over multiple oscillation cycles enable the filtering out of unwanted noise.

If the output is truly quantized averaging does not help. In this case dithering is used to introduce a small amount of white noise to either the clock or input signal so that the output can be averaged. The input dithering is typically on the scale equivalent to ½ a clock cycle.

The TDS ADC concept described herein allows, inter alia, power conservation techniques not feasible in other ADC architectures. For example, if data is sampled less often than once per cycle, the TDC measurement block may be placed in a low power or "sleep" mode during cycles of the carrier wherein data is not calculated. Further, the input signal may be calculated from short time intervals separated by longer intervals where no time interval information is required. In this case, the digital edges related to the input signal at the logic control block may be used to trigger the TDC device to enter an active mode. The TDC may then measure the triggering times of a time-delayed version of the signal pulse train. After measuring a specified number of trigger points, the TDC may enter a low power sleep mode, before the next set of pulse edges arrive. Another example of power conservation is to change the frequency of the carrier. A higher frequency carrier will be able to generate smaller time intervals from which the input signal can be calculated, thus reducing the total amount of time that the TDC is required to be active. In this case, there may be a trade-off between accuracy, which is reduced as the carrier frequency is increased, and power.

Additionally, TDS TDC technology provides may be used to convert the digital pulses into timing events. One advantage of using TDS TDC technology is that time measurements with very fine resolution (below 10 picoseconds) can be made with very low power. The capability of measuring time events with very fine resolution is a key component of the high resolution advantage of the TDS ADC. For example, for a 1 kHz bandwidth, signals may have features on the order of $10^{-3}$ s. However, the TDS TDC implementation, consistent with the present invention, provides the capability of measuring these features with resolution on the order of $10^{-12}$ seconds. This represents 9-order of magnitude difference between the signal and the resolution of the measurement.

In a conventional approach to time measurement, a counter, driven by a high speed clock is gated by the ADC digital pulses. In order to achieve very fine resolution (e.g. on the order of picoseconds), a high-speed clock signal oscillating at a frequency near 1 THz would be required. This approach would be beyond the limits of contemporary high-speed electronics.

In one implementation of the TDS ADC technology, consistent with the present invention, a Vernier interpolation technique is used. Similar to a mechanical Vernier scale in which two scales are required, two clock signals are required. One clock is operated at a frequency higher than that of the other. The lower frequency clock is used to gate a 'coarse' counter, and the higher frequency clock is used to gate a 'fine' counter (e.g. the counter may count the number of times its respective clock signal crosses a voltage reference level). At the start of a time measurement, the 'coarse' counter is started. When the end event occurs, the 'fine' counter is started. Both counters are stopped when the low frequency clock and the high frequency clock eventually coincide (i.e. they produce a gating event simultaneously). The counter values are then used to compute time measurement, and very fine resolution is achieved. Exemplary Vernier timing techniques are described in Lange, et al. (K. Lange and M. Kasnia, "Application of Vernier Interpolation for Digital Time Error Measurement," Poznan Workshop on Telecommunications, 2008 11 Dec. 2008), the foregoing incorporated herein by reference in its entirety. Exemplary apparatus for measuring time intervals using fractional delay measurement are presented in U.S. Pat. No. 3,611,134, filed Apr. 30, 1969, entitled "APPARATUS FOR AUTOMATICALLY MEASURING TIME INTERVALS USING MULTIPLE INTERPOLATIONS OF ANY FRACTIONAL TIME INTERVAL", and U.S. Pat. No. 4,164,648 filed Jun. 23, 1978, entitled "DOUBLE VERINER TIME INTERVAL MEASUREMENT USING TRIGGERED PHASE-LOCKED OSCILLATORS" each of which being incorporated herein by reference in its entirety.

One design tradeoff of the Vernier interpolation technique is the time it takes for the two clocks to coincide. Longer coincidence time results in finer time resolution measurements. Specifically, if the high and low frequencies are similar (but well-defined and measurably different), their phase offset may be measured with great accuracy if any error in measurement is spread over many clock signal cycles. Note that the time required to achieve a coincidence event approaches infinity as the higher frequency approaches the lower frequency or one of its harmonics (assuming a non-zero phase offset). This phase offset may be used to calculate where in its cycle the lower frequency clock was when the end event occurred. This results in an accurate measurement of the elapsed period. Advantages of the Vernier technique include power savings through duty cycling (i.e., clocks do not need to operate continuously and therefore can be shut-off temporarily to reduce power consumption), and opportunity to continuously calibrate power and temperature variations of the less accurate of the two clocks. The Vernier technique has been implemented in commercially available devices built with common integrated circuit processes such as CMOS, for time of flight applications (i.e., ultrasonic instruments). The application of this technique and other TDC technologies to the TDS ADC provides a significant advantage and synergy over other ADC techniques.

In various implementations, the TDS ADC is applied a tapped delay chain in which the input signal being measured (or the input clock) is delayed serially by equal amounts before connecting sequentially to a chain of registers. The total delay is designed to cover at least one clock period resulting in a transition point, 1-0 or 0-1, in the register chain. This represents the input edge time between two clock periods, and may be used to accomplish fine time measurements. Further, the number of clock cycles between two input edges may be counted to provide a coarse measurement. These two measurements combined provide a total measurement of the time between edges with the accuracy of the measurement being set by the delay. In a CMOS-based implementation, the delay values are equal and a test pulse used to periodically re-calibrate the delay time to compensate for environmental conditions. An advantage of this approach is that it requires only a single system clock. This approach has been implemented in Field Programmable Gate Array (FPGA) technologies that are limited by unequal tap delays. Various techniques have been applied to compensate for the unequal tap delays. Exemplary techniques that achieve a 10-picosecond accuracy using an FPGA-based approach are described in Wu, (J. Wu, "On-Chip processing for the wave union TDC implemented in FPGA," in Real Time Conference, 2009. RT '09. 16th IEEE-NPSS, May 2009, Pages: 279-282) and Wu, et al. (J. Wu, Z. Shi, "The 10-ps Wave Union TDC: Improving FPGA TDC Resolution beyond Its Cell Delay," in Nuclear Science Symposium Conference Record, 2008 IEEE, 19-25 Oct. 2008 Pages: 3440-3446) each of which being incorporated herein by reference in its entirety.

Table 2 summarized exemplary performance parameters of the TDS ADC apparatus configured in accordance with the invention. As seen from the data in Table 2, the exemplary embodiment of the TDS ADC of the invention advantageously offers higher dynamic range and lower nonlinearity error at a lower (or at least) comparable cost, as compared to other ADC technologies.

TABLE 3

| Parameters | Inventive ADC Embodiment | Successive Approximation (SAR) | Delta-Sigma | Pipeline | Flash |
| --- | --- | --- | --- | --- | --- |
| Accuracy (Signal-to-noise ratio) | Up to 165 dB | 70-118 dB | 60-130 dB | 59-81 dB | 40-50 dB |
| Non-Linearity | Extremely low | ±0.5-6 LSB | ±0.0002-2 LSB | ±0.2-1.5 LSB | ±0.5-1 LSB |
| Power Consumption | 10-20 mW | 6-145 mW | .27-530 mW | 70 mW-4 W | 85 mW-150 mW |
| Sample Rate | 100-250 KSPS Dynamically Adjustable | 100 KSPS-1 MSPS | 111 SPS-640 MSPS | 1.5 MSPS-200 MSPS | 20 MSPS-40 MSPS |
| Bandwidth | Variable | 50 KHz-500 MHz | 55 Hz-320 MHz | 25 MHz-800 MHz | 10 MHz-20 MHz |
| Price Per Unit (>1,000 unit volume) | <$1 per unit to produce | $6-$35 | $1-$40 | $2.5-$40 | $2-$3 |

While primarily discussed in the context of the voltage conversion, the present invention is not so limited. In fact, many other physical sensing mechanisms are useful with the sensor apparatus and methodologies described herein, including but not limited to: electric current, compression waves, seismic activity, intensity, frequency, phase etc.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the fowl and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. An analog to digital converter apparatus comprising:
a first interface configured to receive an analog input signal and a carrier signal; and
logic in signal communication with the first interface and configured to:
identify one or more reference levels;
generate a modulated signal based on said analog input signal and said carrier signal;
detect crossings of said one or more reference levels by said modulated signal;
based on said detected crossings, determine a plurality of timing periods; and
based at least in part on said plurality of timing periods, generate one or more digital estimates of said analog input signal.

2. The converter apparatus of claim 1, wherein said converter apparatus further comprises a dynamically adjustable dynamic measurement range.

3. The converter apparatus of claim 2, wherein an adjustment of said dynamically adjustable dynamic measurement range is achieved based on at least an amplitude of said carrier signal.

4. The converter apparatus of claim 3, wherein said adjustment is selected based at least in part on an amplitude of said analog input signal.

5. The converter apparatus of claim 1, wherein said one or more digital estimates of said analog input signal comprise two or more independent estimates.

6. The converter apparatus of claim 5, wherein said logic is further configured to combine said two or more independent estimates to increase an accuracy of said converter apparatus.

7. The converter apparatus of claim 1, wherein said converter apparatus further comprises a compensation apparatus configured to mitigate one or more signal distortions.

8. The converter apparatus of claim 7, wherein said compensation apparatus comprises a second signal path.

9. The converter apparatus of claim 1; wherein said converter apparatus further comprises a sample-and-hold device, said sample-and-hold device configured to provide a constant sample amplitude over a sampling period of said converter apparatus.

10. A method of converting an analog waveform into a digital signal, said method comprising:
receiving said analog waveform;
mixing said analog waveform with a cyclic signal to produce a mixed waveform;
defining at least one period based on said cyclic signal;
determining one or more timing values based on said mixed waveform crossing at least one predetermined amplitude level; and
estimating an amplitude of said analog waveform based at least in part on a comparison of said one or more timing values with said defined at least one period.

11. The method of claim 10, wherein said method further comprises compensating for one or more contributions from noise.

12. The method of claim 10, wherein said act of estimating said amplitude of said analog waveform comprises producing two or more independent values based on two or more independent estimation algorithms.

13. The method of claim 10, wherein said analog waveform comprises a time-varying waveform.

14. The method of claim 13, wherein said act of estimating said amplitude of said time-varying analog waveform comprises modeling a time-variance of said analog waveform as a linear change over one or more sampling periods.

15. The method of claim 10, wherein said defining at least one period comprises defining a plurality of periods, and the method further comprises powering down one at least one logical device for at least one of said defined plurality of periods to reduce resource consumption.

16. The method of claim 10, wherein said cyclic signal comprises a non-sinusoidal waveform.

17. A non-transitory computer readable apparatus configured to store one or more processes thereon, said one or more processes comprising a plurality of instructions configured to, when executed:
receive a modulated waveform derived from a input signal and a carrier, said carrier having a known frequency;
determine relative timings of a plurality of events, said plurality of events comprising crossings of a reference level by said modulated waveform;
compare said relative timings to a period derived from said known frequency; and
based at least on said comparison, compute an estimate of said input signal.

18. The computer readable apparatus of claim 17, wherein instructions are further configure to compute a plurality of said estimates in a series to generate a digital output waveform based on said input signal.

19. The computer readable apparatus of claim 17, wherein said input signal comprises a time-varying voltage level.

20. An analog to digital converter apparatus comprising:
a first interface configured to receive an input signal and a carrier signal;
a compensation apparatus comprising a second signal path configured to mitigate one or more signal distortions that comprise common-mode noise;
where said compensation apparatus is configured produce an estimate of said common mode noise based at least in part on said second signal path; and
logic in signal communication with the first interface and configured to:
identify one or more reference levels;
generate a modulated signal based on said input signal and said carrier signal;
detect crossings of said one or more reference levels by said modulated signal;
based on said detected crossings, determine a plurality of timing periods; and
based at least in part on said plurality of timing periods, generate one or more estimates of said input signal.

21. The converter apparatus of claim 20, wherein said converter apparatus further comprises a dynamically adjustable dynamic measurement range.

22. The converter apparatus of claim 21, wherein adjustment of said dynamically adjustable dynamic measurement range is achieved based on at least an amplitude of said carrier signal.

23. The converter apparatus of claim 22, wherein said adjustment is selected based at least in part on an amplitude of said input signal.

24. The converter apparatus of claim 20, wherein said one or more estimates of said input signal comprise two or more independent estimates.

25. The converter apparatus of claim 24, wherein said logic is further configured to combine said two or more independent estimates to increase an accuracy of said converter apparatus.

26. The converter apparatus of claim 20, wherein said converter apparatus further comprises a sample-and-hold device, said sample-and-hold device configured to provide a constant sample amplitude over a sampling period of said converter apparatus.

27. A non-transitory computer readable apparatus configured to store one or more processes thereon, said one or more processes comprising a plurality of instructions configured to, when executed:
  receive a modulated waveform derived from a input signal and a carrier, said carrier having a known frequency;
  determine relative timings of a plurality of events, said plurality of events comprising crossings of a reference level by said modulated waveform;
  compare said relative timings to a period derived from said known frequency;
  based at least on said comparison, compute a plurality of estimates of said input signal in a series to generate a digital output waveform based on said input signal; and
  wherein a time duration between each of said estimates is determined based on said derived period.

28. The computer readable apparatus of claim 27, wherein said input signal comprises a time-varying voltage level.

\* \* \* \* \*